United States Patent
Yamauchi et al.

(10) Patent No.: US 6,954,103 B2
(45) Date of Patent: Oct. 11, 2005

(54) SEMICONDUCTOR DEVICE HAVING INTERNAL VOLTAGE GENERATED STABLY

(75) Inventors: Tadaaki Yamauchi, Hyogo (JP); Junko Matsumoto, Hyogo (JP); Takeo Okamoto, Hyogo (JP); Makoto Suwa, Hyogo (JP); Tetsuichiro Ichiguchi, Hyogo (JP); Hideki Yonetani, Hyogo (JP); Tsutomu Nagasawa, Hyogo (JP); Zengcheng Tian, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/427,968

(22) Filed: May 2, 2003

(65) Prior Publication Data

US 2003/0214345 A1 Nov. 20, 2003

(30) Foreign Application Priority Data

May 20, 2002 (JP) ....................................... 2002-144869

(51) Int. Cl.[7] ................................................ G05F 1/46
(52) U.S. Cl. ........................ 327/540; 327/544; 365/227
(58) Field of Search ................................ 327/538, 540, 327/541, 543, 544; 323/313, 314; 365/226, 227

(56) References Cited

U.S. PATENT DOCUMENTS

| 6,452,854 B1 * | 9/2002 | Kato et al. ................... 365/226 |
| 6,512,715 B2 * | 1/2003 | Okamoto et al. ............ 365/227 |
| 2003/0184362 A1 * | 10/2003 | Kwon ......................... 327/540 |
| 2004/0017690 A1 * | 1/2004 | Lee et al. .................... 365/145 |

FOREIGN PATENT DOCUMENTS

| JP | 64-27094 | 1/1989 |
| JP | 5-120884 | 5/1993 |
| JP | 7-211869 | 8/1995 |
| JP | 8-279288 | 10/1996 |
| JP | 9-274793 | 10/1997 |
| JP | 10-199241 | 7/1998 |
| JP | 10-228768 | 8/1998 |
| JP | 11-306783 | 11/1999 |
| JP | 2000-21166 | 1/2000 |
| JP | 2001-35160 | 2/2001 |

* cited by examiner

*Primary Examiner*—Timothy P. Callahan
*Assistant Examiner*—Terry L. Englund
(74) *Attorney, Agent, or Firm*—McDermott Will & Emery LLP

(57) ABSTRACT

A manner of generating internal voltages such as a high voltage, an intermediate voltage and an internal power supply voltage is switched in accordance with a power supply level setting signal. When the voltage level of an external power supply voltage is low, a current drive transistor receiving an output of a comparing circuit and an auxiliary drive transistor are forcedly set in a conductive state, and external power supply voltage is transmitted on an internal power supply line. At this time, the comparing operation of the comparing circuit is stopped. When the level of the external power supply voltage is high, the comparing circuit is activated down convert the external power supply voltage for generating a peripheral power supply voltage on the internal power supply line.

7 Claims, 22 Drawing Sheets

F I G. 4
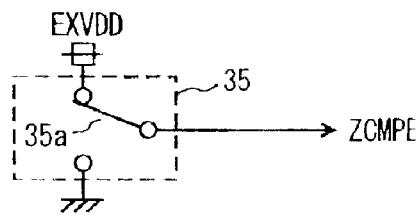
F I G. 5
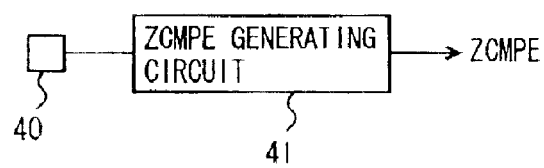
F I G. 6
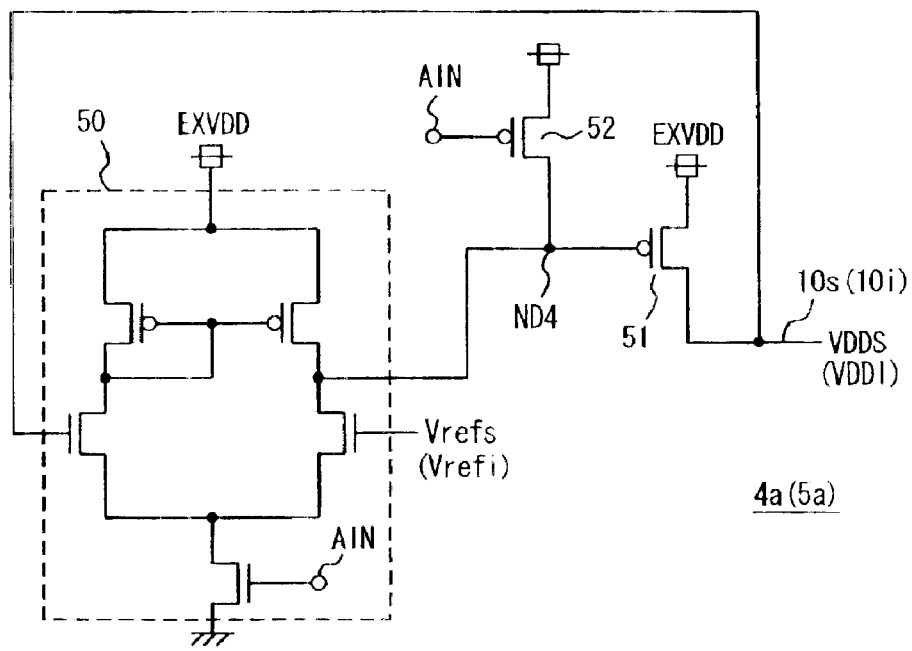

SEMICONDUCTOR DEVICE HAVING INTERNAL VOLTAGE GENERATED STABLY

BACKGROUND OF THE INVENTION

1. Field of the Invention

The present invention relates to a semiconductor device containing an internal voltage generating circuit for generating an internal voltage, and more particularly to an internal voltage generating circuit capable of stably generating an internal voltage in accordance with an external power supply voltage even for specifications of a plurality of external power supply voltages and a plurality of interfaces.

2. Description of the Background Art

FIG. 36 is a diagram schematically showing the configuration of an array portion of a conventional dynamic random access memory (DRAM). In FIG. 36, a memory cell MC is disposed at an intersection of bit lines BL and ZBL and a word line WL. In FIG. 36, memory cell MC disposed at the intersection of the bit line BL and word line WL is representatively shown.

Generally, in a memory array, memory cells MC are disposed in rows and columns, and word line WL is disposed corresponding to each memory cell row. For each memory cell column, a pair of bit lines BL and ZBL is disposed. A memory cell is disposed at the intersection of one of paired bit lines and a word line. Complementary data are transferred through bit lines BL and ZBL.

Memory cell MC includes a memory capacitor MQ for storing information in the form of electric charges and an access transistor MT for coupling memory cell capacitor MQ to a corresponding bit line BL (or ZBL) in accordance with a signal voltage on word line WL. Access transistor MT is usually formed of an N-channel MOS transistor (insulated gate field effect transistor), and a negative bias voltage Vbb is applied to a back gate of access transistor MT. By applying negative bias voltage Vbb to the back gate of access transistor MT, stabilization of the threshold voltage of access transistor MT, reduction in parasitic capacitance between a signal line and a substrate region, and reduction in junction capacitance of the drain and source of access transistor MT are intended to achieve.

Bit lines BL and ZBL are provided with a bit line equalizing circuit BPE for precharging and equalizing bit lines BL and ZBL to a bit line precharge voltage Vb1 level in a standby state, and a sense amplifier SA for differentially amplifying and latching the voltages on bit lines BL and ZBL.

Sense amplifier SA is provided with: a sense amplifier activating transistor ASPT that is made conductive, when a sense amplifier activate signal /SAP is activated, to couple a high-level power supply node of sense amplifier SA to a sense power supply line for transmitting an array power supply voltage Vdds; and a sense amplifier activating transistor ASNT that is made conductive, when a sense amplifier activate signal SAN is activated, to couple a low-level power supply node of sense amplifier SA to a sense ground line for transmitting a ground voltage Vss.

Bit line equalizing circuit BPE transmits bit line precharge voltage Vb1 of an intermediate voltage (Vdds/2) of array power supply voltage Vdds to bit lines BL and ZBL in accordance with a bit line equalize instruction signal BLEQ.

When selected, word line WL is driven to a high voltage Vpp level higher than array power supply voltage Vdds. By driving selected word line WL to high voltage Vpp level, without a threshold voltage loss across access transistor MT of memory cell MC, H data of array power supply voltage Vdds level is stored in a storage node of memory capacitor MQ.

Memory capacitor MQ receives a predetermined cell plate voltage Vcp at an electrode node (cell plate node) facing the storage node storing data. Usually, cell plate voltage Vcp is at the voltage level of intermediate voltage (Vdds/2) of array power supply voltage Vdds, similarly to bit line precharge voltage Vb1.

As described above, in a DRAM, a plurality of kinds of voltages of different voltage levels are used. In the case of generating the plurality of kinds of voltages externally for application to a DRAM, the scale of a system is increased and, due to loss on external wires, current consumption of the whole system also increases. In the DRAM as well, since the number of power supply pin terminals increases, the size of the package becomes large. Therefore, generally, the plurality of kinds of voltages are generated within a DRAM.

FIG. 37 is a diagram schematically showing the configuration of a portion related to internal voltages of the DRAM. In FIG. 37, the DRAM includes: a memory cell array 902 having a plurality of memory cells (memory cell MC in FIG. 36) arranged in rows and columns; a control circuit 904 for generating an operation control signal for implementing an operation mode designated by a command CMD in accordance with command CMD externally applied; a row selecting circuit 906 which is activated under control of control circuit 904 to drive a word line disposed corresponding to an addressed row in memory cell array 902 in accordance with a row address signal RA externally applied; a sense amplifier group 908 which is selectively activated by control circuit 904 to sense, amplify, and latch data of a memory cell on a row selected by row selecting circuit 906; a column selecting circuit 910 which operates under control of control circuit 904 and, when activated, selects a memory cell corresponding to an addressed column in memory cell array 902 in accordance with a column address signal CA externally applied; and an internal voltage generating circuit 900 for generating various internal voltages Vpp, Vbb, Vbl, Vcp, Vdds, and Vddp in accordance with an external power supply voltage EXVDD.

A peripheral power supply voltage Vddp from internal voltage generating circuit 900 is applied to control circuit 904 and row selecting circuit 906. A high voltage Vpp from internal voltage generating circuit 900 is also applied to row selecting circuit 906.

In row selecting circuit 906, a row selection signal is generated by a row decoding circuit which receives peripheral power supply voltage Vddp as an operation power supply voltage and, according to the row selection signal, a word line selection signal at high voltage Vpp level is transmitted by a word driver to a word line disposed corresponding to the selected row.

To memory cell array 902, bit line precharge voltage Vb1, cell plate voltage Vcp, and negative bias voltage Vbb supplied to a substrate region of memory cell array 902 are applied. To sense amplifier group 908, array power supply voltage Vdds is applied as an operation power supply voltage via the sense power supply line.

To column selecting circuit 910, usually, peripheral power supply voltage Vddp is applied as an operation power supply voltage. However, a column selection signal output from column selecting circuit 910 may be at the array power supply voltage Vdds level. Usually, peripheral power supply voltage Vddp is at a voltage level higher than array power supply voltage Vdds.

By causing peripheral circuits such as control circuit 904 to operate with peripheral power supply voltage Vddp and causing sense amplifier group 908 associated with memory cell array 902 to operate in accordance with array power supply voltage Vdds, the peripheral circuits are operated at high speed to achieve high-speed access, and the dielectric breakdown of the access transistor and memory cell capacitor of a memory cell is secured to store data stably.

In a semiconductor device, as the system scale increases, to prevent heat generation and the like, low power consumption is more strongly required. Particularly, in applications of portable equipment using a battery as a power source, current consumption has to be reduced from the viewpoint of battery's life as well. Particularly, as to a standby state in which no data access is performed, the time period of the standby state is longer than the time period in which a data processing is actually performed. A DRAM is required, in the standby state, only to hold data, and reduction in current consumption in the standby state is strongly required.

As a method of reducing current consumption in such a standby state, an operation mode called a power down mode is used. In the power down mode, supply of the operation power supply voltage is stopped in the circuitry not related to data retention such as an address input buffer circuit. By cutting off a DC (direct current) path of the circuitry that is non-related to data retention, a leakage current of the circuitry is reduced, and current consumption is reduced.

In uses of portable equipment and the like, recently, reduction in standby power is further demanded. To accommodate for such demand of a very low standby current, a mode called a "deep power down mode" is used. In the deep power down mode, an internal voltage generating operation of internal voltage generating circuit 900 is stopped. Since the power down mode is set by an external command, a power supply voltage is applied to circuitry related to release of the power down mode such as a command decoder receiving command CMD.

When the deep power down mode instruction is applied, as shown in FIG. 37, a power cut signal PCUT is generated from control circuit 904. Power cut signal PCUT is at the level of peripheral power supply voltage Vddp. In order to stop the operation of the circuitry for generating an internal voltage from external power supply voltage EXVDD, by a level converting circuit 915, power cut signal PCUT is converted to a power cut enable signal PCUTe having an amplitude of the external power supply voltage EXVDD level. Power cut enable signal PCUTe is supplied to the peripheral circuits such as row selecting circuit 906 and column selecting circuit 910 and the current path of each of the peripheral circuits is cut off.

Power cut enable signal PCUTe is applied to the circuit portion other than a circuit for controlling an operation related to the deep power down mode also in control circuit 904, and the current path of the circuit portion is cut off.

In the deep power down mode, current is consumed by only the necessary circuitry and the current path of unnecessary circuitry is cut off, thereby preventing occurrence of leakage current to reduce current consumption greatly.

A DRAM is used in various systems. In the systems, various power supply voltages exist. For example, as external power supply voltage EXVDD, 3.3V and 2.5V exist. As interfaces, not only an LVTTL, there is a 1.8VIO interface. In the 1.8VIO interface, although the external power supply voltage is 2.5V or 3.3V, the amplitude of an input signal is set to 1.8V. VIH and VIL are set to, for example, 0.8VDDQ and 0.2VDDQ on the basis of an output power supply voltage VDDQ.

In a DRAM, in the case where an internal voltage is generated from a different external power supply voltage with the same circuit configuration, since an operation condition of the internal voltage generating circuit vary according to the external power supply voltage level, such a problem occurs that the internal voltage at an optimum voltage level cannot be efficiently generated.

In the case of designing an internal voltage generating circuit in accordance with each external power supply voltage level or interface specification, to be simply adapted to the voltage level of an external power supply voltage, a plurality of kinds of chips, the same in configuration of main internal circuitry but different in configuration of the internal voltage generating circuit, have to be fabricated. It results in problems that the manufacturing efficiency deteriorates and the cost increases.

Therefore, from the viewpoints of product management and cost, it is preferable to implement an internal voltage generating circuit adapted to an external power supply voltage level or interface specification by use of mask interconnection or fixing of a voltage at a bonding pad in a slice process while manufacturing a common circuit part for a plurality of kinds external power supply voltages and interfaces in a master process.

SUMMARY OF THE INVENTION

An object of the present invention is to provide a semiconductor device capable of stably generating an internal voltage irrespective of an external power supply voltage level and interface specifications.

Another object of the present invention is to provide a semiconductor device capable of efficiently generating an internal voltage of a desired voltage level according to an external power supply voltage level used.

A semiconductor device according to a first aspect of the present invention includes: a comparing circuit for comparing a reference voltage generated from a reference voltage generation circuit with an internal voltage and outputting a signal according to the comparison result when activated; a drive circuit for supplying current from a power supply node to an internal voltage line and generating the internal voltage in accordance with an output signal of the comparing circuit; a comparison control circuit for stopping a comparing operation of the comparing circuit in accordance with an internal voltage level setting signal, fixing an output signal of the comparison circuit at a predetermined voltage level, and setting the drive circuit in a normally conductive state; and an auxiliary transistor for coupling the internal voltage line to the power supply node in accordance with the internal voltage level setting signal.

A semiconductor device according to a second aspect of the present invention includes: a first input circuit which receives a first power supply voltage as an operation power supply voltage, is selectively activated in accordance with a mode setting signal, and generate a first internal signal from an external signal when activated; a second input circuit which receives a second power supply voltage as an operation power supply voltage, is selectively activated in response to the mode setting signal, and generates a second internal signal from the external signal when activated; a level converting circuit for level converting the second internal signal from the second input circuit to a signal having an amplitude of the first power supply voltage level to generate a third internal signal; and an input gate circuit which receives the first power supply voltage as an operation power supply voltage and, in accordance with the first and third internal signals, generates a fourth internal signal to be transmitted to an internal circuit. When the first and second input circuits are disabled, the input gate circuit operates as a buffer circuit in accordance with an output signal of the disabled input circuit and buffers an output signal of the level converting circuit or the first input circuit, whichever is enabled.

A semiconductor device according to a third aspect of the present invention includes: a first capacitive element connected between a first control signal input node receiving a first control signal and a first internal node; second and third transistors for precharging second and third internal nodes to an external power supply voltage level in accordance with a voltage level of the first internal node, respectively; a second capacitive element connected between a second control signal input node receiving a second control signal and the second internal node; an output transistor selectively rendered conductive in accordance with a voltage level of the second internal node and, to transmit electric charges between the third internal node and an output node; a drive circuit receiving voltages of a power supply voltage of an external power supply node and a first internal voltage node as operation power supply voltages and driving a fourth internal node in accordance with a third control signal; a third capacitive element connected between the fourth internal node and the third internal node; a fourth capacitive element; and interconnections for connecting the fourth capacitance element at either path between a fourth control signal input node receiving a fifth control signal and the third internal node and between the fourth control signal input node and the first internal voltage node.

By setting a drive circuit normally in a conductive state and setting an auxiliary transistor in a conductive state, an amount of current supplied to an internal voltage line can be increased. Thus, when an external power supply node is coupled to the internal voltage line, the external power supply voltage can be stably transmitted to the internal voltage line.

In the input circuit, by level converting an output signal of the second input circuit and generating an internal signal according to an output signal of a first input circuit and an output signal of a level converting circuit, even in the case where an input interface is different, by enabling one of the input circuits, an internal signal can be stably generated.

By selectively making conductive power supply transistors for generating internal power supply voltages in accordance with a power supply control signal, an internal voltage level setting signal, and a voltage mode instruction signal, the internal power supply voltage at an optimum voltage level according to the external power supply voltage level can be generated.

By connecting the capacitive elements in parallel to supply electric charges when generating an internal voltage, in the case where an external voltage is high, electric charges can be supplied with sufficient capability, and an internal voltage at a desired voltage level can be stably generated. By changing the voltage level of one of operation power supply voltages of the drive circuit by using the capacitive element, boosting operation in two stages can be performed by capacitive coupling, and a large voltage level change can be caused on an internal node. Also in the case where the external power supply voltage level is low, the internal voltage at a desired voltage level can be stably generated.

Further by changeably setting connection of the capacitive elements, an internal voltage generating circuit for generating an internal voltage with an optimum capability according to the external power supply voltage level can be implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram showing an example of the configuration of a portion generating a voltage level setting signal shown in FIG. 1;

FIG. 5 is a diagram schematically showing the configuration of a modification of a voltage level setting signal generating unit;

FIG. 6 is a diagram showing an example of the configuration of an array active VDC and an input active VDC shown in FIG. 1;

DESCRIPTION OF THE PREFERRED EMBODIMENTS

First Embodiment

Figure 1:
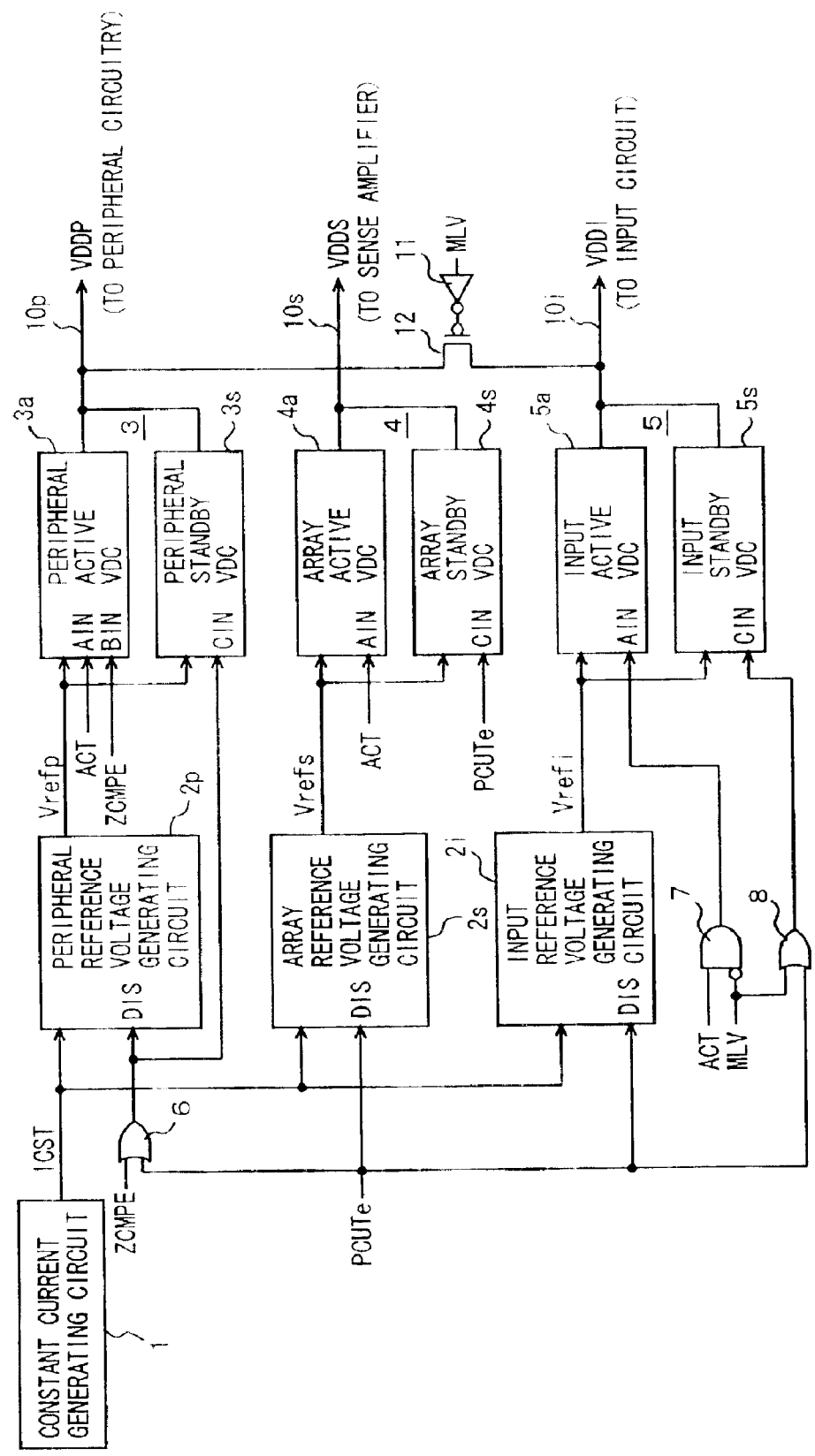
FIG. 1 is a diagram schematically showing the configuration of an internal voltage generating circuit according to a first embodiment of the present invention.

FIG. 1 is a diagram schematically showing the configuration of internal voltage generating circuitry according to a first embodiment of the present invention. The internal voltage generating circuitry shown in FIG. 1 is included in internal voltage generating circuit 900 shown in FIG. 37.

In FIG. 1, the internal voltage generating circuitry includes; a constant current generating circuit 1 for generating a constant current ICST; an OR circuit 6 receiving an external power supply level designation signal ZCMPE and a power cut enable signal PCUTe; a peripheral reference voltage generating circuit 2p receiving an output signal of OR circuit 6 at a control input DIS and operating, when an output signal of OR circuit 6 is an inactive state (L level), to generate a peripheral reference voltage Vrefp; an array reference voltage generating circuit 2s operating, when power cut enable signal PCUTe supplied to a control input DIS is inactive, to generate an array reference voltage Vrefs; and an input reference voltage generating circuit 2i operating, when power cut enable signal PCUTe supplied to a control input DIS is inactive, to generate an input reference voltage Vrefi.

External power supply level designation signal ZCMPE is fixedly set according to the voltage level of an external power supply voltage EXVDD used for the semiconductor device. Specifically, when external power supply voltage EXVDD is as low as 2.5V, external power supply level designation signal ZCMPE is set to the H level. When external power supply voltage EXVDD is as high as 3.3V, external power supply level designation signal ZCMPE is set to the L level. By fixing the voltage of mask interconnection line or a bonding pad, the voltage level of external power supply level designation signal ZCMPE is set.

Similarly to the conventional technique, power cut enable signal PCUTe is set to the H level when the deep power down mode is designated. Therefore, in the deep power down mode, generation of array reference voltage Vrefs, peripheral reference voltage Vrefp, and input reference voltage Vrefi is stopped. In the deep power down mode, it is necessary to operate a circuit for receiving a command for releasing the deep power down mode and executing the operation of releasing the deep power down mode. As will be described later, in the deep power down mode, the peripheral power supply voltage is generated on the basis of the external power supply voltage from another path and supplied as an operation power supply voltage to a peripheral control circuit related to setting/release of the deep power down mode.

The internal voltage generating circuit further includes: a peripheral power supply circuit 3 for generating a peripheral power supply voltage VDDP on a peripheral power supply line 10p; an array power supply circuit 4 for generating an array power supply voltage (sense power supply voltage) VDDS on an array power supply line 10S on the basis of array reference voltage Vrefs; and an input power supply circuit 5 for generating an input power supply voltage VDDI on an input power supply line 10i on the basis of input reference voltage Vrefi.

Figure 37:
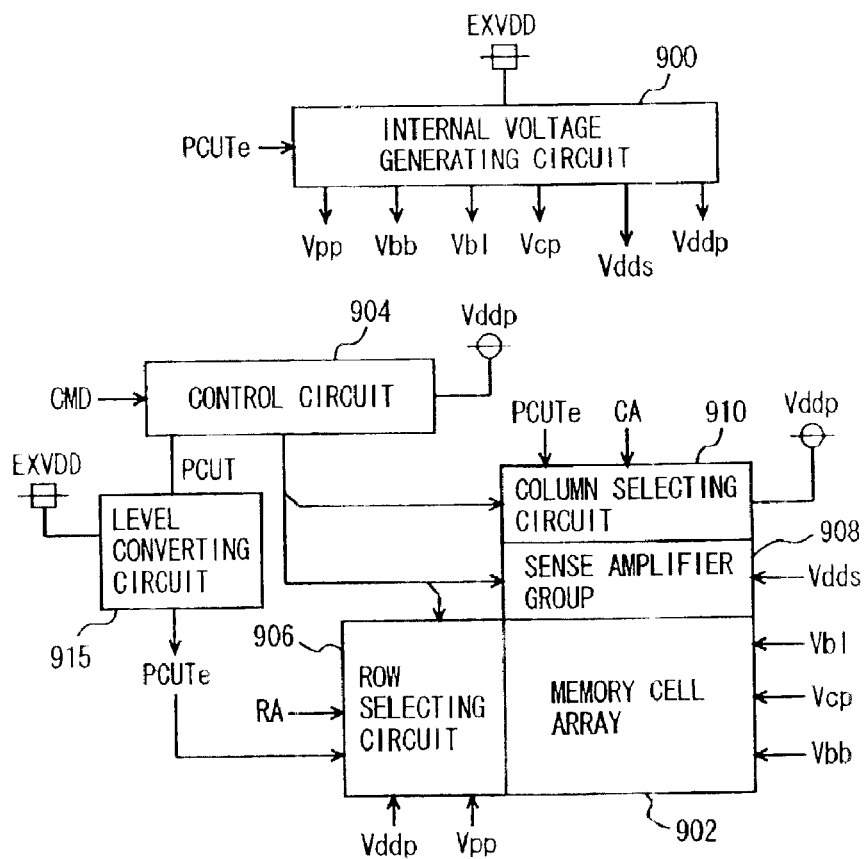
FIG. 37 is a diagram schematically showing the general configuration of the conventional semiconductor memory device.

Peripheral power supply voltage VDDP on peripheral power supply line 10p corresponds to peripheral power supply voltage Vddp shown in FIG. 37 and supplied to peripheral circuitry. Array power supply voltage VDDS corresponds to sense power supply voltage Vdds shown in FIG. 37 and supplied to a sense amplifier and others. Input power supply voltage VDDI is generated when an interface specification is, for example, a 1.8VIO interface and is applied as an operation power supply voltage to an input buffer at the first stage of an input circuit. An output power supply voltage VDDQ dedicated to output is applied externally to an output circuit.

Peripheral power supply circuit 3 includes: a peripheral active VDC (voltage down converter) 3a which is selectively activated in response to an array activating signal ACT and external power supply level designation signal ZCMPE supplied to control inputs AIN and BIN and, when activated, generates peripheral power supply voltage VDDP on peripheral power supply line VDDP on the basis of peripheral reference voltage Vrefp; and a peripheral standby VDC 3s which is selectively activated in accordance with a signal applied to control input CIN and, when activated, generates peripheral power supply voltage VDDP on peripheral power supply line 10p.

Peripheral active VDC 3a supplies a current to peripheral power supply line 10p with a larger current driving capability when operates and maintains the voltage level of the peripheral power supply voltage VDDP at a predetermined voltage level even when the peripheral power supply voltage is consumed by the internal operation.

When set in an operating state, peripheral standby VDC 3s supplies a current onto peripheral power supply line 10p with a small current driving capability and prevents the voltage level of peripheral power supply voltage VDDP from being decreased by leakage current and other in the standby state.

To control input CIN of peripheral standby VDC 3s, similarly to peripheral reference voltage generating circuit 2p, an output signal of OR gate 6, which receives external power supply level designation signal ZCMPE and power cut enable signal PCUTe, is applied. In operation, peripheral active VDC 3a and peripheral standby VDC 3s compare peripheral reference voltage Vrefp and peripheral power supply voltage VDDP, supply current from an external power supply node to peripheral power supply line 10p in accordance with a comparison result, and maintains peripheral power supply voltage VDDP at a voltage level corresponding to the voltage level of peripheral reference voltage Vrefp.

Peripheral active VDC 3a is activated when array activating signal ACT applied to control input AIN is active and external power supply level designation signal ZCMPE supplied to control input BIN is at the L level, and generates peripheral power supply voltage VDDP when made active. Peripheral standby VDC 3s is activated when both external power supply level designation signal ZCMPE and power cut enable signal PCUTe are at the L level and operates, in an active cycle for selecting a memory cell and a standby cycle after completion of selection of a memory cell, to generate peripheral power supply voltage VDDP.

Array power supply circuit 4 includes: an array active VDC 4a which operates when array activating signal ACT supplied to control input AIN is activated, compares array power supply voltage VDDS with array reference voltage Vrefs and, according to the comparison result, supplies current from an external power supply node to array power supply line 10s; and an array standby VDC 4s which operates when power cut enable signal PCUTe supplied to control input CIN is made inactive (L level), and supplies current from the external power supply node to array power supply line 10s in accordance with the result of comparison between array reference voltage Vrefs and array power supply voltage VDDS.

External power supply level designation signal ZCMPE is not supplied to array power supply circuit 4. Even if external power supply voltage EXVDD is, for example, 2.5V or 3.3V, array power supply voltage VDDS is, for example, 2.0V. For either voltage level of external power supply voltage EXVDD, it is required to down-convert external power supply voltage EXVDD to generate array power supply voltage VDDS.

Input power supply circuit 5 includes: an input active VDC 5a which is activated when a signal supplied to control input AIN is active, compares input reference voltage Vrefi and input power supply voltage VDDI, and supplies current to input power supply line 10i in accordance with a comparison result; and an input standby VDC 5s which is activated, when a signal supplied to control input CIN is at the L level, to compare input reference voltage Vrefi and input power supply voltage VDDI and, according to the comparison result, supplies current to input power supply line 10i.

To input active VDC 5a, an output signal of a gate circuit 7 which receives array activating signal ACT and a mode selection signal MLV. When array activating signal ACT is at the H level and mode selection signal MLV is at the L level, gate circuit 7 outputs a signal of the H level. Mode selection signal MLV, at the L level, designates a 1.8VIO (interface) mode. To control input CIN of input standby VDC 5s, an output signal of an OR gate 8 which receives mode selection signal MLV and power cut enable signal PCUTe is supplied.

OR circuits 6 and 8 and gate circuit 7 receive an external power supply voltage as an operation power supply voltage, and generate a control signal in accordance with power cut enable signal PCUTe or mode selection signal MLV at the external power supply voltage level.

The internal voltage generating circuit further includes: an inverter 11 for inverting mode selection signal MLV and a connection gate 12 which is made conductive when an output signal of inverter 11 is at the L level and electrically connect peripheral power supply line 10p and input power supply line 10i when made conductive. In FIG. 1, connection gate 12 is constructed by a P-channel MOS transistor (insulated gate field effect transistor). Alternatively, connection gate 12 may be constructed by a CMOS transmission gate.

Specifically, when mode selection signal MLV is at the L level, connection gate 12 is in a nonconductive state, and peripheral power supply voltage VDDP and input power supply voltage VDDI are generated individually and independently. On the other hand, when mode selection signal MLV is set high, connection gate 12 is made conductive and peripheral power supply line 10p and input power supply line 10i are electrically connected to each other. In this case, peripheral power supply voltage VDDP is also used as input power supply voltage VDDI (since input power supply circuit 5 is held in a nonconductive state).

Specifically, when mode setting signal MLV is at the H level, an LVTTL mode is designated as an interface. When mode selection signal MLV is at the L level, the 1.8VIO mode is designated. In the LVTTL mode, an H level VIH of an input signal is 2.0V and an L level VIL of the input signal is 0.8V. On the other hand, in the 1.8VIO mode, the H level of an input signal is lower than the LVTTL level.

Therefore, in the case where mode setting signal MLV is set at the L level, input power supply circuit 5 operates to generate input power supply voltage VDDI according to the 1.8VIO mode. On the other hand, when mode setting signal MLV is at the H level and the LVTTL mode is designated, input power supply voltage VDDI and peripheral power supply voltage VDDP are set to the same voltage level, and the operation of input power supply circuit 5 is stopped. Power consumption in the LVTTL mode is reduced.

Figure 2:
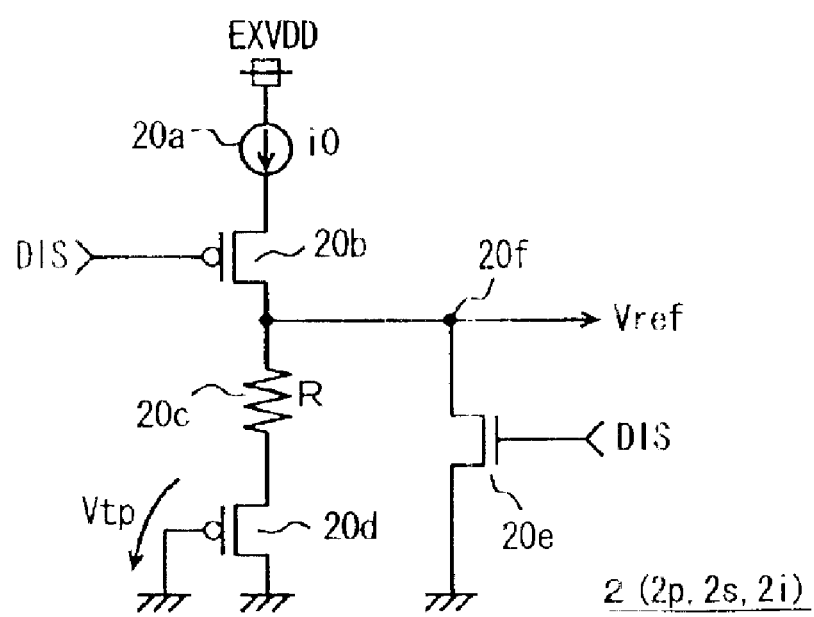
FIG. 2 is a diagram showing an example of the configuration of a reference voltage generating circuit shown in FIG. 1.

FIG. 2 is a diagram showing an example of the configuration of reference voltage generating circuits 2p, 2s, and 2i shown in FIG. 1. Since reference voltage generating circuits 2p, 2s, and 2i have the same configuration, FIG. 2 representatively shows a configuration of a reference voltage generating circuit 2.

In FIG. 2, reference voltage generating circuit 2 includes: a constant current source 20a coupled to an external power supply node for supplying a constant current I0; a P-channel MOS transistor 20b connected between constant current source 20a and an output node 20f and having a gate connected to control input DIS; a resistive element 20c having one end connected to output node 20f; a P-channel MOS transistor 20d connected between resistive element 20c and a ground node and having a gate connected to the ground node; and an N-channel MOS transistor 20e connected between output node 20f and the ground node and having a gate connected to control input DIS.

In reference voltage generating circuit 2, when a signal applied to control input DIS is at the L level, MOS transistor 20b is conductive and MOS transistor 20e is nonconductive. MOS transistor 20d operates in a diode mode and causes a voltage drop of an absolute value Vtp of the threshold voltage thereof when conductive. By using MOS transistor 20d, until external power supply voltage EXVDD increases and the source potential of MOS transistor 20d exceeds voltage Vtp, the voltage Vref from output node 20f is increased in accordance with external power supply voltage EXVDD. Accordingly, upon power on of external power supply voltage, the voltage level of the reference voltage can be increased at high speed.

Therefore, when a signal supplied to control input DIS is at the L level, the voltage level of reference voltage Vref from output node 20f is given by the following equation.

$$Vref = I0 \cdot R + Vtp,$$

where R denotes a resistance value of resistive element 20c.

When the control signal supplied to control input DIS is at the H level, MOS transistor 20b is nonconductive and MOS transistor 20e is conductive. Therefore, in this case, the path of supplying current from constant current source 20a is cut off, and reference voltage Vref is fixed at the ground voltage level by MOS transistor 20e.

In the case where reference voltage generating circuit 2 is peripheral reference voltage generating circuit 2b shown in FIG. 1, external power supply level designation signal ZCMPE is applied to control input DIS. When external power supply level designation signal ZCMPE is at the H level, external power supply voltage EXVDD is, for example, 2.5V. In this case, as will be described in detail later, peripheral power supply voltage VDDP is set to the same voltage level as that of external power supply voltage EXVDD. Therefore, in this case, it is unnecessary to generate peripheral reference voltage Vrefp, and the operation of peripheral reference voltage generating circuit 2p is stopped. On the other hand, when external power supply voltage EXVDD is, for example, 3.3V, external power supply level designation signal ZCMPE is set to the L level, and external power supply voltage EXVDD is down-converted in accordance with peripheral reference voltage Vrefp, thereby generating peripheral power supply voltage VDDP.

In the case where reference voltage generating circuit 2 shown in FIG. 2 is array reference voltage generating circuit 2s or input reference voltage generating circuit 2i, power cut enable signal PCUTe is applied to control input DIS. Therefore, in the deep power down mode, power cut enable signal PCUTe is set high, and the reference voltage generating operation of array reference voltage generating circuit 2s and input reference voltage generating circuit 2i is stopped.

In the case of peripheral reference voltage generating circuit 2p, control input DIS receives an output signal of OR circuit 6. When external power supply level designation signal ZCMPE is at the H level, the reference voltage generating operation is stopped irrespective of the operation mode, and peripheral reference voltage Vrefp is fixed at the ground voltage level. When external power supply level designation signal ZCMPE is at the L level, an output signal of OR circuit 6 is set high (H level) in accordance with power cut enable signal PCUTe. In the deep power down mode, similarly to array reference voltage Vrefs and input reference voltage Vrefi, generation of peripheral reference voltage Vrefp is stopped.

Figure 3:
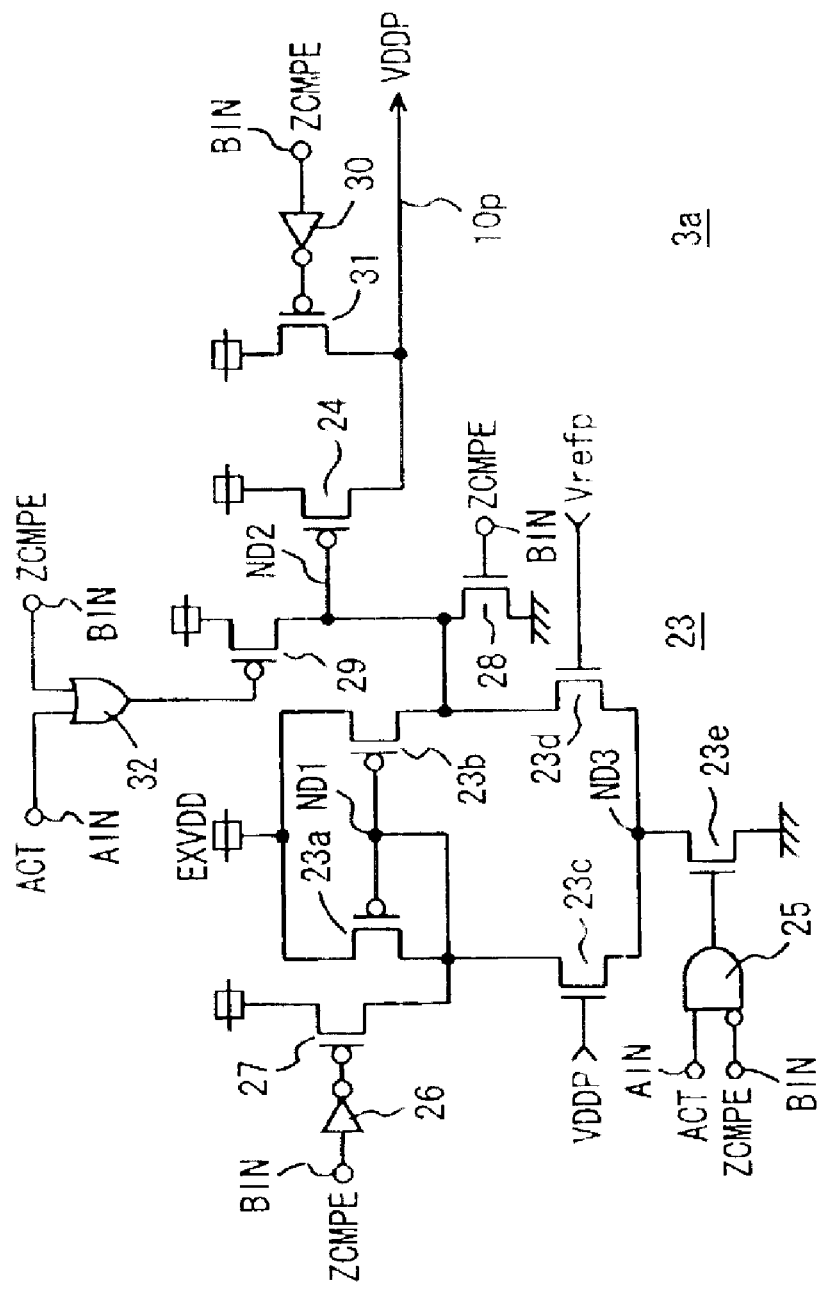
FIG. 3 is a diagram showing an example of the configuration of a peripheral active VDC shown in FIG. 1.

FIG. 3 is a diagram showing an example of the configuration of peripheral active VDC 3a shown in FIG. 1. In FIG. 3, peripheral active VDC 3a includes: a comparing circuit 23 for comparing peripheral power supply voltage VDDP and peripheral reference voltage Vrefp; and a current drive transistor 24 for supplying a current from an external power supply node to peripheral power supply line 10p in accordance with an output signal of comparing circuit 23.

Comparing circuit 23 includes: a P-channel MOS transistor 23a connected between an external power supply node and a node ND1 and having a gate connected to node ND1; an N-channel MOS transistor 23c connected between nodes ND1 and ND3 and having a gate connected to receive peripheral power supply voltage VDDP; a P-channel MOS transistor 23b connected between the external power supply node and a node ND2 and having a gate connected to node ND1; an N-channel MOS transistor 23d connected between nodes ND2 and ND3 and having a gate connected to receive reference voltage Vrefp; and an N-channel MOS transistor 23e connected between node ND3 and the ground node and having a gate connected to receive an output signal of a gate circuit 25.

MOS transistors 23a and 23b construct a current mirror circuit, and a mirror current flowing through MOS transistor 23a flows via MOS transistor 23b. In the case where the mirror ratio is 1, current of the same magnitude flows through MOS transistors 23a and 23b.

MOS transistors 23c and 23d construct a differential stage for comparing peripheral power supply voltage VDDP with peripheral reference voltage Vrefp. MOS transistor 23e operates as a current source transistor of comparing circuit 23, enables the comparing operation of comparing circuit 23 when conductive, and cuts off the path of the operation current of comparing circuit to disable the comparing operation of comparing circuit 23 when made nonconductive.

Gate circuit 25 receives array activating signal ACT applied to control input AIN and external power supply level designation signal ZCMPE applied to control input BIN. Gate circuit 25 outputs an H-level signal when array activating signal ACT is at the H level and external power supply level designation signal ZCMPE is at the L level. Therefore, when external power supply level designation signal ZCMPE is at the H level, an output signal of gate circuit 25 is fixed at the L level, and the comparing operation of comparing circuit 23 is prohibited. Specifically, when external power supply voltage EXVDD is low as 2.5V, external power supply level designation signal ZCMPE is set to the H level, and the comparing operation of comparing circuit 23 is stopped.

Peripheral active VDC 3a further includes: an inverter 26 receiving external power supply level designation signal ZCMPE supplied to control input BIN; a P-channel MOS transistor 27 made conductive, when an output signal of inverter 26 is at the L level, to couple node ND1 to the external power supply node; a P-channel MOS transistor 29 made conductive, when an output signal of a gate circuit 32 receiving array activating signal ACT supplied to control input AIN and external power supply level designation signal ZCMPE supplied to control node BIN is inactive (L level), to couple node ND2 to the external power supply node; an inverter 30 receiving external power supply level designation signal ZCMPE supplied to control input BIN; a P-channel MOS transistor 31 made conductive, when an output signal of inverter 30 is at the L level, to couple peripheral power supply line 10p to the external power supply node; and an N-channel MOS transistor 28 made conductive, when external power supply level designation signal ZCMPE supplied to control input BIN is at the H level, to hold node ND2 at the ground voltage level.

Gate circuit 32 outputs an H-level signal when array activating signal ACT is at the H level and external power supply level designation signal ZCMPE is at the L level.

When external power supply level designation signal ZCMPE is at the H level, output signals of inverters 26 and 30 turn L level, and MOS transistors 27 and 31 are made conductive. An output signal of gate circuit 32 turns H level, MOS transistor 29 is made nonconductive, and node ND2 is disconnected from the external power supply node. Further, MOS transistor 28 is made conductive, and node ND2 is fixed at the ground voltage level.

In this state, node ND1 attains the external power supply voltage level, and MOS transistors 23a and 23b are turned off. The comparing operation of comparing circuit 23 is locked (prohibited).

On the other hand, peripheral power supply line 10p is connected to the external power supply node via MOS transistor 31, and peripheral power supply voltage VDDP attains external power supply voltage EXVDD. Since node ND2 is held at the ground voltage level, MOS transistor 24 is fixed in a conductive state. When external power supply voltage EXVDD is low, if the external power supply node is directly connected to peripheral power supply line 10p by using only current drive transistor 24, voltage drop occurs due to the channel resistance and the voltage level of peripheral power supply voltage VDDP drops below external power supply voltage EXVDD, so that a necessary voltage level cannot be provided. In the case where the size (the ratio of channel width to channel length) of current drive transistor 24 is increased in order to decrease the channel resistance, the gain of peripheral active VDC 3a when external power supply level designation signal ZCMPE is at the L level becomes high, oscillation is apt to occur, and peripheral power supply voltage VDDP cannot be generated stably. In order to maintain responsiveness of comparing circuit 23, the current driving capability (size) of each transistor in comparing circuit 23 has to be increased. Consequently, such a problem that power consumption of comparing circuit 23 increases may occur.

MOS transistor 31 is provided separately from current drive transistor 24. Only when external power supply level designation signal ZCMPE is at the H level, MOS transistor 31 is made conductive and the voltage level of peripheral power supply voltage VDDP is set to external power supply voltage EXVDD level. Even if the size of MOS transistor 31 is made large, when external power supply level designation signal ZCMPE is at the L level, MOS transistor 31 is nonconductive, and exerts no influence on the current generating operation of peripheral active VDC 3a.

Consequently, when the voltage level of power supply voltage EXVDD is low as 2.5V, by using MOS transistors 24 and 31, peripheral power supply voltage VDDP can be maintained at the external power supply voltage EXVDD level with reliability. When the voltage level of external power supply voltage EXVDD is high, by current driving of current drive transistor 24, without causing an oscillating operation, peripheral power supply voltage VDDP at a desired voltage level can be generated. The size of each transistor in comparing circuit 23 can be made small, and current consumption (operation current) therein can be reduced.

Further, when external power supply level designation signal ZCMPE is at the H level, as shown in FIG. 2, comparison reference voltage Vrefp is at the ground voltage level, and MOS transistor 23d is maintained in a nonconductive state. Therefore, even if node ND2 is fixed at the ground voltage level when external power supply level designation signal ZCMPE is at the H level, leakage current can be prevented from flowing from MOS transistor 27 to the ground node via MOS transistors 23c and 23d.

When a transistor of a peripheral circuit is designed such that its operation characteristics are optimized for a power supply voltage of 2.5V, in the case of manufacturing a 3.3V product adapted to external power supply voltage EXVDD of 3.3 V, external power supply level designation signal ZCMPE is set to the L level to operate peripheral active VDC 3a for down-converting external power supply voltage EXVDD to generate peripheral power supply voltage VDDP of 2.5V level. On the other hand, in the case of manufacturing a 2.5V product to be applied to external power supply voltage EXVDD 2.5V, external power supply level designation signal ZCMPE is set to the H level, and peripheral power supply line 10p and the external power supply node are connected directly to each other. With the same circuit configuration, a peripheral power supply circuit adaptable to a plurality of kinds of external power supply voltages can be implemented.

When external power supply level designation signal ZCMPE is at the L level, all of MOS transistors 27, 28, and 31 are nonconductive. In this case, when array activating signal ACT turns H level and a peripheral circuit operates, MOS transistor 23e becomes conductive, and MOS transistor 29 becomes nonconductive. Comparing circuit 23 operates, and current drive transistor 24 supplies current to peripheral power supply line 10b in accordance with an output signal of comparing circuit 23.

When array activating signal ACT turns L level, MOS transistor 23e becomes nonconductive, MOS transistor 31 becomes conductive, node ND2 is set to the external power supply voltage EXVDD level, and current drive transistor 24 becomes nonconductive.

FIG. 4 is a diagram showing an example of the configuration of a part for generating external power supply level designation signal ZCMPE. In FIG. 4, the external power supply level designation signal generating unit includes a metal switch 35 having a connecting path set to either the external power supply voltage node or ground node by a metal interconnection line. By setting the connection path of metal switch 35, the voltage level of external power supply level designation signal ZCMPE is fixedly set. Metal interconnection line 35a is mask interconnection and formed in a slice process. FIG. 4 shows, as an example, a state where metal interconnection line 35a is coupled to the external power supply node and external power supply level designation signal ZCMPE of the H level is generated. In the slice process, by setting the connection path of metal interconnection 35a, products adaptable to different external power supply voltage levels such as a 3.3V product and a 2.5V product can be manufactured by using DRAMs of the same chip configuration.

FIG. 5 is a diagram schematically showing another configuration of a portion of generating external power supply level designation signal ZCMPE. In FIG. 5, the external power supply level designation signal generating unit includes a pad 40 and a ZCMPE generating circuit 41 for generating external power supply level designation signal ZCMPE in accordance with the voltage level of pad 40. The internal configuration of ZCMPE generating circuit 41 is determined depending on whether pad 40 is set to the external power supply voltage or ground voltage at the time of bonding. Basically, ZCMPE generating circuit 41 includes a latch circuit for latching the potential of pad 40. That is, in ZCMPE generating circuit 41, pad 40 is either connected to the external power supply node or ground node or set in an open state.

External power supply level designation signal ZCMPE may be generated from a program circuit having a voltage level of an output signal set using a fusible link element.

The H level of external power supply level designation signal ZCMPE is the external power supply voltage EXVDD level, and inverters 26 and 30 and gate circuit 32 shown in FIG. 3 receive external power supply voltage EXVDD as an operation power supply voltage. Gate circuit 25 may receive peripheral power supply voltage VDDP as an operation power supply voltage.

FIG. 6 is a diagram showing an example of the configuration of array active VDC 4a and input active VDC 5a shown in FIG. 1. Since array active VDC 4a and input active VDC 5a have the same configuration, FIG. 6 shows the configuration of array active VDC 4a, and reference characters and numerals of input active VDC 5a are shown within parentheses.

In FIG. 6, array active VDC 4a includes: a comparing circuit 50 which is activated when a signal supplied to control input AIN is at the H level and compares array power supply voltage VDDS on array power supply line 10s with array reference voltage Vrefs; a current drive transistor 51 for supplying current from an external power supply node to array power supply line 10s in accordance with an output signal of comparing circuit 50; and a P-channel MOS transistor 52 which is made conductive when the signal supplied to control input AIN is at the L level and maintains gate node ND4 of current drive transistor 51 at the external power supply voltage EXVDD level when made conductive.

In the configuration of array active VDC 4a, comparing circuit 50 is formed of a current mirror type differential amplifying circuit. When a signal supplied to control input AIN is at the H level, by the comparing operation of comparing circuit 50, a signal at a voltage level according to the difference between array reference voltage Vrefs and array power supply voltage VDDS appears at node ND4. According to the signal on node ND4, current drive transistor 51 supplies current from the external power supply node to array power supply line 10s. In the configuration, therefore, array power supply voltage VDDS is maintained at the voltage level of array reference voltage Vrefs.

When a signal supplied to control input AIN is at the L level, in comparing circuit 50, the path in which the operation current flows is cut off and the comparing operation is stopped. MOS transistor 52 is made conductive, node ND4 is maintained at the external power supply voltage EXVDD level, and current drive transistor 51 is made nonconductive. Therefore, when the internal circuit operates (at the time of sensing operation as will be described later), array active VDC 4a having a relatively large current driving capability operates, array power supply voltage VDDS is generated with a large current driving capability, and drop in the voltage level is prevented.

In the case of input active VDC 5a, current drive transistor 51 supplies current to input power supply line 10i in accordance with the difference between input power supply voltage VDDI on input power supply line 10i and input reference voltage Vrefi, and the voltage level of input power supply voltage VDDI is set to the voltage level of input reference voltage Vrefi.

In array active VDC 4a, array activating signal ACT is applied to control input AIN. On the other hand, as to input active VDC 5a, an output signal of gate circuit 7 shown in FIG. 1 is applied. Therefore, when mode setting signal MLV is set to the H level and the input interface is set to the LVTTL mode, the operation of input active VDC 5a is stopped. In this state, input power supply voltage VDDI is set to the same voltage level as that of peripheral power supply voltage VDDP as shown in FIG. 1. On the other hand, when mode setting signal MLV is set to the L level and a 1.8VIO mode is designated as an interface mode, input active VDC 5a is selectively activated in accordance with array activating signal ACT.

Similarly to external power supply level designation signal ZCMPE, the voltage level of mode selecting signal MLV is set by mask interconnection line or selective wiring of a bonding pad.

In input reference voltage generating circuit 2i for generating input reference voltage Vrefi, power cut enable signal PCUTe is supplied to control input DIS. However, to control input DIS of input reference voltage generating circuit 2i, an output signal of the gate circuit receiving power cut enable signal PCUTe and mode setting signal MLV may be applied. Specifically, when mode setting signal MLV is set to the H level and the LVTTL mode is designated, it is unnecessary to generate input power supply voltage VDDI. Therefore, the reference voltage generating operation of input reference voltage generating circuit 2i is stopped to allow current consumption to be reduced. As a gate circuit for applying the signal to control input DIS of input reference voltage generating circuit 2i, an OR circuit is sufficient.

Figure 7:
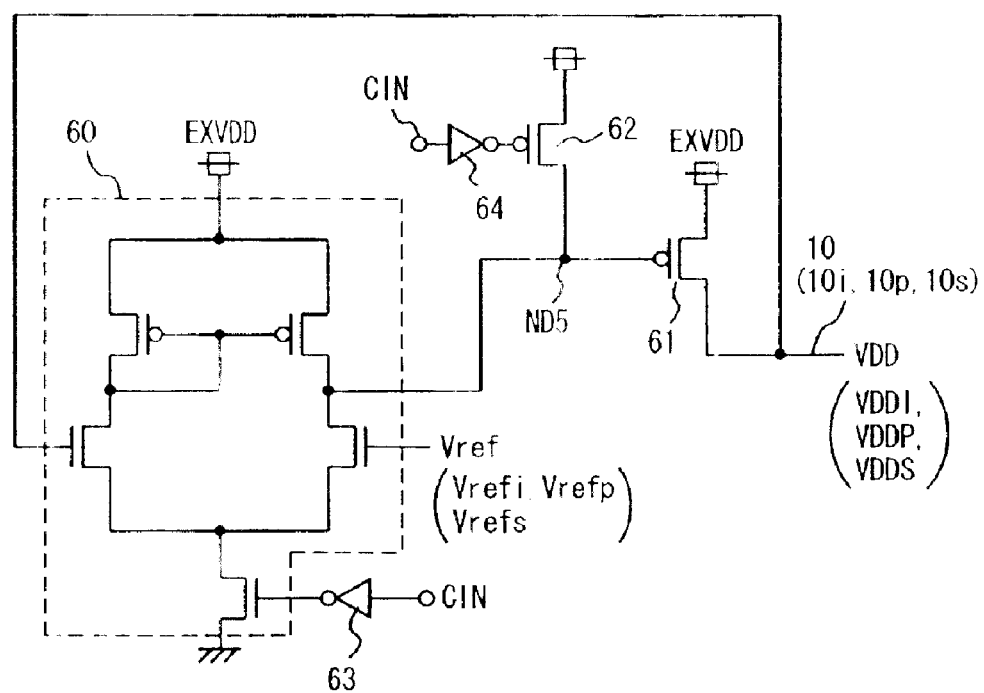
FIG. 7 is a diagram showing an example of the configuration of a standby VDC shown in FIG. 1.

FIG. 7 is a diagram showing an example of the configuration of standby VDCs 3s, 4s and 5s shown in FIG. 1. Since standby VDCs 3s, 4s and 5s have the same configuration, FIG. 7 representatively shows one standby VDC. In FIG. 7, a standby VDC includes: a comparing circuit 60 which is activated when a signal supplied to control input CIN is at the H level and compares reference voltage Vref (Vrefi, Vrefp or Vrefs) and power supply voltage VDD (VDDI, VDDP or VDDS) when activated; a current drive transistor 61 for supplying current onto the internal power supply line (10i, 10p or 10s) in accordance with an output signal of comparing circuit 60; and a P-channel MOS transistor 62 which is made conductive when a signal supplied to control input CIN is at the L level and transmits external power supply voltage EXVDD to gate electrode node ND5 of current drive transistor 61 when conductive.

To control input CIN, in the case of peripheral standby VDC 3s, an output signal of OR gate 6 shown in FIG. 1 is applied. Therefore, VDC, in the case of peripheral standby VDC 3s, is activated when both power cut enable signal PCUTa and external power supply level designation signal ZCMPE are at the H level, and adjusts the voltage level of internal power supply voltage VDD on the basis of the difference between reference voltage Vref and internal power supply voltage VDD. Specifically, when external power supply voltage is, for example, 2.5V and external power supply level designation signal ZCMPE is set to the H level, peripheral standby VDC 3s has the operation stopped. In the case where external power supply voltage EXVDD is 3.3V, when power cut enable signal PCUTe is activated, peripheral standby VDC 3s has the internal power supply voltage generating operation stopped.

In the case of array standby VDC 4s, power cut enable signal PCUTe is applied to control input CIN. Therefore, only in the deep power down mode, array standby VDC 4s stops the operation of generating array power supply voltage VDDS.

In the case of input standby VDC 5s, an output signal of the OR gate that receives mode setting signal MLV and power cut enable signal PCUTe is applied to control input CIN. Therefore, when LVTTL mode is designated and mode setting signal MLV is at the H level and when power cut enable signal PCUTe is set to the H level in the deep power down mode, input standby VDC 5i stops the operation of generating input power supply voltage VDDI.

As described above, according to the first embodiment of the present invention, standby VDC and active VDC are made selectively active in accordance with the power supply level designation signal, mode setting signal, and power cut enable signal. Accordingly, only necessary circuits are operated according to each operation mode and the external power supply voltage level. Thus, power consumption can be reduced and the internal power supply voltage at the voltage level at a necessary level can be generated stably.

Particularly, in the peripheral power supply circuit, an auxiliary drive transistor dedicated to direct coupling of the peripheral power supply line for transmitting peripheral power supply voltage VDDP to the external power supply node when the external power supply voltage is, for example, 2.5V is provided. Therefore, the peripheral power supply voltage can be set to the external power supply voltage level without decreasing channel resistance of the current drive transistor that operates in response to the output of the comparing circuit. Without exerting an adverse influence on the operation characteristics, when the external power supply voltage is 3.3V, of the peripheral power supply circuit, the peripheral power supply voltage at a desired voltage level can be stably generated.

When the 1.8VIO interface mode is designated, the operation of the circuit for generating the input power supply voltage is stopped and the peripheral power supply line and the input power supply line are interconnected with each other. The internal power supply voltage at a required voltage level can be generated, while reducing the power consumption in the 1.8VIO interface mode.

Second Embodiment

Figure 8:
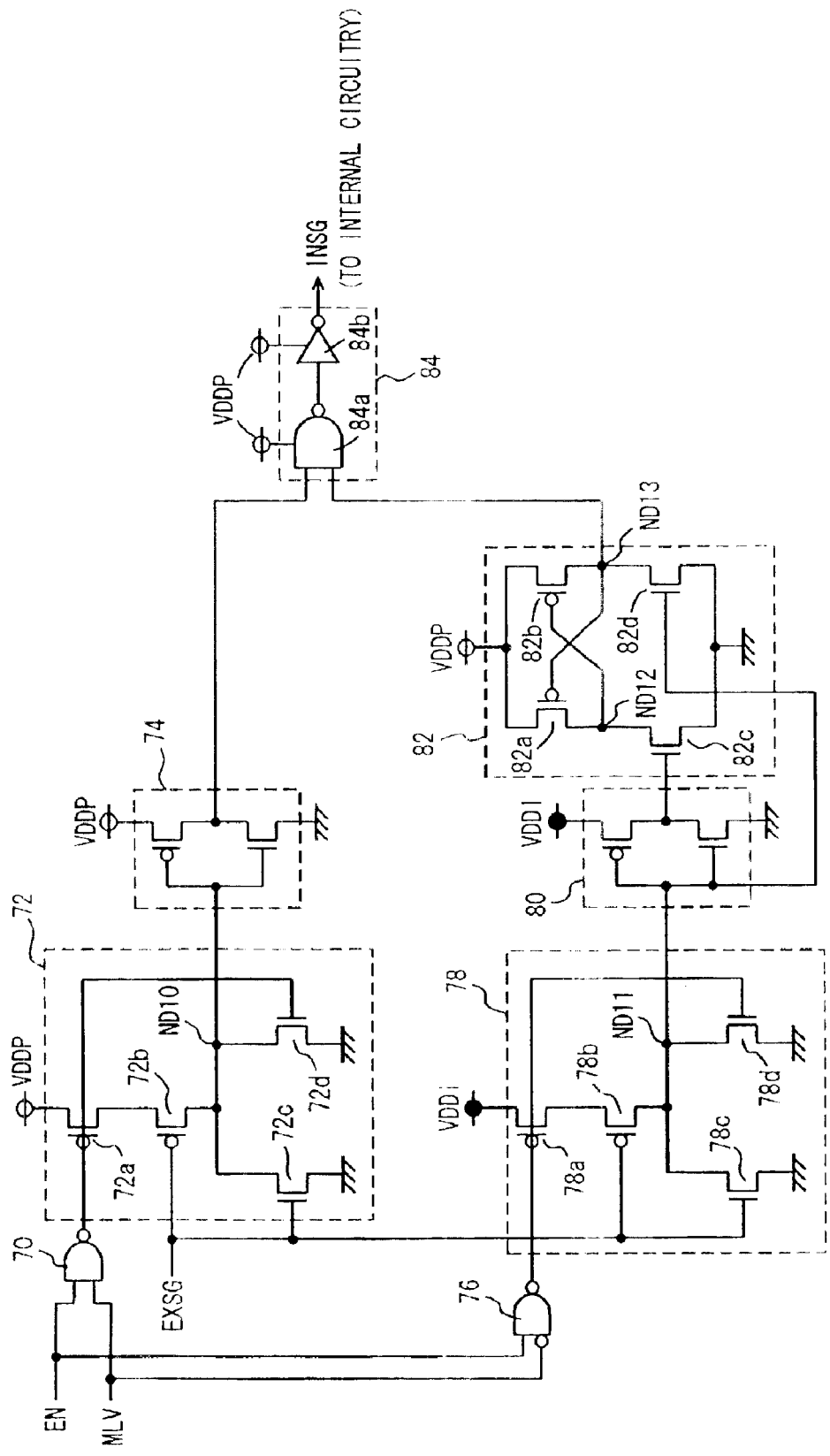
FIG. 8 is a diagram showing the configuration of an input circuit according to a second embodiment of the present invention.

FIG. 8 is a diagram showing an example of the configuration of an input circuit according to a second embodiment of the present invention. In FIG. 8, in a signal input section for generating an internal signal from an external signal, an input buffer circuit 72 receiving peripheral power supply voltage VDDP as an operation power supply voltage and an input buffer circuit 78 receiving input power supply voltage VDDI as an operation power supply voltage are provided for a common external signal EXSG. In order to selectively enable input buffer circuits 72 and 78, gate circuits 70 and 76 receiving input enable signal EN and mode setting signal MLV are provided.

Gate circuit 70 enables input buffer circuit 72 when both of input enable signal EN and mode setting signal MLV are at the H level. Gate circuit 76 enables input buffer circuit 78 when input enable signal EN is at the H level and mode setting signal MLV is at the L level.

Input buffer circuit 72 includes P-channel MOS transistors 72a and 72b connected in series between the peripheral power supply node and an internal node ND10, and N-channel MOS transistors 72c and 72d connected in parallel between internal node ND10 and ground node.

An output signal of gate circuit 70 is applied to the gates of MOS transistors 72a and 72d, and external signal EXSG is applied to the gates of MOS transistors 72b and 72c. Therefore, in input buffer circuit 72, when an output signal of gate circuit 70 is at the H level, internal node ND10 is fixed to the ground voltage level by a MOS transistor 72d. When an output signal of gate circuit 70 is at the L level, MOS transistor 72d is made nonconductive, MOS transistor 72a is made conductive, and an inverted signal of external signal EXSG is output to node ND10.

When an output signal of gate circuit 70 is at the H level, MOS transistor 72a is made nonconductive, MOS transistor 72d is set in a conductive state, and internal node ND10 is fixed at the ground voltage level.

Input buffer circuit 78 includes P-channel MOS transistors 78a and 78b connected in series between the input power supply node and an internal node ND11, and N-channel MOS transistors 78c and 78d connected in parallel between internal node ND11 and the ground node. An output signal of gate circuit 76 is applied to the gates of MOS transistors 78a and 78d, and external signal EXSG is applied to the gates of MOS transistors 78b and 78c.

Gate circuit 76 outputs a signal of the L level when input enable signal EN is at the H level and mode setting signal MLV is at the L level.

Similarly to input buffer circuit 72, in this input buffer circuit 78 as well, when an output signal of gate circuit 76 is at the L level, MOS transistor 78a is rendered conductive, MOS transistor 78d is rendered nonconductive, and an inverted signal of external signal EXSG is generated at node ND11. When an output signal of gate circuit 76 is at the H level, MOS transistor 78a is rendered nonconductive, MOS transistor 78d is rendered conductive, and irrespective of the logic level of external signal EXSG, node ND11 is fixed at the ground voltage level.

The input circuit further includes: a CMOS (complementary MOS) inverter 74 for inverting an output signal of input buffer circuit 72; a CMOS inverter 80 for inverting an output signal of input buffer circuit 78; a level converting circuit 82 for converting an output signal of inverter 80 to a signal of an amplitude of peripheral power supply voltage VDDP level in accordance with an output signal of input buffer 78 and the output signal of inverter 80; and an AND circuit 84 receiving an output signal of CMOS inverter 74 and an output signal of level converting circuit 82 and generating an internal signal INSG.

CMOS inverter 74 receives peripheral power supply voltage VDDP as an operation power supply voltage, and CMOS inverter 80 receives input power supply voltage VDDI as an operation power supply voltage. Level converting circuit 82 receives peripheral power supply voltage VDDP as an operation power supply voltage, and AND circuit 84 receives peripheral power supply voltage VDDP as an operation power supply voltage.

Level converting circuit 82 includes: a P-channel MOS transistor 82a connected between the peripheral power supply node and a node ND12 and having a gate connected to a node ND13; a P-channel MOS transistor 82b connected between the peripheral power supply node and node ND13 and having a gate connected to node ND12; an N-channel MOS transistor 82c connected between node ND12 and the ground node and having a gate connected to receive an output signal of CMOS inverter 80; and an N-channel MOS transistor 82d connected between node ND13 and the ground node and having a gate connected to receive an output signal of input buffer circuit 78.

When an output signal of CMOS inverter 80 is at the H level of input power supply voltage VDDI, level converting circuit 82 outputs a signal of peripheral power supply voltage VDDP level. When an output signal of CMOS inverter 80 is at the L level (ground voltage level), an output signal of input buffer circuit 78 is at the input power supply voltage VDDI level, MOS transistor 82d is made conductive, and an L-level signal is output to output node ND13 of level converting circuit 82. Therefore, level converting circuit 82 converts the L-level output signal of input buffer circuit 78 to a signal of the peripheral power supply voltage level, and converts a received H-level signal to a signal of the ground voltage level.

AND circuit 84 includes a NAND gate 84a receiving an output signal of CMOS inverter 74 and an output signal of level converting circuit 82, and an inverter 84b for inverting an output signal of NAND gate 84a, thereby generating an internal signal INSG.

By AND circuit 84, the output signal of CMOS inverter 74 and the output signal of level converting circuit 82 are merged to generate internal signal INSG corresponding to an output signal of the enabled input buffer.

Input buffer circuits 72 and 78 are enabled alternatively according to mode setting signal MLV, and outputs a signal at the ground voltage level when disabled. CMOS inverter 74 inverts the output signal of input buffer circuit 72, and level converting circuit 82 inverts the output signal of input buffer circuit 78. Therefore, an output signal of the input buffer circuit in the disabled state is inverted and the inverted signal is applied to AND circuit 84. AND circuit 84 generates the internal signal INSG in accordance with an output signal of the enabled input buffer circuit.

Figure 9:
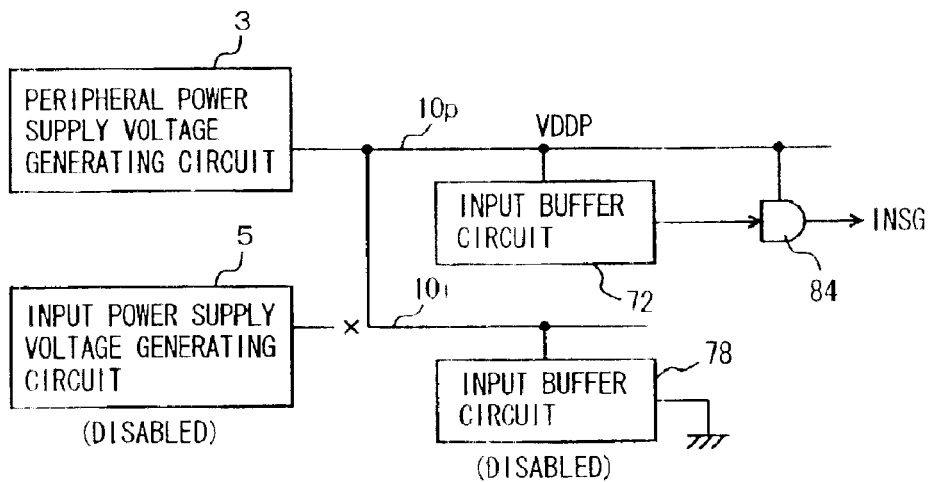
FIG. 9 is a diagram representing a manner of power supply to the input circuit shown in FIG. 8.

FIG. 9 is a diagram schematically showing a state of the input buffer circuit and the internal voltage generating circuit when mode setting signal MLV is at the H level and the LVTTL mode is designated. When mode setting signal MLV is at the H level, the LVTTL mode is designated, the H level VIH of an input signal is 2.0V, and the L level VIL of the input signal is 0.8V. In this case, as shown in FIG. 1, input power supply voltage generating circuit 5 is set in the disabled state, and peripheral power supply line 10p is coupled to input power supply line 10i. Input buffer circuit 72 receives peripheral power supply voltage VDDP as an operation power supply voltage, and internal signal INSG is generated via gate circuit 84 in accordance with an external signal. In this case, input buffer circuit 78 is in the disabled state and its output signal is fixed at the L level.

In input buffer circuit 72, according to the voltage level (2.5V) of peripheral power supply voltage VDDP, a margin is optimized with respect to VIH and VIL. Thus, internal signal INSG can be accurately generated for an input signal of the LVTTL mode. The operation of input power supply voltage generating circuit 5 is stopped, so that current consumption can be reduced.

Figure 10:
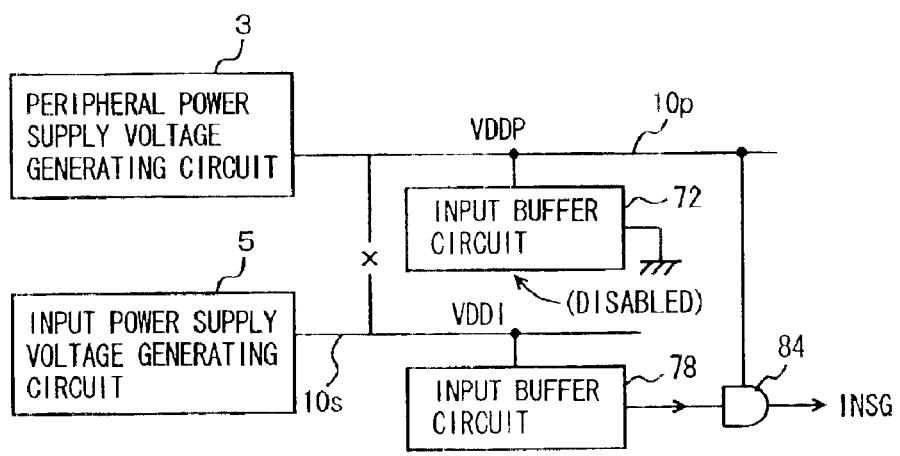
FIG. 10 is a diagram representing a manner of power supply to the input circuit shown in FIG. 8.

FIG. 10 is a diagram schematically showing the state of the input buffer circuit and the internal voltage generating circuit when mode setting signal MLV is at the L level. When mode setting signal MVL is at the L level, the 1.8VIO interface mode is designated. In this mode, each of the H level VIH and the L level VIL of an input signal is lower than those of the LVTTL mode. For example, in the 1.8VI/O mode (1.8VIO interface mode), the H/L level VIH/VIL of an input signal is set to, for example, 0.65VDDQ/0.35VDDQ or 0.8VDDQ/0.2VDDQ. VDDQ denotes a voltage level of an output power supply voltage applied to an output circuit and is equal in voltage level to the external power supply voltage. Peripheral power supply voltage VDDP is usually 2.5V.

Therefore, in the case where input buffer circuit 72 is enabled to operate in the 1.8VI/O mode, the margins for input signal level VIH/VIL are different from each other. Therefore, the logic level of an input signal cannot be determined accurately, and internal signal INSG cannot be generated accurately (in the 1.8VI/O mode, criterion values VIH and VIL of the logic level of an input signal are lower than VIH and VIL in the LVTTL mode, respectively).

Therefore, input power supply voltage VDDI of 1.8V is generated dedicatedly to the 1.8VI/O mode to operate input buffer circuit 78. In this case, the input logic threshold level of input buffer circuit 78 is optimized in accordance with VIH/VIL of the 1.8VI/O mode. According to an output signal of input buffer circuit 78, internal signal INSG is generated via gate circuit 84.

In the 1.8VI/O mode, connection gate 12 shown in FIG. 1 is nonconductive, peripheral power supply line 10p and input power supply line 10s are disconnected from each other, and peripheral power supply voltage generating circuit 3 and input power supply voltage generating circuit 5 generate peripheral power supply voltage VDDP and input power supply voltage VDDI on peripheral power supply line 10p and input power supply line 10s, respectively.

Peripheral power supply voltage generating circuit 3 is set in the disabled or enabled state in accordance with external power supply level designation signal ZCMPE.

As described above, according to the second embodiment of the present invention, the input buffer circuit operating only in the LVTTL mode and the input buffer circuit operating only in the 1.8VI/O mode are separately provided. By selectively operating the input buffer circuits in accordance with a interface designated, the input circuit stably operating in a designated interface mode can be implemented. In the LVTTL mode, by stopping the operation of the input power supply voltage generating circuit, power consumption can be reduced.

In the case of a clock synchronous type semiconductor memory device, input enable signal EN corresponds to clock enable signal CKE for validating an internal clock signal to allow an internal circuit to operate. When it is instructed to generate an input signal in accordance with an external signal in the semiconductor device, input enable signal EN is activated.

Third Embodiment

Figure 11:
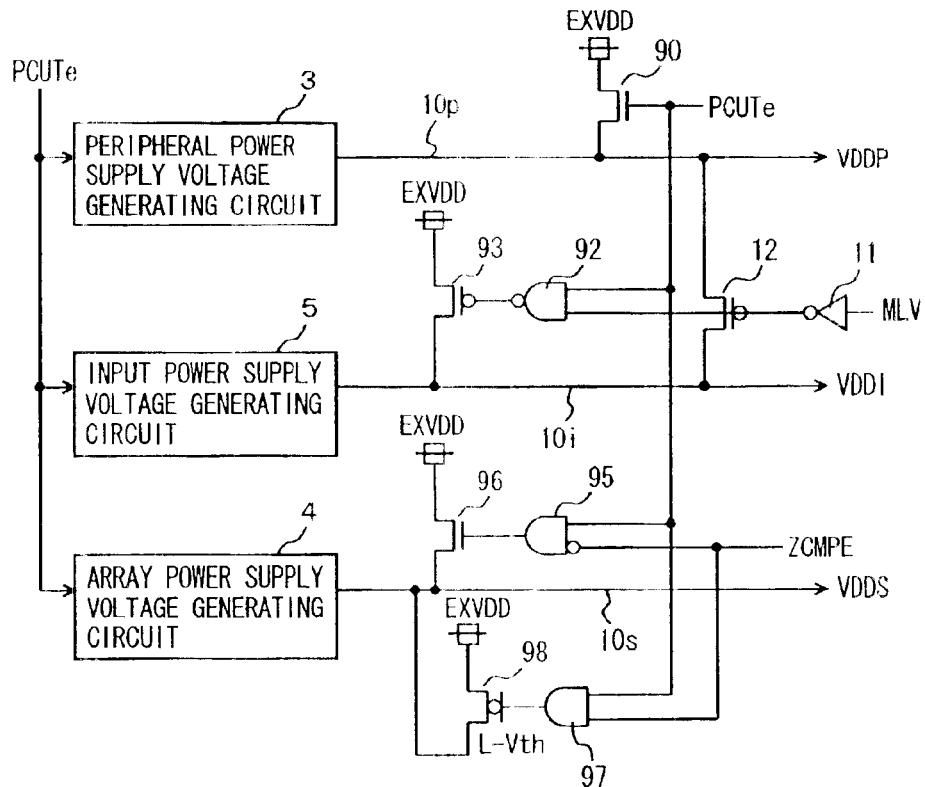
FIG. 11 is a diagram schematically showing the configuration of an internal voltage generating unit according to a third embodiment of the present invention.

FIG. 11 is a diagram schematically showing the configuration of internal voltage generating circuitry according to a third embodiment of the present invention. In FIG. 11, peripheral power supply voltage generating circuit 3 is provided to peripheral power supply line 10p, input power supply voltage generating circuit 5 is provided to input power supply line 10i, and array power supply voltage generating circuit 4 is provided to array power supply line 10s. Power cut enable signal PCUTe is supplied to peripheral power supply voltage generating circuit 3, input power supply voltage generating circuit 5 and array power supply voltage generating circuit 4. In the power down mode, array activating signal ACT is in an inactive state. Therefore, when power cut enable signal PCUTe is set to the H level, each of peripheral power supply voltage generating circuit 3, input power supply voltage generating circuit 5 and array power supply voltage generating circuit 4 stops its internal power supply voltage generating operation (refer to FIG. 1). The configurations of peripheral power supply voltage generating circuit 3, input power supply voltage generating circuit 5 and array power supply voltage generating circuit 4 are the same as that shown in FIGS. 1 to 7.

To peripheral power supply line 10p, an N-channel MOS transistor 90 is provided which is rendered conductive when power cut enable signal PCUTe is activated and couples peripheral power supply line 10p to an external power supply node when made conductive. MOS transistor 90 has a threshold voltage Vthn. In a mode of generating peripheral power supply voltage VDDP by down-converting external power supply voltage EXVDD, when power cut enable signal PCUTe is at the H level, peripheral power supply voltage VDDP on peripheral power supply line 10p attains voltage EXVDD−Vthn.

When external power supply level designation signal ZCMPE is set to the H level to indicate that external power supply voltage EXVDD is, for example, 2.5V, in peripheral power supply voltage generating circuit 3, MOS transistor 31 shown in FIG. 3 is in an ON (conductive) state and peripheral power supply line 10p is coupled to the external power supply node. In this case, therefore, peripheral power supply voltage VDDP is maintained at the external power supply voltage EXVDD level irrespective of an active and an inactive state of power cut enable signal PCUTe.

When external power supply voltage EXVDD is 3.3V, in the deep power down mode in which power cut enable signal PCUTe is activated, peripheral power supply voltage VDDP attains external power supply voltage EXVDD−Vthn.

When power cut enable signal PCUTe is made active due to an influence of noise or the like upon power up, peripheral power supply voltage generating circuit 3 stops the operation of generating peripheral power supply voltage VDDP. In this case, if an operation power supply voltage is not supplied to a peripheral circuit even when a power on detection signal POR is made inactive, power cut enable signal PCUTe cannot be reset, and peripheral power supply voltage VDDP cannot be generated internally. By connecting peripheral power supply line 10p to an external power supply node when power cut enable signal PCUTe is activated, power supply voltage VDDP can be applied to a peripheral circuit related to control of the power down mode. After power up, the peripheral circuit is operated to reset power cut enable signal PCUTe, and power supply voltage generating circuit 3 is activated to generate an internal peripheral power supply voltage.

When power cut enable signal PCUTe is maintained in an inactive state upon power up, after power up, peripheral power supply voltage generating circuit 3 operates and generates peripheral power supply voltage VDDP.

In the deep power down mode, a current path is cut off in circuitry other than circuits related to the deep power down control. On the other hand, by lowering the voltage level of peripheral power supply voltage VDDP applied to the circuits related to control of the deep power down mode below external power supply voltage EXVDD by threshold voltage Vthn of MOS transistor 90, leakage current in those circuit portions is suppressed.

To input power supply line 10i, there are provided an inverter 11 receiving mode setting signal MLV and P-channel MOS transistor 12 which is rendered conductive when an output signal of inverter 11 is at the L level to connect input power supply line 10i and peripheral power supply line 10p to each other. Inverter 11 and MOS transistor 12 are the same as those shown in FIG. 1.

To input power supply line 10i, there are further provided a NAND circuit 92 receiving an output signal of inverter 11 and power cut enable signal PCUTe, and a P-channel MOS transistor 93 which is rendered conductive when an output signal of NAND circuit 92 is at the L level to connect the external power supply node to input power supply line 10i.

When mode setting signal MLV is at the H level, the LVTTL mode is designated. In the LVTTL mode, input power supply voltage VDDI is set at a voltage level the same as the peripheral power supply voltage, and the operation of input power supply voltage generating circuit 5 is stopped. At this time, an output signal of NAND circuit 92 is at the H level, MOS transistor 93 is nonconductive, and the external power supply node for supplying external power supply voltage EXVDD and input power supply line 10i are disconnected from each other.

On the other hand, in the case when the 1.8VI/O mode is set, mode selecting signal MLV is at the L level. In this case, MOS transistor 12 is made nonconductive, so that peripheral power supply line 10p and input power supply line 10i are disconnected from each other. When power cut enable signal PCUTe is set to H level, an output of NAND circuit 92 turns L level, MOS transistor 93 is rendered conductive, the external power supply node and input power supply line 10i are connected, and input power supply voltage VDDI attains the external power supply voltage EXVDD level.

In a case where input power supply voltage VDDI is set to 1.8V, when input power supply voltage VDDI is set to be lower than 1.8V in the deep power down mode and particularly lowered down approximately to the absolute values of the threshold voltage of N-channel and P-channel MOS transistors, there is the possibility that the CMOS circuit operates erroneously. Input circuitry using input power supply voltage VDDI receives external control signals (command) instructing entry and exit of the deep power down mode. Therefore, when an internal signal cannot be generated accurately in accordance with an external signal, there is the possibility that the deep power down mode cannot be accurately released. In the deep power down mode, input power supply voltage VDDI is set to external power supply voltage EXVDD, thereby making the command input circuit operate accurately and releasing the deep power down mode.

Even when power cut enable signal PCUTe is erroneously set in an active state upon power up, input power supply voltage can be generated according to external power supply voltage EXVDD. Therefore, when a peripheral circuit operates and power cut enable signal PCUTe is reset, initialization of the input circuitry can be performed according to input power supply voltage VDDI at high speed.

For array power supply line 10s, there are provided: a gate circuit 95 receiving power cut enable signal PCUTe and external power supply level designation signal ZCMPE; an N-channel MOS transistor 96 which is made conductive, when an output signal of gate circuit 95 is at the H level, to connect external power supply node EXVDD and array power supply line 10s; an AND circuit 97 receiving power cut enable signal PCUTe and external power supply level designation signal ZCMPE; and an N-channel MOS transistor 98 which is rendered conductive, when an output signal of AND circuit 97 is at the L level, to couple an external power supply node and array power supply line 10s.

N-channel MOS transistor 98 is a low Vth transistor having a low threshold voltage.

When the external power supply voltage is 3.3V, external power supply level designation signal ZCMPE is at the L level, an output signal of gate circuit 95 is fixed at the L level, and MOS transistor 96 is made nonconductive. On the other hand, when power cut enable signal PCUTe is set high (H level), gate circuit 95 outputs an L-level signal to make MOS transistor 96 conductive. In this case, array power supply voltage VDDS attains a voltage EXVDD−Vthn(96), where Vthn(96) denotes a threshold voltage of MOS transistor 96.

On the other hand, when external power supply voltage EXVDD is, for example, 2.5V, external power supply level designation signal ZCMPE is set to the H level, an output signal of gate circuit 95 attains the L level, and MOS transistor 96 turns nonconductive. On the other hand, when power cut enable signal PCUTe is set to the H level, the output signal of AND circuit 97 is set to the H level, and MOS transistor 98 is made conductive. In this state, array power supply voltage VDDS attains a voltage EXVDD−Vth(98), where Vthn(98) denotes a threshold voltage of MOS transistor 98.

Since external power supply voltage EXVDD is low, the voltage level of array power supply voltage VDDS is prevented from lowering excessively by using low Vth transistor 98. Therefore, in the case where the current path is cut off in the deep power down mode, until array power supply voltage VDDS returns to the level of a predetermined voltage (Vrefs) upon exit from the deep power down mode, erroneous operation of the circuit using array power supply voltage VDDS can be prevented.

Even if power cut enable signal PCUTe is erroneously activated upon power up, array power supply voltage VDDS can be driven according to external power supply voltage EXVDD. The voltage level of the voltage EXVDD−Vthn (98) is close to the level of external power supply voltage EXVDD. Therefore, upon transition to inactivation of power cut enable signal PCUTe, a circuit using the array power supply voltage can be initialized.

With such configuration, current consumption in the deep power down mode can be reduced, the exit from the deep power down mode can be performed accurately to operate internal circuitry precisely. Even if power cut enable signal PCUTe is activated erroneously upon power up, the internal power supply voltage can be reliably generated on the basis of the external power supply voltage.

NAND circuit 92 and AND circuit 97, gate circuit 95, and inverter 11 each operate using external power supply voltage EXVDD as an operation power supply voltage.

Modification

Figure 12:
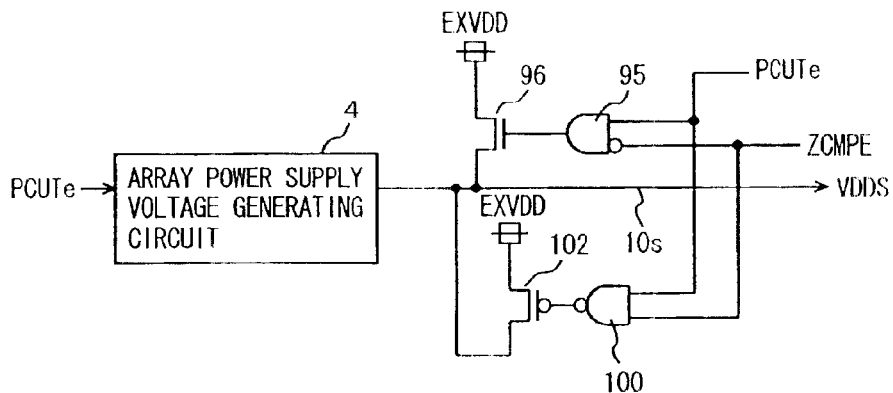
FIG. 12 is a diagram showing a modification of the third embodiment of the present invention.

FIG. 12 is a diagram schematically showing the configuration of a modification of the third embodiment of the present invention. In FIG. 12, to array power supply voltage line 10s, there is provided a NAND circuit 100 receiving power cut enable signal PCUTe and external power supply level designation signal ZCMPE, and a P-channel MOS transistor 102 that is rendered conductive when an output signal of NAND circuit 100 is at the L level, to connect array power supply line 10s to an external power supply node. For array power supply line 10s, similarly to the configuration shown in FIG. 11, gate circuit 95 and N-channel MOS transistor 96 are further provided.

In the configuration shown in FIG. 12, when external power supply voltage EXVDD is, for example, 2.5V, external power supply level designation signal ZCMPE is set to the H level. When power cut enable signal PCUTe is activated, MOS transistor 102 is accordingly rendered conductive, and array power supply voltage VDDS is set to the external power supply voltage EXVDD level. In this case as well, in the deep power down mode, array power supply voltage VDDS is set to a voltage level lower than a voltage level in the case where external power supply voltage EXVDD is 3.3V. Consequently, effects similar to those of the configuration shown in FIG. 11 can be achieved. When the deep power down mode is released or the power cut enable signal is inactivated, a circuit using the array power supply voltage can be operated accurately and stably.

Where external power supply level designation signal ZCMPE is set to the L level, when power cut enable signal PCUTe is activated, MOS transistor 96 is made conductive to transmit voltage EXVDD−Vthn(96) to array power supply line 10s. Therefore, a voltage lower than the external power supply voltage can be supplied to a circuit using the array power supply voltage similarly to the configuration shown in FIG. 11, and the circuits using the array power supply voltage can operate stably.

The configuration provided for peripheral power supply line 10p and input power supply line 10i is the same as that shown in FIG. 11.

As described above, according to the third embodiment of the present invention, in the deep power down mode, the internal power supply voltage is set to the voltage level according to the external power supply voltage level. At the time of exit from the deep power down mode, the internal circuit can be made operate according to the externally applied deep power down mode exit command with accuracy.

Even if power cut enable signal PCUTe is activated erroneously upon power up of the external power supply, when the external power supply voltage reaches a predetermined voltage level, power cut enable signal PCUTe is reset with reliability, and thus the internal power supply voltage can be generated.

Fourth Embodiment

Figure 13:
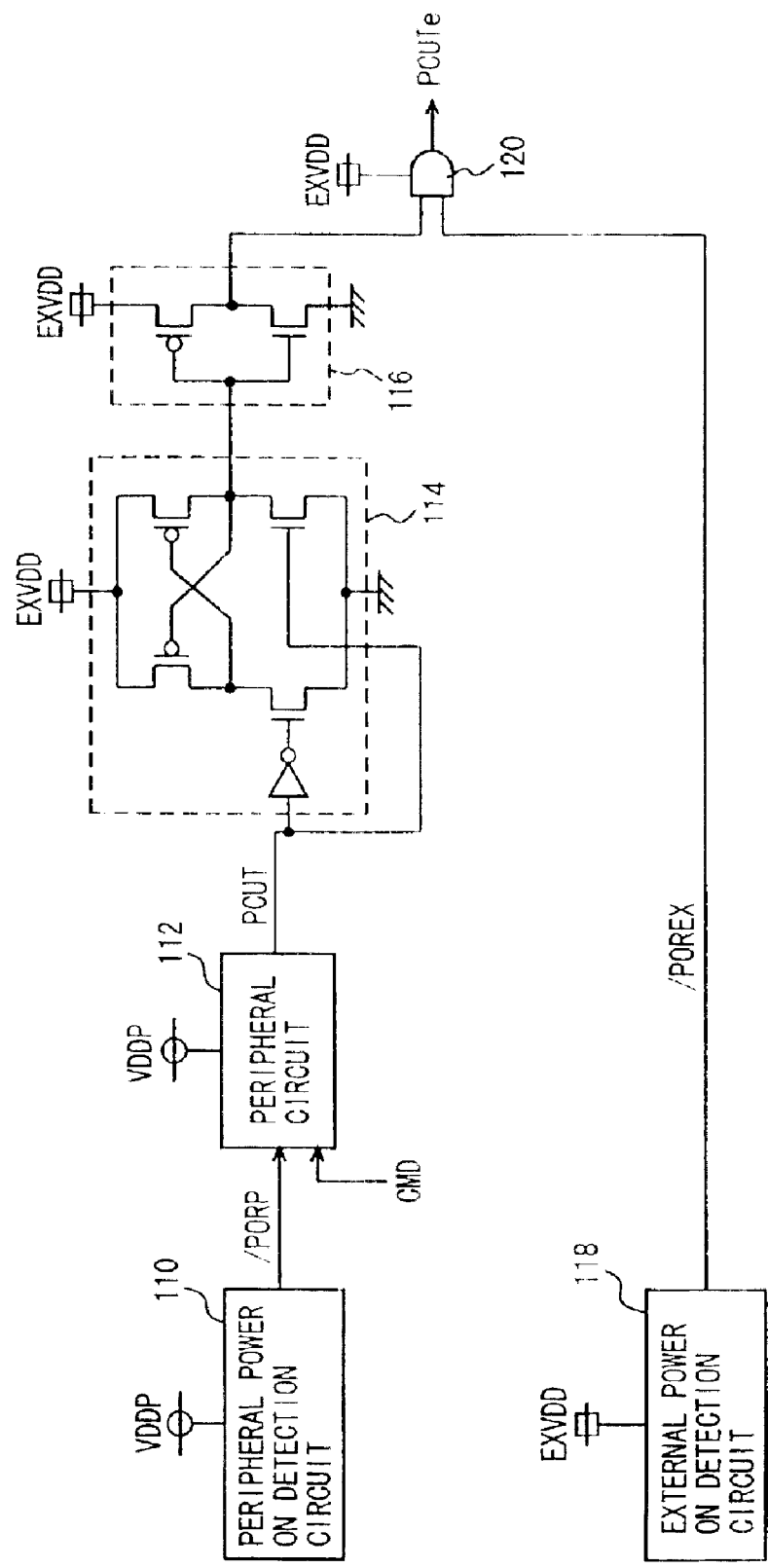
FIG. 13 is a diagram schematically showing the configuration of a power cut enable signal generating unit according to a fourth embodiment of the present invention.

FIG. 13 is a diagram schematically showing the configuration of a power supply control circuitry according to a fourth embodiment of the present invention. In FIG. 13, the power supply control circuitry includes: a peripheral power on detecting circuit 110 for detecting power on of peripheral power supply voltage VDDP; a peripheral circuit 112 having an internal state reset when a peripheral power on detection signal /PORP is activated and generating a power cut signal PCUT in accordance with command CMD externally supplied; a level converting circuit 114 for level converting the power cut signal PCUT from peripheral circuit 112 to a signal having the amplitude of external power supply voltage EXVDD; a CMOS inverter 116 for inverting an output signal of level converting circuit 114; an external power on detecting circuit 118 for detecting power on of external power supply voltage EXVDD; and an AND circuit 120 receiving an external power on detection signal/POREX from external power on detection circuit 118 and an output signal of CMOS inverter 116 and generating power cut enable signal PCUTe.

Peripheral circuit 112 receives peripheral power supply voltage VDDP as an operation power supply voltage. CMOS inverter 116 and AND circuit 120 receive external power supply voltage EXVDD as an operation power supply voltage.

Level converting circuit 114 inverts the logic level of and converts the amplitude of power cut signal PCUT output from peripheral circuit 112.

When peripheral power supply voltage VDDP attains to or above a predetermined voltage level, or is stabilized at a predetermined voltage level, peripheral power on detecting circuit 110 sets peripheral power on detection signal/PORP to the H level.

When external power supply voltage EXVDD reaches a predetermined voltage level or is stabilized at a predetermined voltage level, external power on detecting circuit 118 sets external power on detection signal/POREX to the H level.

Peripheral power supply voltage VDDP is generated from external power supply voltage EXVDD. Therefore, on power up of external power supply voltage EXVDD, peripheral power supply voltage VDDP does not reach a predetermined voltage level yet, so that the logic level of power cut signal PCUT output from peripheral circuit 112 is in an uncertain state. When the voltage level of power cut signal PCUT goes high to some extent in this state and the output signal is driven to the L level by level converting circuit 114, an output signal of CMOS inverter 116 attains H level. In this case, if external power on detection signal/POREX is maintained at the L level, power cut enable signal PCUTe from AND circuit 120 is fixed at the L level. It can be therefore prevented that power cut enable signal PCUTe is activated according to power cut signal PCUT which is in an uncertain state upon power up of the external power supply and the internal voltage generating operation of the internal power supply voltage generating circuit is stopped. Thus, upon power up of the external power supply voltage, internal voltages including the internal power supply voltage can be generated stably.

Figure 14:
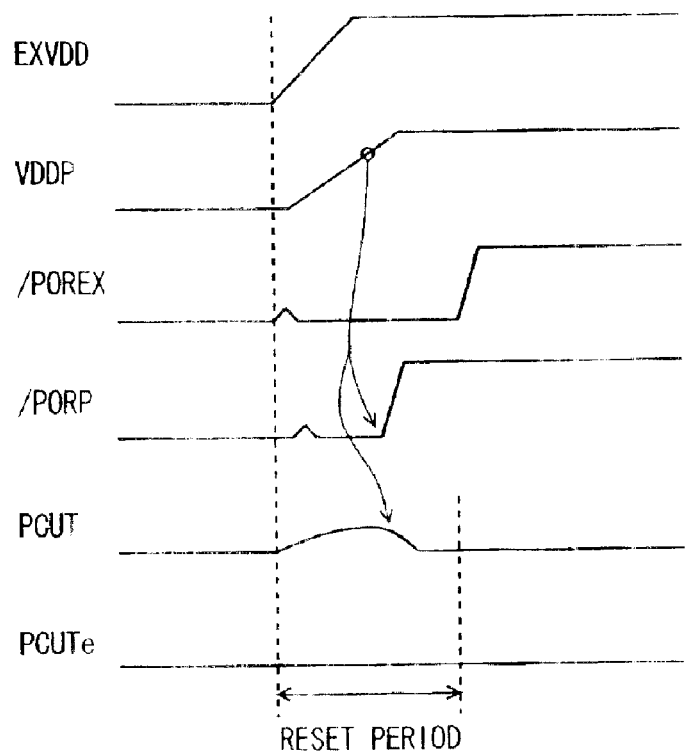
FIG. 14 is a signal waveform diagram representing an operation of the power cut enable signal generating unit shown in FIG. 13.

Specifically, as shown in FIG. 14, upon power up of external power supply voltage EXVDD, external power on detection signal/POREX is at the L level until external power supply voltage EXVDD reaches a predetermined voltage level or is stabilized. During this period, power cut enable signal PCUTe can be set at the L level with reliability.

As shown in FIG. 14, after power on of external power supply voltage EXVDD, the voltage level of peripheral power supply voltage VDDP increases behind external power supply voltage EXVDD (particular, in the 3.3V mode, or when external power supply level designation signal ZCMPE is set to the L level). In this case, peripheral power on detection signal/PORP from peripheral power on detection circuit 110 maintains the L level until peripheral power supply voltage VDDP is stabilized.

While peripheral power supply voltage VDDP is unstable, the logic level of power cut signal PCUT from peripheral circuit 112 is in an uncertain state. Therefore, when the potential level of power cut signal PCUT rises and an output signal of level converting circuit 114 attains the L level, an output signal of CMOS inverter 116 attains the H level. In this case, however, external power on detection signal/POREX is at the L level, power cut enable signal PCUTe from AND circuit 120 maintains the L level, and peripheral power supply voltage VDDP is driven to a predetermined voltage level as external power supply voltage EXVDD rises. When peripheral power supply voltage VDDP reaches a predetermined voltage level, the internal state of peripheral circuit 112 is stabilized, and the state of power cut signal PCUT is made certain and is driven to the ground voltage level (since peripheral power on detection signal/PORP is at the L level, according to peripheral power on detection signal/PORP, the internal state of peripheral circuit 112 is set to the initial state with reliability.

After peripheral power on detection signal/PORP rises to the H level, external power on detection signal/POREX is raised to the H level. Accordingly, AND circuit 120 is allowed to operate as a buffer circuit after power cut signal PCUT is reliably set to the L level, and power cut enable signal PCUTe can be activated according to the deep power down mode instruction externally applied.

External power on detection signal/POREX may be made inactive at an appropriate time in consideration of a time period required for peripheral power supply voltage VDDP to reach a predetermined voltage level since power on of external power supply voltage EXVDD. Specifically, after elapse of predetermined time since external power supply voltage EXVDD is stabilized, external power on detection signal/POREX is driven to the H level. Consequently, by driving external power on detection signal/POREX to the H level after power cut signal PCUT is reset, erroneous activation of power cut enable signal PCUTe upon power up can be prevented.

The configuration of a general power on detection circuit can be used for the configuration of each of external power on detecting circuit 118 and peripheral power on detecting circuit 110. By delaying the timing of raising an output signal to the H level by using, for example, a delay circuit, power on detection signals/PORP and/POREX can be driven to the H level at a desired timing.

As described above, according to the fourth embodiment of the present invention, upon power up of external power supply, the power cut enable signal is maintained in a reset state by using a power on detection signal for an external power supply voltage. After power on, an internal power supply voltage can be generated from the external power supply voltage with reliability, and the internal power supply voltage can be driven to a predetermined voltage level at a faster timing with reliability.

Fifth Embodiment

Figure 15:
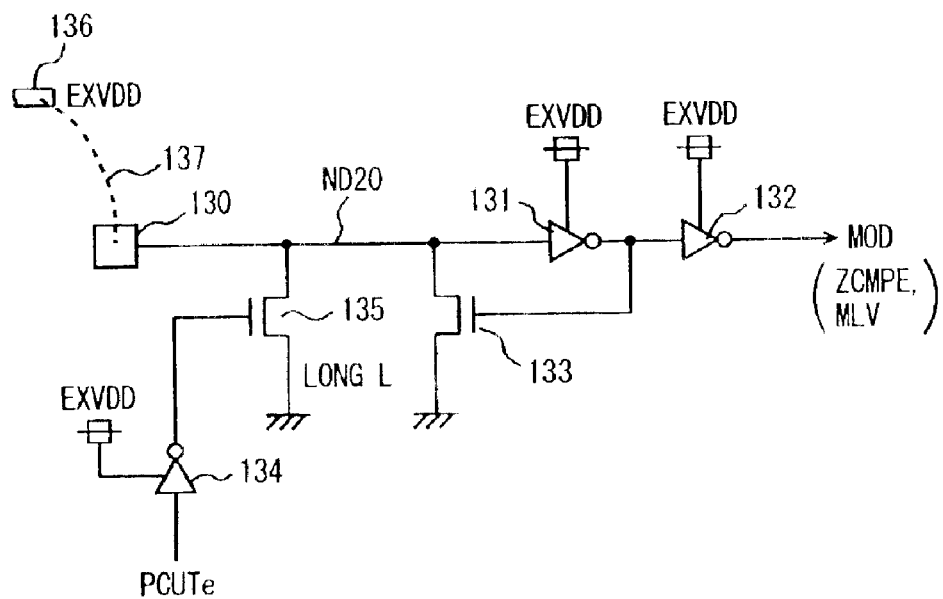
FIG. 15 is a diagram showing the configuration of an internal state setting signal generating unit according to a fifth embodiment of the present invention.

FIG. 15 is a diagram showing an example of the configuration of a mode setting signal generating unit according to a fifth embodiment of the present invention. In FIG. 15, the mode setting signal generating unit includes: an inverter 131 for inverting a signal on a node ND20 connected to a bonding pad 130; an inverter 132 for inverting an output signal of inverter 131, to generate a mode setting signal MOD; an N-channel MOS transistor 133 for connecting node ND20 to the ground node in accordance with an output signal of inverter 131; an inverter 134 receiving power cut enable signal PCUTe; and an N-channel MOS transistor 135 selectively rendered conductive, according to an output signal of inverter 134, to couple node ND20 to the ground node.

Inverters 131, 132, and 134 receive external power supply voltage EXVDD as an operation power supply voltage. MOS transistor 135 has a long channel length, its channel resistance is equivalently made high, and its current driving capability is sufficiently made small.

Mode setting signal MOD is, for example, external power supply level designation signal ZCMPE or mode setting signal MLV. Mode setting signal MOD may be a word configuration designation signal for setting the number of bits of input/output data or a signal for setting an internal operation mode such as a refresh cycle. Any signal may be used, provided that it has a voltage level fixed by setting a voltage to bonding pad 130, for fixedly setting an internal state.

In the configuration of the mode setting signal generating unit shown in FIG. 15, bonding pad 130 is selectively connected to an external power supply terminal 136 via a bonding wire 137. When bonding pad 130 is connected to external power supply terminal 136 via bonding wire 137, the voltage level of node ND20 becomes external power supply voltage EXVDD level, and mode setting signal MOD also becomes a signal of external power supply voltage EXVDD level. In this case, an output signal of inverter 131 is at the L level, and MOS transistor 133 is nonconductive.

In a normal operation mode, power cut enable signal PCUTe is at the L level, and MOS transistor 135 is maintained in a conductive state. Therefore, in this state, a very small current flows from node ND20 to the ground node via MOS transistor 135. To sufficiently reduce an amount of current flowing from node ND20 to the ground node via MOS transistor 135, MOS transistor 135 is made have a sufficiently large channel length to be great in channel resistance sufficiently.

In the deep power down mode, power cut enable signal PCUTe is set to the H level, and MOS transistor 135 is made nonconductive. Therefore, in the deep power down mode, a path through which current flows between node ND20 and the ground node is cut off. A path of current flowing from external power supply terminal 136 to the ground node via bonding wire 137, bonding pad 130, and MOS transistor 135 is cut off. Thus, current consumption in the deep power down mode can be reduced.

When bonding pad 130 is made open, MOS transistor 135 is in an ON (conductive) state in a normal operation mode and node ND20 is fixed at the ground voltage level. In this case, an output signal of inverter 131 is made high (H level), MOS transistor 133 is made conductive, a latch circuit is constructed by inverter 131 and MOS transistor 133, and node ND20 is fixed at the ground voltage level.

In the deep power down mode, when power cut enable signal PCUTe is activated, MOS transistor 135 is made nonconductive. In this state, MOS transistor 133 is conductive according to an output signal of inverter 131, node N20 is maintained at the ground voltage level and accordingly, mode setting signal MOD is maintained at the L level.

Therefore, by setting MOS transistor 135, fixing node ND20 at a predetermined voltage level in the case where node ND20 is set in an open state, into a nonconductive state in the deep power down mode, current consumption can be reduced in the deep power down mode in a mode in which pad 130 is connected to the power supply terminal.

In the case where bonding pad 130 is set at the external power supply voltage EXVDD level, also in the deep power down mode, node ND20 is at the external power supply voltage EXVDD level, and mode setting signal MOD maintains the H level. In a state where bonding pad 130 is in an open state, by MOS transistor 133, node N20 is kept at the ground voltage level, and mode setting signal MOD is maintained at the L level. Therefore, in the deep power down mode, even when MOS transistor 135 for preventing node ND20 from electrically floating is set in the nonconductive state, the logic level of mode setting signal MOD does not change.

In the configuration shown in FIG. 15, the logic level of mode setting signal MOD is set according to connection or no connection of bonding wire 137 to bonding pad 130. However, the logic level of mode setting signal MOD may be set according to whether a fusible link device is blown or not. The voltage level of internal node ND20 is fixedly set, and the MOS transistor for preventing the internal node from electrically floating is cut off in the deep power down mode. Thus, current consumption in the deep power down mode can be reduced.

In the case where bonding pad 130 is wired so as to be connected to the ground terminal, the MOS transistor for preventing electrically floating is connected between the external power supply node and node ND20.

As described above, according to the fifth embodiment of the present invention, in a program circuit for fixedly setting the logic level of an internal state setting signal, the transistor for preventing a pad from electrically floating is set nonconductive in the deep power down mode. Thus, current consumption in the deep power down mode can be reduced.

Sixth Embodiment

Figure 16:
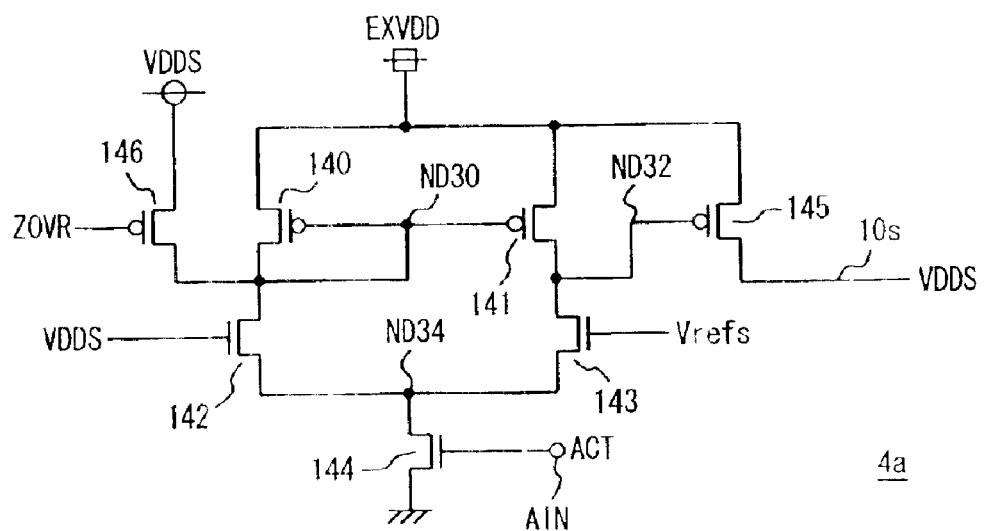
FIG. 16 is a diagram showing the configuration of array active VDC according to a sixth embodiment of the present invention.

FIG. 16 is a diagram showing the configuration of array active VDC 4a according to a sixth embodiment of the present invention. In FIG. 16, array active VDC 4a includes: P-channel MOS transistors 140 and 141 constructing a current mirror circuit; N-channel MOS transistors 142 and 143 constructing a differential stage for comparing array power supply voltage VDDS and array reference voltage Vrefs; an N-channel MOS transistor 144 for activating array active VDC 4a in response to activation of array activating signal ACT applied to control input AIN; and a P-channel current driving MOS transistor 145 for supplying current from the external power supply node via array power supply line 10s in accordance with an output signal of node ND32.

MOS transistors 140 and 141 have their gates connected to node ND30, and MOS transistor 140 serves as a master stage of the current mirror circuit. MOS transistors 142 and 143 have their respective gates receiving array power supply voltage VDDS and array reference voltage Vrefs.

Array active VDC 4a further includes a P-channel MOS transistor 146 which is made conductive when an overdrive signal ZOVR is activated and supplies array power supply voltage VDDS to node ND30 when made conductive. Overdrive signal ZOVR is kept activate for a predetermined period (such as 10 ns.) when the sense amplifier operates.

Figure 17:
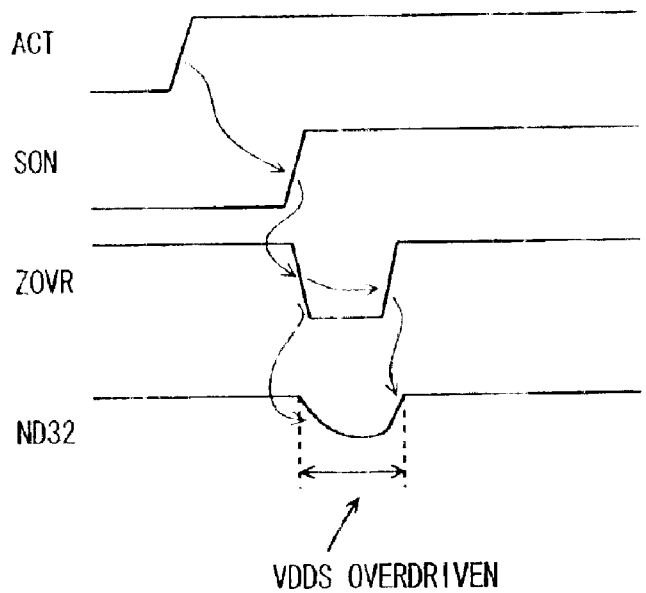
FIG. 17 is a signal waveform chart showing the operation of array active VDC shown in FIG. 16.

FIG. 17 is a signal waveform diagram representing an operation of array active VDC 4a shown in FIG. 16. Referring to FIG. 17, the operation of array active VDC 4a shown in FIG. 16 will now be described.

When a memory cell selecting operation is instructed, array activating signal ACT is activated. When array activating signal ACT is activated, array active VDC 4a is activated to compare array power supply voltage VDDS on array power supply line 10s with array reference voltage Vrefs and supplies current from the external power supply node to array power supply line 10s in accordance with the comparison result.

In the comparing operation, when array reference voltage Vrefs is higher than array power supply voltage VDDS, MOS transistor 143 is made greater in conductance than MOS transistor 142, to discharge current supplied from MOS transistor 141. Accordingly, the voltage level of node ND32 lowers, driving current of current driving transistor 145 increases, and the voltage level of array power supply voltage VDDS increases.

On the contrary, when array power supply voltage VDDS is higher than array reference voltage Vrefs, MOS transistor 142 is made greater in conductance than MOS transistor 143, to have the driving current increased and accordingly, supplying current by MOS transistor 140 increases. MOS transistor 143 cannot discharge all the current supplied from MOS transistor 141, and the voltage level at node ND32 increases. Current driving transistor 145 reduces the driving current, or stops current supply.

After elapse of a predetermined period since array activating signal ACT is activated, a sense trigger signal SON is activated, and operation of sensing selected memory cell data is started. In response to activation of sense trigger signal S0N, overdrive signal ZOVR is activated for a predetermined period. When overdrive signal ZOVR is activated, overdriving MOS transistor 146 turns conductive and node ND30 is fixed at the array power supply voltage VDDS level for a predetermined period. By fixing node ND30 at the array power supply voltage VDDS level, in a comparing circuit of array active VDC 4a, a state where array power supply voltage VDDS drops equivalently is forcedly set. The supplying current of MOS transistor 141 is reduced, the voltage level of node ND32 is lowered, and a current supplying amount of current driving transistor 145 is increased.

When the sense amplifier operates in response to activation of sense trigger signal S0N, array power supply voltage VDDS on array power supply line 10s is consumed, to possibly cause dropping of the voltage level thereof, and therefore, the current driving capability of current driving transistor 145 is set large. Consequently, drop in array power supply voltage VDDS can be suppressed, and sensing operation can be performed stably.

Array power supply voltage VDDS is, for example, 1.6V. When external power supply voltage EXVDD is 2.5V, a gate to source voltage of MOS transistor 141 is −0.9V, and the current supplying amount of MOS transistor 141 can be sufficiently reduced. Therefore, the voltage level of node ND32 can be sufficiently dropped through the discharging operation of MOS transistor 143.

On the other hand, when external power supply voltage EXVDD is 3.3V, the gate-source voltage of MOS transistor 141 is −1.7V. MOS transistor 141 supplies a larger current as compared with that in the case where external power supply voltage EXVDD is 2.5V, to suppress the voltage level of node ND32 from excessively dropping. Consequently, when external power supply voltage EXVDD is as high as 3.3V, excessive current supply to array power supply line 10s is prevented, so that the array power supply voltage VDDS level can be suppressed from going excessively higher than a predetermined voltage level.

Figure 18:
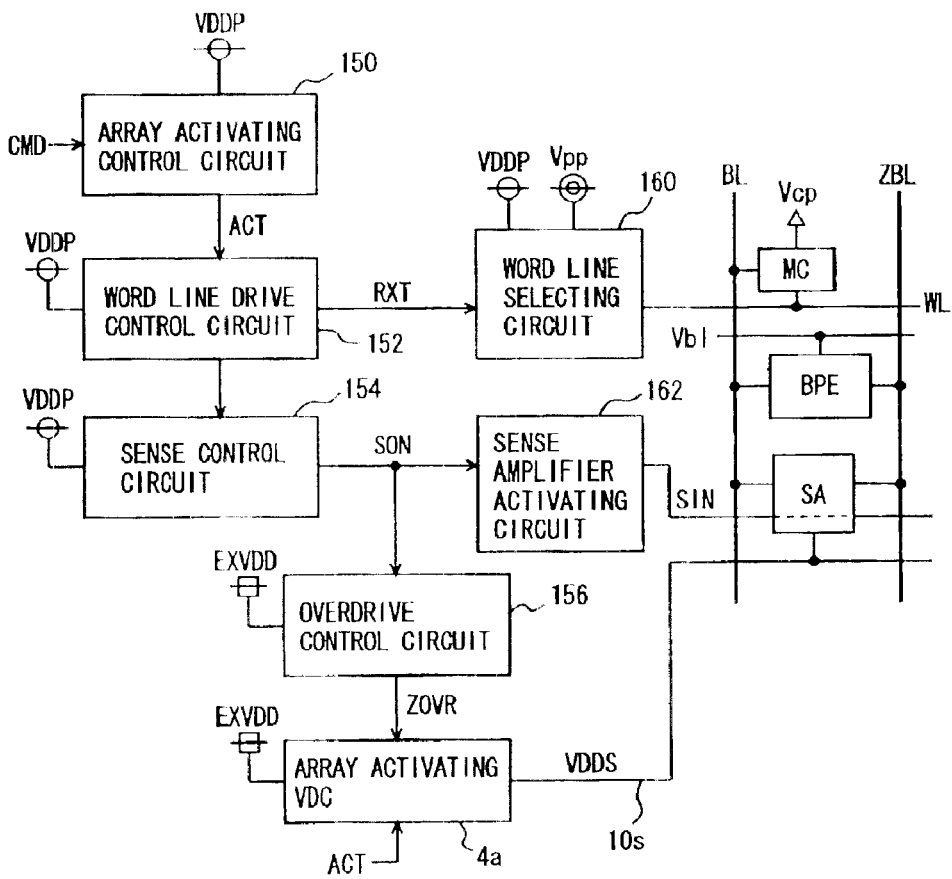
FIG. 18 is a diagram schematically showing the configuration of a main portion of a semiconductor memory device including array active VDC according to the sixth embodiment of the present invention.

FIG. 18 is a diagram schematically showing the configuration of row related circuitry of a semiconductor memory device according to the sixth embodiment of the present invention.

In FIG. 18, the row related control circuit includes: an array activating control circuit 150 that receives an externally supplied command CMD and activates array activating signal ACT when command CMD instructs selection of a row; a word line driving control circuit 152 that generates a word line driving timing signal RXT at a predetermined timing in response to activation of array activating signal ACT; and a sense control circuit 154 that activates sense trigger signal S0N after elapse of a predetermined period in response to an output signal of word line driving control circuit 152. Control circuits 150, 152, and 154 receive peripheral power supply voltage VDDP as an operation power supply voltage.

Where the semiconductor device is a synchronous type memory operating synchronously with a clock signal, array activating control circuit 150 takes in a plurality of external control signals synchronously with, for example, the rising edge of the clock signal, and generates an internal operation control signal in accordance with a combination of the logic levels of the control signals. When array activating signal ACT is activated, after elapse of predetermined times, word line driving control circuit 152 and sense control circuit 154 activate word line driving timing signal RXT and sense trigger signal S0N, respectively. When array activating signal ACT is made inactive by application of, for example, a precharge command, word line driving timing signal RXT is made inactive and subsequently, sense trigger signal S0N is made inactive.

Row related peripheral circuitry includes: a word line selecting circuit 160 for driving an addressed word line WL to a selected state in accordance with word line driving timing signal RXT; and a sense amplifier activating circuit 162 for generating a sense amplifier activating signal S1N to sense amplifier SA in accordance with sense trigger signal S0N. Peripheral power supply voltage VDDP and a high voltage Vpp are applied to word line selecting circuit 160, and selected word line WL is driven to the high voltage Vpp level.

Sense amplifier SA includes a P sense amplifier constructed by cross-coupled P-channel MOS transistors, and an N sense amplifier constructed by cross-coupled N-channel MOS transistors. In sense amplifier SA, according to activation of sense amplifier activating signal S1N, N sense amplifier is coupled to the ground line, and a bit line of a lower potential is discharge to the ground voltage level.

Sense amplifier activating circuit 162 also generates a P sense amplifier activating signal SPE for activating the P sense amplifier in accordance with sense trigger signal S0N, for application to sense amplifier SA. The P sense amplifier is connected to array power supply line 10s in accordance with P sense amplifier activating signal SPE to drive a higher-potential bit line in bit lines BL and ZBL to array power supply voltage VDDS level. Therefore, in the operation of sense amplifier SA, bit lines BL and ZBL are charged and discharged. At the time of charging the bit line, array power supply voltage VDDS is consumed.

Sense amplifier SA is disposed corresponding to each memory cell column (bit line pair). In the sensing operation, a large number of sense amplifiers SA perform charging and discharging operations concurrently. In order to compensate for bit line charging and discharging current in the sensing operation, as shown in FIG. 16, the current driving capability of array active VDC 4a is increased by using MOS transistor 146 for overdriving, thereby suppressing drop of array power supply voltage VDDS.

For array active VDC 4a, an overdrive control circuit 156 for generating an overdrive signal ZOVR of one shot in response to activation of sense trigger signal S0N is provided. Overdrive control circuit 156 receives external power supply voltage EXVDD as an operation power supply voltage.

Usually, a memory cell array is divided into a plurality of row blocks, and a sensing operation is executed on a row block including a selected memory cell. According to sense trigger signal S0N, sense amplifiers provided for a selected row block are activated according to sense amplifier activating signal S1N.

In the standby state, bit lines BL and ZBL are precharged and equalized to a predetermined bit line precharge voltage Vbl level by a bit line precharge/equalize circuit BPE.

Figure 19:
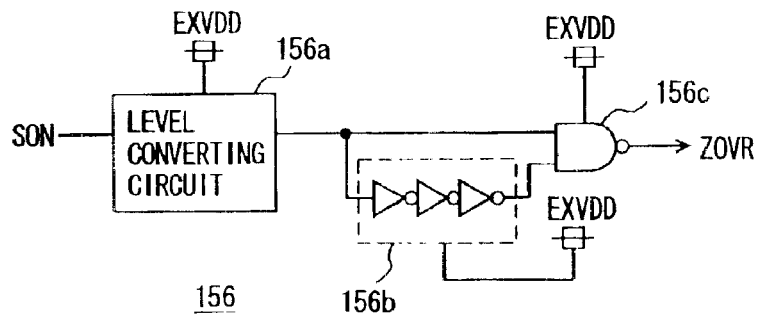
FIG. 19 is a diagram showing an example of the configuration of an overdrive control circuit shown in FIG. 18.

FIG. 19 is a diagram showing an example of the configuration of overdrive control circuit 156 shown in FIG. 18. In FIG. 19, overdrive control circuit 156 includes: a level converting circuit 156a for converting the amplitude of sense trigger signal S0N to the external power supply voltage EXVDD level; an inversion/delay circuit 156b for inverting and delaying by a predetermined time an output signal of level converting circuit 156a; and an NAND circuit 156c receiving an output signal of inversion/delay circuit 156b and an output signal of level converting circuit 156a and generating overdrive signal ZOVR. To inversion/delay circuit 156b and NAND circuit 156c, external power supply voltage EXVDD is supplied as an operation power supply voltage.

Level converting circuit 156a performs only converting of the amplitude of sense trigger signal S0N and does not convert the logic level. Therefore, when sense trigger signal S0N is activated and its voltage level rises, an output signal of level converting circuit 156a also rises. Inversion/delay circuit 156b is constructed by cascaded inverters of an odd-number of stages, and drives its output signal to the L level in accordance with an output signal of level converting circuit 156a after elapse of predetermined time. Therefore, for the delay time of inversion/delay circuit 156b, both inputs of NAND circuit 156c are at the H level, and overdrive signal ZOVR is driven to the L level.

When the voltage level of external power supply voltage EXVDD rises, delay time of inversion/delay circuit 156b is shortened, and gate delay of NAND circuit 156c is also shortened. Therefore, in the case where external power supply voltage EXVDD is heightened, the activation period of overdrive signal ZOVR is shortened, the sense overdrive period can be shortened, the period of setting the current driving capability to be high in array active VDC 4a can be shortened, array power supply voltage VDDS can be suppressed from being excessively overdriven, and current consumption can be therefore reduced.

Figure 20:
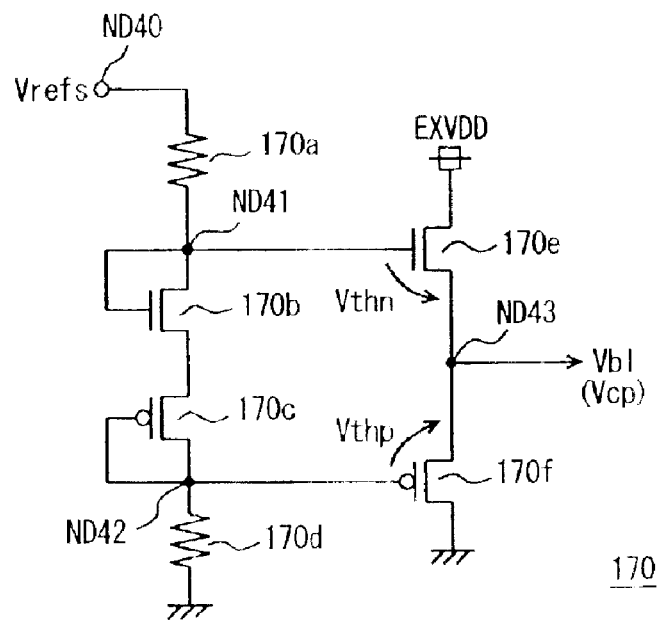
FIG. 20 is a diagram showing the configuration of an intermediate voltage generating unit according to the sixth embodiment of the present invention.

FIG. 20 is a diagram showing an example of the configuration of an intermediate voltage circuit for generating intermediate voltages Vbl and Vcp in the sixth embodiment of the present invention. In FIG. 20, an intermediate voltage generating circuit 170 includes a voltage dividing circuit for dividing array reference voltage Vrefs, and an output circuit for generating intermediate voltage Vb1 or Vcp in accordance with an output signal of the voltage dividing circuit.

The voltage dividing circuit includes a resistive element 170a connected between a reference voltage input node ND40 and an internal node ND41, MOS transistors 170b and 170c connected in series between nodes ND41 and ND42, and a resistive element 170d connected between node ND42 and the ground node.

MOS transistor 170b is an N-channel MOS transistor, having gate and drain connected together to node ND41, and operates in a diode mode. MOS transistor 170c is a P-channel MOS transistor, having gate and drain connected together to node ND42, and operates in a diode mode.

Each of resistive elements 170a and 170d has a sufficiently large resistance value and flows a very small current. Therefore, MOS transistors 170b and 170c operate in the diode mode, the voltage level of node ND41 attains to Vrefs/2+Vthn, and the voltage level of node ND42 attains to Vrefs/2−Vthp, where Vthn denotes a threshold voltage of MOS transistor 170b, and Vthp denotes an absolute value of a threshold voltage of MOS transistor 170c.

The output circuit includes: an N-channel MOS transistor 170e connected between the external power supply node and an output node ND43 and having a gate connected to node ND41; and a P-channel MOS transistor 170f connected between node ND43 and the ground node and having a gate connected to node ND42.

Since the voltage level of node ND41 is lower than external power supply voltage EXVDD, MOS transistor 170e operates in a source follower mode, and node ND43 is clamped to a voltage level lower than the voltage of node ND41 by threshold voltage Vthn. MOS transistor 170f operates in the source follower mode since the source voltage thereof is at the ground voltage level and lower than the gate voltage thereof, and node ND43 is clamped to the voltage level higher than the voltage of node ND42 by the voltage Vthp.

When intermediate voltage Vb1 (or Vcp) from node ND43 lowers below voltage Vrefs/2, MOS transistor 170e turns conductive and supplies current to node ND43. At this time, MOS transistor 170f is nonconductive. When intermediate voltage Vb1 (or Vcp) is heightened above voltage Vrefs/2, MOS transistor 170e is in an OFF (nonconductive) state, and MOS transistor 170f is conductive to discharge a current flow from node ND43 to the ground node. Therefore, intermediate voltage Vb1 (or Vcp) is maintained at a voltage level of Vrefs/2. The threshold voltages of MOS transistors 170b and 170e are equal in magnitude to each other, and threshold voltages of MOS transistors 170c and 170f are equal in magnitude to each other.

By using reference voltage Vrefs to generate intermediate voltage Vb1 (or Vcp), even when array power supply voltage VDDS is overdriven, without being influenced by the overdriving, intermediate voltages Vb1 and Vcp are maintained at the voltage level of Vrefs/2. Therefore, in the sensing operation, the voltage level of the reference bit line can be accurately maintained at the voltage level of intermediate voltage Vrefs/2.

Array power supply voltage VDDS is at the voltage level of reference voltage Vrefs except for the overdrive period, H-level data stored in a memory cell attains the voltage Vrefs level by a restoring operation of the sense amplifier. Therefore, in the standby state, a bit line precharge voltage level can be accurately maintained at the intermediate voltage level of data stored in a memory cell. Thus, even by using the sense overdriving scheme, bit line precharge voltage Vb1 and cell plate voltage Vcp at the intermediate voltage level can be generated accurately.

An amount of electric charges stored in a memory cell capacitor also changes according to the cell plate voltage ($Q=C\cdot(Vcp-V(data))$).

Therefore, by generating cell plate voltage Vcp in accordance with array reference voltage Vrefs, without being influenced by the sense overdriving, the absolute value of the stored electric charge amount with respect to H-level data and that with respect to L-level data can be equalized. The absolute value of a read voltage appearing on a bit line when a memory cell is selected can be equalized with respect to H level data and L-level data. Thus, the sensing operation can be carried out stably.

As described above, according to the sixth embodiment of the present invention, the array power supply voltage is overdriven at the time of the sensing operation. At the time of sensing operation, the array power supply voltage can be stably supplied to the sense amplifier without being consumed.

Moreover, the bit line precharge voltage and cell plate voltage are generated on the basis of the array reference voltage that determines the voltage level of the array power supply voltage. Even when the array power supply voltage is overdriven to heighten in voltage level in accordance with the sense overdriving scheme, the bit line precharge voltage and cell plate voltage each can stably maintain its voltage level, the bit line can be precharged accurately, a read voltage of the same magnitude with respect to H-level and L-level data can be generated on a bit line, and the sensing operation can be performed with accuracy.

Seventh Embodiment

Figure 21:
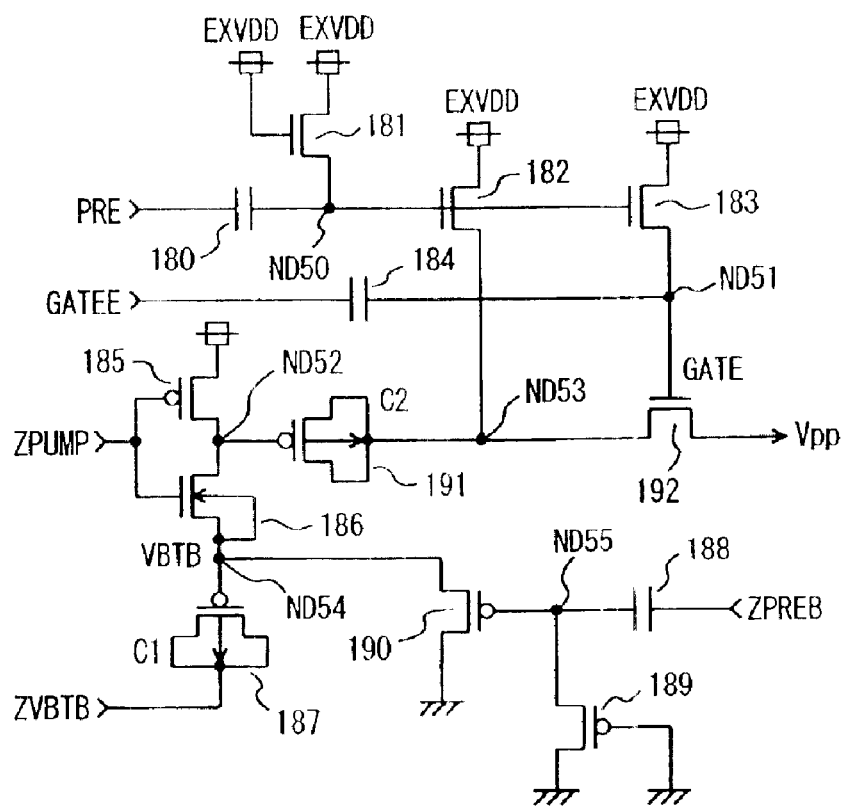
FIG. 21 is a diagram showing the configuration of a high voltage generating unit according to a seventh embodiment of the present invention.

FIG. 21 is a diagram showing the configuration of a high voltage generating circuit according to a seventh embodiment of the present invention. High voltage Vpp is transmitted to a selected word line as shown in FIG. 18.

In FIG. 21, the high voltage generating circuit includes: a capacitive element 180 for supplying electric charges to a node ND50 in accordance with a precharge control signal PRE; an N-channel MOS transistor 181 for clamping the voltage level of node ND50 to the level of a voltage EXVDD−Vthn which is lower than the external power supply voltage by the threshold voltage; an N-channel MOS transistor 182 which is selectively rendered conductive according to the voltage level of node ND50 and transmits external power supply voltage EXVDD to a node ND53 when made conductive; an N-channel MOS transistor 183 which is selectively rendered conductive according to the voltage level of node ND50 and transmits external power supply voltage EXVDD to node ND51 when made conductive; and a capacitive element 184 for supplying electric charges to node ND51 in accordance with an output gate control signal GATEE.

Precharge control signal PRE is a signal having an amplitude of the external power supply voltage EXVDD level, and output gate control signal GATEE has an amplitude Vg of high voltage Vpp or a doubled array power supply voltage 2·VDDS. Therefore, a voltage GATE on node ND51 changes between a voltage Vg+EXVDD and external power supply voltage EXVDD. The lower limit level of voltage of node ND50 is clamped by MOS transistor 181 at EXVDD−Vthn, and each of MOS transistors 182 and 183 transmits external power supply voltage EXVDD when conductive.

The high voltage generating circuit further includes: a P-channel MOS transistor 185 which is rendered conductive, when a pump control signal ZPUMP is at the L level, to transmit external power supply voltage EXVDD to node ND52; an N-channel MOS transistor 186 which is rendered conductive, when pump control signal ZPUMP is at the H level, to transmit a voltage VBTB of node ND54 to node ND52; a capacitive element 187 for discharging node ND54 in accordance with a negative boost control signal ZVBTB; a capacitive element 188 for discharging node ND55 in accordance with a negative boost precharge control signal ZPREB; a P-channel MOS transistor 189 for clamping the upper limit voltage on node ND55 to the voltage Vthp level; and a P-channel MOS transistor 190 for precharging node N54 to the ground voltage level in accordance with the voltage on node ND55.

Pump control signal ZPUMP is a signal having an amplitude of external power supply voltage EXVDD level. Negative boost control signal ZVBTB is a signal having an amplitude of external power supply voltage EXVDD level. Negative boost precharge control signal ZPREB is a signal having an amplitude of external power supply voltage EXVDD level.

Capacitive element 187 is constructed by a P-channel MOS transistor having a back gate, a source, and a drain interconnected together to receive negative boost control signal ZVBTB, and a gate connected to node ND54. Since node ND54 is driven to a negative voltage level as will be described later, by connecting node ND54 to the gate electrode of capacitive element 187, electric charges are prevented from flowing into a substrate region of the MOS transistor constructing capacitive element 187.

The high voltage generating circuit further includes: a capacitive element 191 for charging/discharging node ND53 in accordance with the voltage level of node ND52; and an N-channel MOS transistor 192 which is selectively rendered conductive according to voltage GATE on node ND51 and supplies electric charges from node ND53 to the output node, when conductive to generate high voltage Vpp.

Capacitive element 191 is constructed by a P-channel MOS transistor having a gate connected to node ND52, and a back gate, a source, and a drain connected together to node ND53. In capacitive element 191 as well, node ND52 is driven to a negative voltage, so that the gate of capacitive element 191 is connected to node ND52, and the back gate, source, and drain are connected to node ND53. By receiving a negative voltage at the gate electrode, electric charges are prevented from flowing into the substrate region.

Figure 22:
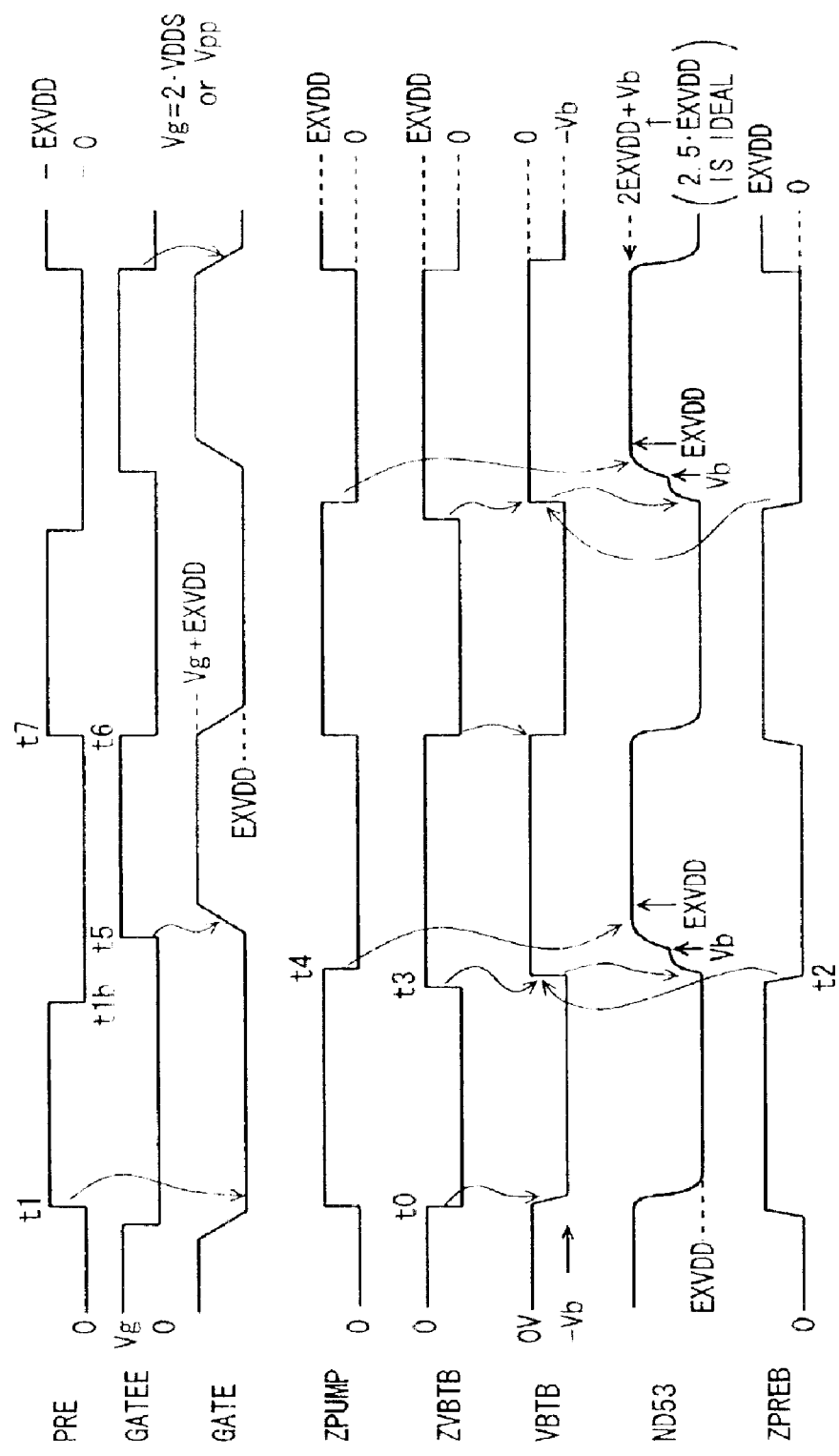
FIG. 22 is a signal waveform diagram representing an operation of the high voltage generating circuit shown in FIG. 21.

FIG. 22 is a signal waveform diagram representing an operation of the high voltage generating circuit shown in FIG. 21. Referring to FIG. 22, the operation of the high voltage generating circuit shown in FIG. 21 will now be described.

Before time t0, negative boost control signal ZVBTB is at the H level, and negative boost precharge control signal ZPREB is at the ground voltage level. In this state, node ND55 is at the Vthp-EXVDD level, MOS transistor 190 is conductive, and node ND54 is precharged to the ground voltage level. When negative boost precharge control signal ZPREB rises to the H level and the voltage level of node ND55 rises to the threshold voltage Vthp of MOS transistor 189, MOS transistor 190 enters a nonconductive state, and the precharging operation on node ND54 is completed.

When negative boost control signal ZVBTB is driven to the ground voltage level at time t0, through capacitive coupling of capacitive element 187, a voltage VBTB of node ND54 drops to the negative voltage-Vb level. When the voltage level of node ND54 drops, even the control signal ZPUMP is at the ground voltage level, MOS transistor 186 is conductive, so that the voltage level attainable by voltage VBTB of node ND54 is given by capacitive division of capacitance values C1 and C2 of capacitive elements 187 and 191. That is, voltage Vb is expressed by the following equation.

$$Vb = C1 \cdot EXVDD/(C1+C2) - Lls,$$

where Lls denotes a coupling loss. When capacitance values C1 and C2 are equal to each other and there is no coupling loss, voltage VBTB of node ND50 reaches the voltage level of -EXVDD/2.

Subsequently, at time t1, precharge control signal PRE rises to the external power supply voltage EXVDD level, and the voltage level of node ND50 increases to the voltage level of 2·EXVDD-Vthn by capacitive coupling of capacitive element 180 (on assumption that there is no coupling loss). As the voltage level of node ND50 rises, MOS transistors 182 and 183 turn conductive, the voltage level of node ND53 attains the external power supply voltage EXVDD, and the voltage level of voltage GATE of node ND51 is precharged to the external power supply voltage EXVDD level.

When precharge control signal PRE is fallen to the ground voltage level at time t1b, the voltage level of node ND50 drops. By clamping operation of MOS transistor 181, the voltage level of node ND50 attains the EXVDD-Vthn level, and MOS transistors 182 and 183 enter a nonconductive state.

Negative boost precharge control signal ZPREB is fallen to the ground voltage level at time t2, and negative boost control signal ZVBTB is increased to the external power supply voltage EXVDD at time t3 substantially the same time as time t2. Through capacitive coupling of capacitive element 188, MOS transistor 190 turns conductive, and voltage VBTB on node ND54 is precharged to the ground voltage level. In this state, pump control signal ZPUMP is driven to external power supply voltage EXVDD level at time t0, and MOS transistor 186 is in a conductive state. Therefore, when the voltage VBTB of node ND54 rises to the ground voltage level, the voltage level of node ND52 accordingly rises and through capacitive coupling of capacitive element 191, the voltage level of node ND53 rises to the voltage EXVDD+Vb level.

When pump control signal ZPUMP is fallen from external power supply voltage EXVDD to the ground voltage level at time t4, MOS transistor 185 turns conductive, while MOS transistor 186 turns nonconductive, and the voltage level of node ND52 rises from the ground voltage level to the external power supply voltage EXVDD level. Therefore, through capacitive coupling of capacitive element 191, the voltage level of node ND53 further rises by EXVDD, and attains to the voltage level of 2·EXVDD+Vb.

When output gate control signal GATEE rises to the high voltage Vg level at time t5, voltage GATE of node ND51 rises from the external power supply voltage EXVDD level to the voltage Vg+EXVDD level through capacitive coupling of capacitive element 184. Voltage Vg is at a voltage level close to 2·VDDS or high voltage Vpp, MOS transistor 192 turns conductive, electric charges stored in node ND53 are transmitted to the output node, and the voltage level of high voltage Vpp rises.

When output gate control signal GATEE falls to the ground voltage level at time t6, the voltage level of node ND51 lowers due to capacitive coupling of capacitive element 184. At time t7 immediately after time t6, precharge control signal PRE rises again to the external power supply voltage EXVDD level, and nodes ND51 and ND53 are precharged to the external power supply voltage EXVDD level.

On the other hand, at time t2, voltage VBTB of node ND50 is precharged to the ground voltage level so as to prepare for the following boosting operation. Subsequently, by repeating the operations from time t0 et seq., the voltage level of high voltage Vpp rises. The highest reachable voltage level of high voltage Vpp varies according to external power supply voltage EXVDD, array power supply voltage VDDS, and the threshold voltage of MOS transistor 192. When the highest voltage level of the voltage GATE is higher than 2•EXVDD+Vb+Vthn, high voltage Vpp can reach the highest voltage level of 2•EXVDD+Vb.

As shown in FIG. 21, by boosting the lowest voltage of the node of capacitive element 191 for transmitting electric charges to node ND53 through pumping operation to the negative voltage level, the voltage level of node ND53 can be increased by negative boost voltage Vb. In the case of C1=C2, the voltage level at the node ND53 can be ideally raised to the voltage level of 2.5•EXVDD. Therefore, even if operation is performed at the lower-limit voltage level of the specification value of external power supply voltage EXVDD, the voltage level of high voltage Vpp can be heightened sufficiently.

Figure 23:
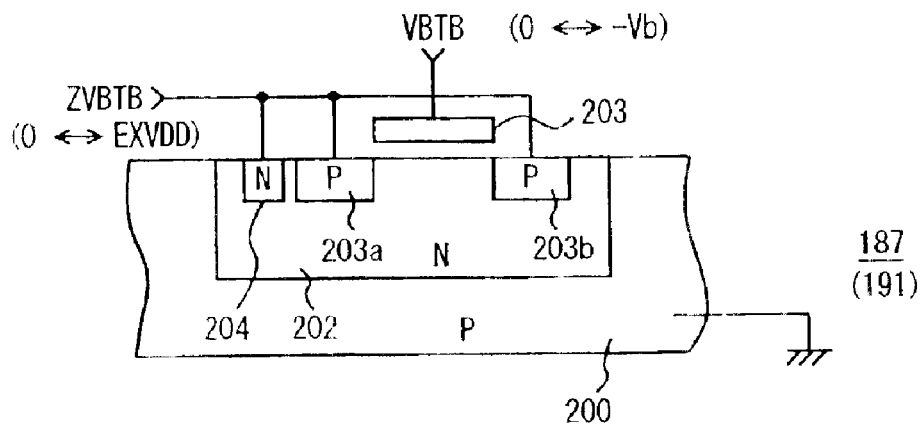
FIG. 23 is a diagram schematically showing the sectional structure of a MOS capacitor shown in FIG. 21.

FIG. 23 is a diagram schematically showing the sectional structure of capacitive elements 187 and 191. Since capacitive elements 187 and 191 have the same structure, FIG. 23 shows the sectional structure of capacitive element 187.

In FIG. 23, capacitive element 187 is formed in an N well 202 formed at the surface of a P-type substrate region 200. P-type substrate region 200 is biased to the ground voltage level.

Capacitive element 187 includes P-type impurity regions 203a and 203b formed apart on the surface of N well 202, a gate electrode 203 formed on a channel formation region between impurity regions 203a and 203b with a not-shown gate insulating film formed thereunder, and an N well impurity region 204 formed on the surface of N well 202. Impurity regions 203a, 203b, and 204 are connected to each other and commonly receive negative boost control signal ZVBTB. Gate electrode 203 is connected to node ND50 shown in FIG. 21 and receives the voltage VBTB.

As shown in FIG. 23, in capacitive element 187, even if the voltage VBTB falls to a negative voltage −Vb, impurity regions 203a, 203b, and 204 are at the ground voltage level. P-type substrate region 200 is biased to the ground voltage level, and a PN junction between P-type substrate region 200 and N well 202 is kept nonconductive. Therefore, electric charges can be prevented from flowing out from N well 202 to P-type substrate region 200.

Even in the case where an internal node is boosted to a negative voltage level in the high voltage generating circuit, a MOS capacitor having an ordinary configuration is formed only by isolating N well 202 in P-type substrate region 200 for forming a P-channel MOS transistor and can be used as a negative voltage boosting capacitor.

High voltage Vpp is usually set to the voltage level of 1.5•VDDS.

Figure 24:
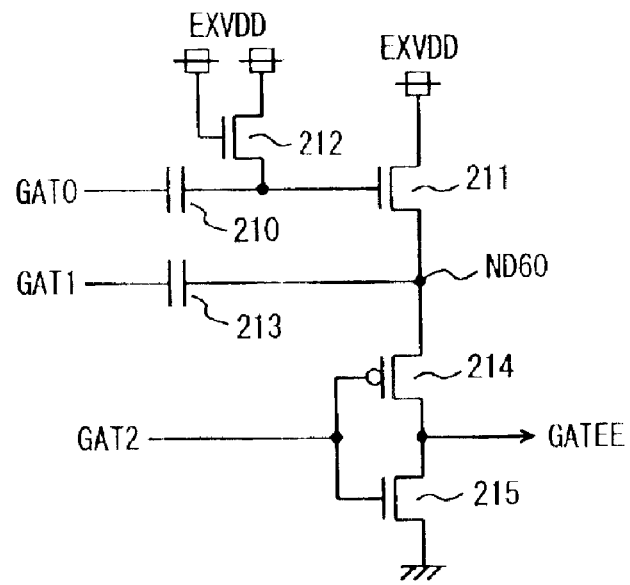
FIG. 24 is a diagram showing an example of the configuration of a part for generating an output gate control signal shown in FIG. 21.

FIG. 24 is a diagram showing an example of the configuration of a circuit for generating the output gate control signal GATEE. In FIG. 24, the output gate control signal generating circuit includes: an N-channel MOS transistor 211 for transmitting external power supply voltage EXVDD to a node ND60 when made conductive; an N-channel MOS transistor 212 for clamping the lower limit voltage of the gate of MOS transistor 211 to the level of EXVDD−Vthn; a capacitive element 210 for supplying electric charges to the gate of MOS transistor 211 in accordance with a control signal GAT0; a capacitive element 213 for supplying electric charges to node ND60 in accordance with a control signal GAT1; a P-channel MOS transistor 214 made conductive when a control signal GAT2 is at the L level, and transmitting the voltage of node ND60 to the output node to generate the output gate control signal GATEE when made conductive; and an N-channel MOS transistor 215 made conductive, when control signal GAT2 is at the H level, to drive output gate control signal GATEE to the ground voltage level. The amplitude of each of control signals GAT0 to GAT2 is the external power supply voltage EXVDD level.

Figure 25:
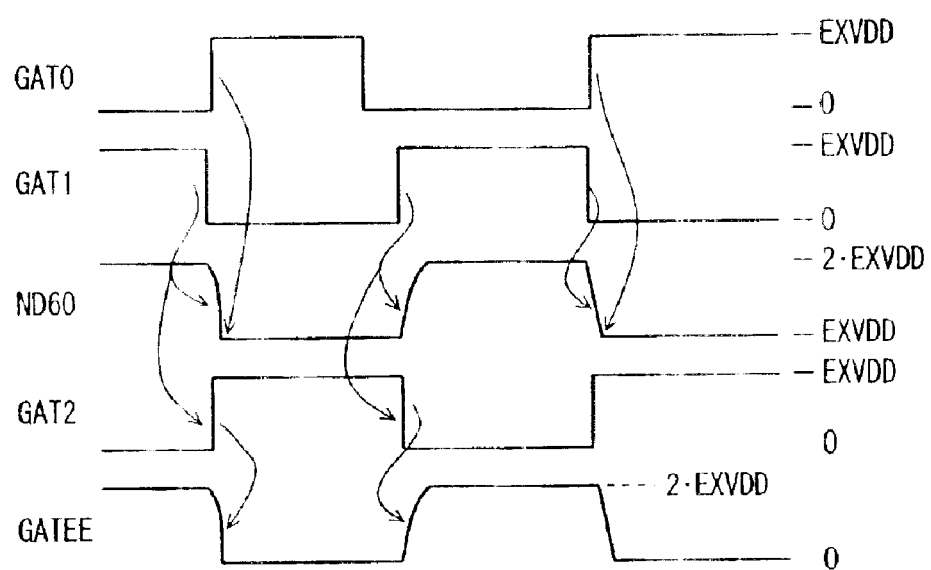
FIG. 25 is a signal waveform diagram representing an operation of an output gate control signal generating unit shown in FIG. 24.

FIG. 25 is a signal waveform diagram representing an operation of the output gate control signal generating circuit shown in FIG. 24. Referring to FIG. 25, the operation of the gate control signal generating circuit shown in FIG. 24 will be described below.

Control signal GAT1 falls from the external power supply voltage EXVDD level to the ground voltage level. At this time, control signal GAT0 is at the ground voltage level, and the gate potential of MOS transistor 211 is at the voltage EXVDD−Vthn level. As the voltage level of control signal GAT1 lowers, the voltage level of node ND60 lowers. The voltage level of control signal GAT2 rises to the external power supply voltage EXVDD level substantially simultaneously with the fall of control signal GAT1, MOS transistor 215 turns conductive, and output gate control signal GATEE is driven to the ground voltage level. The voltage level of node ND60 at this time is external power supply voltage EXVDD level at the maximum, and MOS transistor 214 is kept in a nonconductive state.

Subsequently, control signal GAT0 rises to the power supply voltage EXVDD level, MOS transistor 211 turns conductive, and the voltage level of node ND60 is precharged to the external power supply voltage EXVDD level.

When control signal GAT0 falls to the ground voltage level, the source and drain voltages of MOS transistor 211 become higher than the gate voltage, and MOS transistor 211 is made nonconductive.

Subsequently, at a predetermined timing, control signal GAT1 rises to the external power supply voltage EXVDD level, and the voltage level of node ND60 rises to the 2•EXVDD level. Substantially simultaneously with the rising of control signal GAT1, control signal GAT2 falls to the ground voltage level, MOS transistor 214 turns conductive, MOS transistor 215 is made nonconductive, and the voltage level of output gate control signal GATEE rises to the voltage level on node ND60, or the voltage 2•EXVDD level.

Subsequently, by repeating the operations as described above, output gate control signal GATEE of the amplitude of 2•EXVDD level can be generated. By constructing the control signals GAT1 and GAT2 into complementary signals and driving control signal GAT1 with substantially the same signal waveform as that of output gate control signal GATEE, output gate control signal GATEE of the amplitude 2•EXVDD level can be generated from the control signal of the amplitude of external power supply voltage EXVDD level.

Such an alternative configuration may be employed that a boosting circuit is provided dedicatedly to output gate control signal GATEE and the output voltage of the dedicated boosting circuit is utilized to level convert the output gate control signal GATEEF of an amplitude of the external power supply voltage level to generate the output gate control signal GATEE.

Modification

Figure 26:
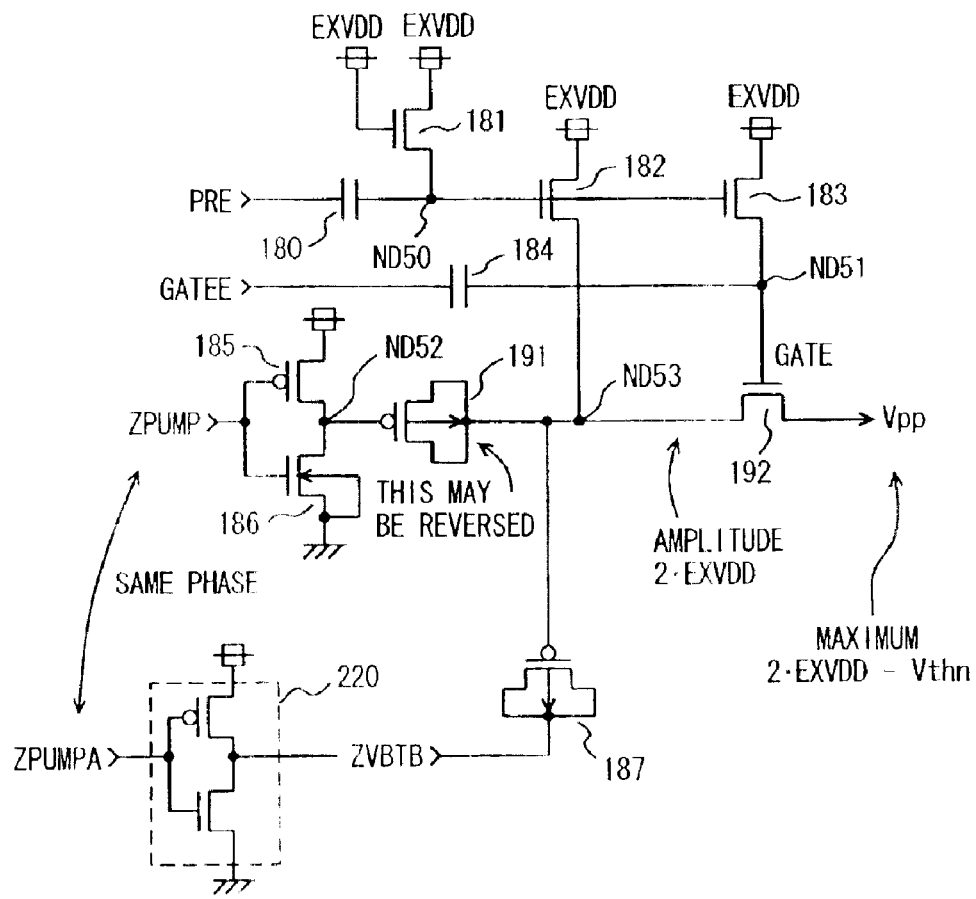
FIG. 26 is a diagram showing the configuration of a modification example of the high voltage generating circuit according to the seventh embodiment of the present invention.

FIG. 26 is a diagram showing the configuration of a modification of the high voltage generating circuit according to the seventh embodiment of the present invention. In the configuration shown in FIG. 26, a main electrode (gate electrode) of capacitive element 187 is connected to node ND53, and a boost control signal ZVBTB is applied by a CMOS inverter 220 to the other electrode of capacitive element 187. CMOS inverter 220 inverts a control signal ZPUMPA the same in phase as pump control signal ZPUMP, to generate negative boost control signal ZVBTB.

The source node of MOS transistor 186 for driving the potential of one electrode node (main electrode) of capacitive element 191 is coupled to the ground node. The circuit portion for driving nodes ND51 and ND53 is the same as that in the configuration of the high voltage generating circuit shown in FIG. 21. The corresponding part is designated with the same reference numerals and the detailed description thereof will not be repeated.

In the high voltage generating circuit shown in FIG. 26, capacitive elements 187 and 191 each have one electrode connected together with node ND53. To node ND53, electric charges are supplied by two capacitive elements 187 and 191. Therefore, although the amplitude of node ND53 is 2•EXVDD, the charge supply capability to the output node is increased, so that high voltage Vpp can be stably generated at high speed.

In the configuration shown in FIG. 26, the gate (main electrode) of capacitive element 191 is connected to node ND52, similarly to the case of double boosting as shown in FIG. 21. However, in the case of single boosting as in the configuration shown in FIG. 26, node ND52 changes in voltage level between the ground voltage and power supply voltage EXVDD and is not driven to a negative potential. Therefore, the gate of capacitive element 191 may be connected to node ND53 while connecting the source, drain, and substrate regions of the capacitive element 191 to node ND52. In the case of this arrangement, to node ND53, the gate capacitance of capacitive element 191 and that of capacitive element 187 are connected. Therefore, as compared with the configuration where the parasitic capacitance of the substrate region and others of capacitive element 191 is connected to node ND53, the parasitic capacitance of node ND53 can be reduced, a coupling coefficient between nodes ND52 and ND53 can be made high, and pump efficiency can be improved.

As described above, according to the seventh embodiment of the present invention, the internal node is boosted to a negative voltage and then, the internal node is driven to the external power supply voltage level. Consequently, the maximum voltage amplitude of the internal node can be set to 2•EXVDD+0.5•EXVDD and, even if external power supply voltage EXVDD drops to the lower limit level, high voltage Vpp at a predetermined voltage level can be generated stably.

Eighth Embodiment

Figure 27:
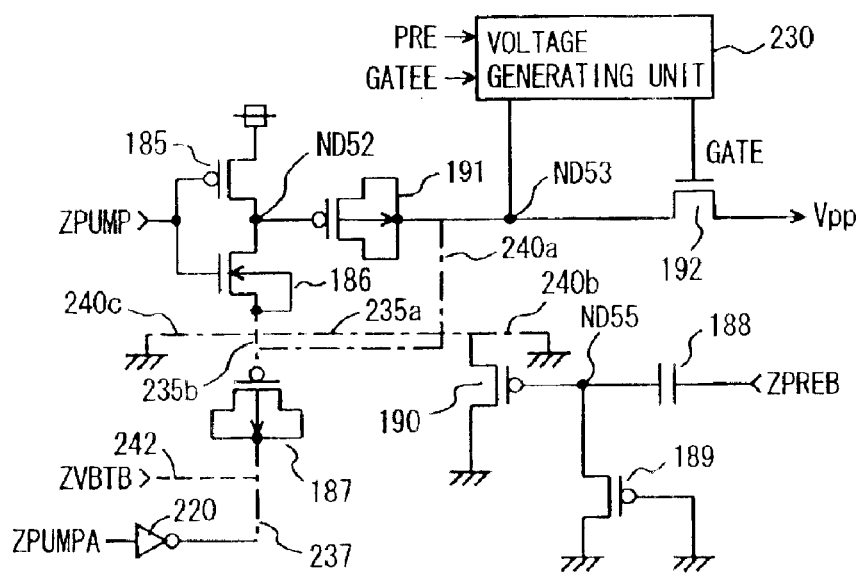
FIG. 27 is a diagram schematically showing the configuration of a high voltage generating circuit according to an eighth embodiment of the present invention.

FIG. 27 is a diagram schematically showing the configuration of a high voltage generating circuit according to an eighth embodiment of the present invention. In FIG. 27, in order to set a voltage amplitude of internal node ND53 to either 2•EXVDD or 2.5•EXVDD, mask metal interconnection is used.

Specifically, when the voltage level of internal node ND53 is set to the amplitude of 2.5 EXVDD, a double boost type has to be used. In this case, mask metal interconnection lines 235a, 235b, and 242 are arranged. According to this arrangement, capacitive element 187 is connected to the source node of MOS transistor 186 at one electrode, and receives bias boost signal ZVBTB via mask metal interconnection line 242 at the other electrode. The drain node of MOS transistor 190 is coupled to the source node of MOS transistor 186 via mask metal interconnection line 235a. With the configuration, a double boost type high voltage generating circuit similar to the configuration shown in FIG. 21 is implemented.

On the other hand, in the case of setting the voltage amplitude of node ND53 to 2•EXVDD, a single boost configuration is designated. In this case, mask metal interconnection lines 240a, 240b, and 237 are arranged. In this case, therefore, pump control signal ZPUMPA is applied to capacitive element 187 via inverter 220, and the electrode of capacitive element 187 is connected, not to MOS transistor 186, but to node ND53 via mask metal interconnection lines 240a.

The source node of MOS transistor 186 is connected to the ground node via a mask metal interconnection line 240c, and the drain node of MOS transistor 190 is connected to the ground node via mask metal interconnection line 240b. Negative voltage boost precharge control signal ZPREB is fixed at the L level in the single boost mode.

Therefore, in this case, node ND53 is driven in parallel by capacitive elements 191 and 187, and the single boost type internal voltage generating circuit is implemented.

Therefore, by fabricating the same circuit configuration in the master process and then selectively arranging the mask metal interconnection lines in the slice process in accordance with the voltage level of power supply voltage EXVDD, the double boost type and single boost type internal high voltage generating circuits can be selectively formed.

In the configuration shown in FIG. 27, the gate of capacitive element 191 is connected to node ND52, and the substrate region and the impurity region (source/drain region) are connected to node ND53. However, in the case where capacitive element 191 is connected in the reverse direction in the single boost arrangement, capacitive element 191 has the destination of connection of the gate, the substrate and the impurity regions switched through interconnection according to the single boost type and the double boost type.

A voltage generating unit 230 is a circuit portion includes the circuitry for generating the voltage GATE and the precharge voltage of node ND53 in the configurations shown in FIGS. 21 and 26 and has a portion operating according to precharge control signal PRE and output gate control signal GATEE shown in FIG. 27.

First Modification Example

Figure 28:
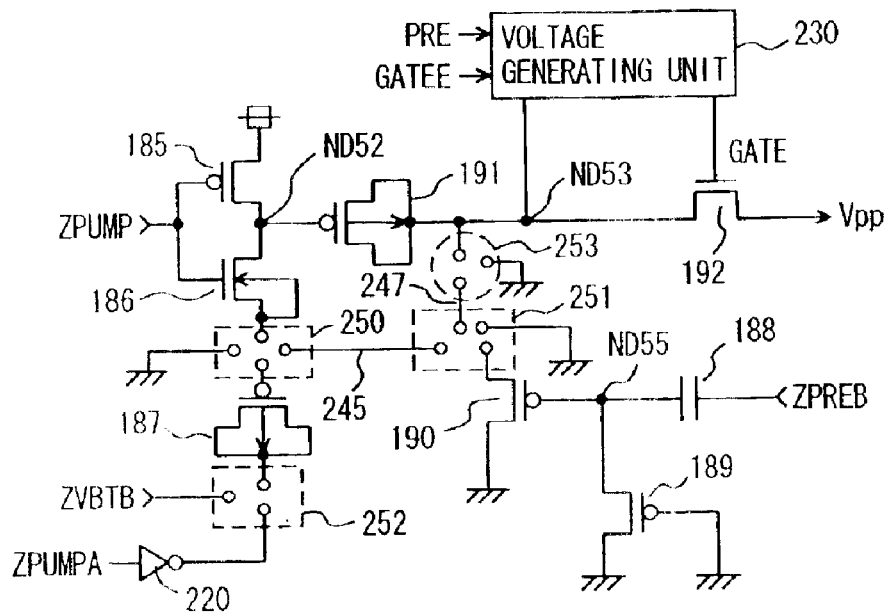
FIG. 28 is a diagram showing the configuration of a modification of the high voltage generating circuit according to the eighth embodiment of the present invention.

FIG. 28 is a diagram showing the configuration of a first modification of the eighth embodiment of the present invention. In FIG. 28, a metal switch 250 is disposed to the source node of MOS transistor 186, a metal switch 251 is disposed to the drain node of MOS transistor 190, and a metal switch 253 is disposed to node ND53. Metal switch 252 is disposed to the electrode node of capacitive element 187. Connection paths of metal switches 250 to 253 are routed by metal interconnection lines in the slice process.

In the case of the double boost configuration, metal switch 250 connects an interconnection line 245 and the gate electrode of capacitive element 187 together to the source node of MOS transistor 186. Metal switch 251 connects the drain node of MOS transistor 190 to interconnection line 245. Metal switch 253 connects the ground node to an interconnection line 247. Metal switch 252 couples negative voltage boost control signal ZVBTB to the source, drain and substrate regions of capacitive element 187.

In the case of the single boost configuration, metal switch 250 connects the ground node to the source node of MOS transistor 186 and connects the gate electrode of capacitive element 187 to an interconnection line 245. Metal switch 251 connects an interconnection line 245 to an interconnection line 247, and couples the drain node of MOS transistor 190 to the ground node. Metal switch 253 connects an interconnection line 247 to node ND53. Metal switch 252 connects an output signal of inverter 220 to the source, drain, and back gate (substrate region) nodes of capacitive element 187.

By routing the connection paths of metal switches 250 to 253 by metal interconnection lines in the slice process, according to the voltage level of external power supply voltage EXVDD, the high voltage generating circuit of the double boost configuration and the high voltage generating circuit of the single boost configuration can be selectively implemented.

In the configuration shown in FIG. 28, the connection of capacitive element 191 is the same in both of the single boost type and double boost type. However, when the gate of capacitive element 191 is connected to node ND53 in the single boost type configuration, metal switches for switching the connection destination are disposed to the gate of and the substrate and impurity regions of capacitive element 191.

Also in the configuration shown in FIG. 28, as to voltage generating unit 230, there is shown a circuit portion for generating the voltage of node ND53 and the voltage GATE in accordance with precharge control signal PRE and output gate control signal GATEE.

Second Modification

Figure 29:
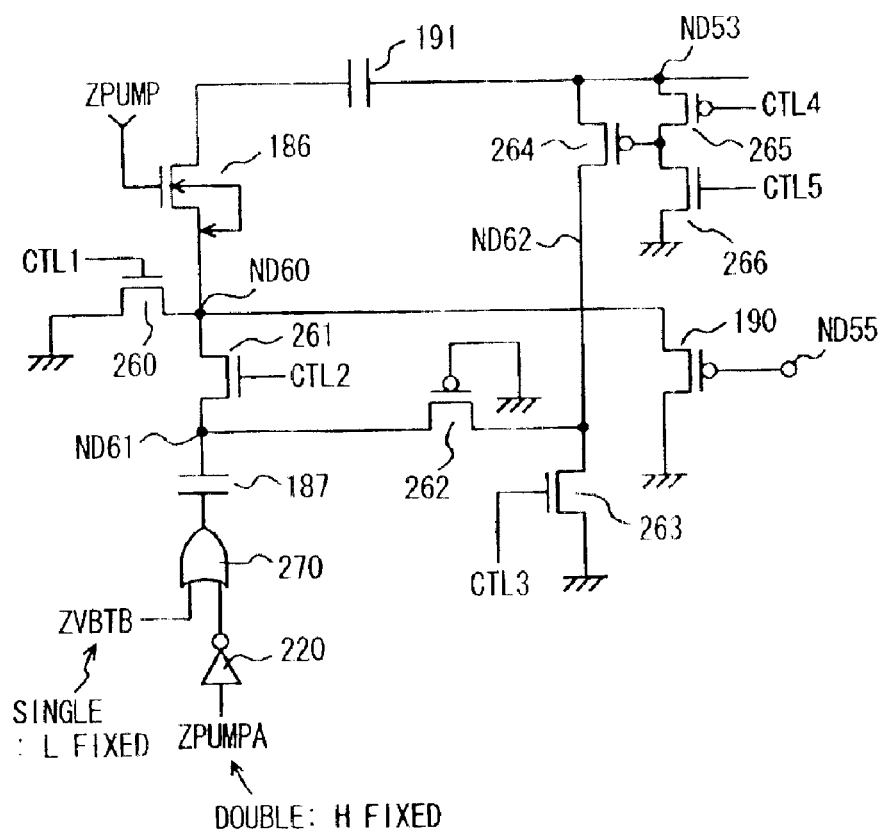
FIG. 29 is a diagram showing the configuration of a second modification of the high voltage generating circuit according to the eighth embodiment of the present invention.

FIG. 29 is a diagram schematically showing the configuration of a second modification of the eighth embodiment of the present invention. In FIG. 29, the configuration of the voltage generating unit for precharging the voltage level of node ND53 is not shown.

In FIG. 29, the high voltage generating circuit includes: an N-channel MOS transistor 260 connected between source node ND60 of MOS transistor 186 and the ground node and having a gate connected to receive a control signal CTL1; an N-channel MOS transistor 261 connected between nodes ND60 and ND61 and having a gate receiving a control signal CTL2; a P-channel MOS transistor 262 connected between nodes ND61 and ND62 and having a gate connected to the ground node; an N-channel MOS transistor 263 connected between node ND62 and the ground node and having a gate receiving a control signal CTL3; a P-channel MOS transistor 264 connected between nodes ND62 and ND53; a P-channel MOS transistor 265 for coupling the gate of the MOS transistor 264 to node ND 53 in accordance with a control signal CTL4; and an N-channel MOS transistor 266 connecting a gate of MOS transistor 264 to the ground node in accordance with a control signal CTL5.

To the electrode node of capacitive element 187, an output signal of an OR circuit 270 receiving negative voltage boost control signal ZVBTB and an output signal of inverter 220 is applied.

In the double boost configuration, control signal CTL1 is set to the negative voltage VBB level, and control signal CTL2 is set to the external power supply voltage level. Control signal CTL3 is set to the H level (external power supply voltage level). Therefore, MOS transistor 260 is nonconductive, MOS transistor 263 is conductive, and node ND62 is fixed at the ground voltage level.

Control signals CTL4 and CTL5 are set to the L level, MOS transistor 265 is conductive, MOS transistor 266 is nonconductive, and the gate of MOS transistor 264 is connected to node ND53.

In the double boost configuration, node ND61 changes in voltage level between negative voltage −Vb and the ground voltage level. Therefore, when the voltage level of node ND61 is not lower than the absolute value of the threshold voltage of MOS transistor 262, MOS transistor 262 turns conductive. In the double boost configuration, MOS transistor 262 maintains the nonconductive state. On the other hand, MOS transistor 261 is conductive and control signal CTL2 is maintained at the external power supply voltage EXVDD level, so that the voltage of node ND61 is transmitted accurately to node ND60.

In the double boost configuration, node ND53 changes in voltage level between external power supply voltage EXVDD and the voltage 2.5•EXVDD. Therefore, since node ND62 is maintained at the ground voltage level, MOS transistor 264 maintains the nonconductive state.

In the double boost mode, pump control signal ZPUMPA is fixed at the H level, and an output signal of inverter 220 is fixed at the L level. Accordingly, OR circuit 270 operates as a buffer circuit, and drives capacitive element 187 in accordance with negative voltage boost control signal ZVBTB.

On the other hand, in the single boost configuration, control signal CTL1 is set at the external power supply voltage level, and MOS transistor 260 is set to the conductive state. Control signal CTL2 is maintained at the ground voltage level, and MOS transistor 261 is rendered nonconductive. Similarly, control signal CTL3 is maintained at the ground voltage level, and MOS transistor 263 is kept off or nonconductive. In the single boost mode, therefore, node ND60 is fixed at the ground voltage level.

In the single boost configuration, negative voltage boost control signal ZVBTB is fixed at the L level, and OR circuit 270 drives capacitive element 187 in accordance with an output signal of inverter 220. Therefore, node ND61 changes in voltage level between the ground voltage and external power supply voltage EXVDD, and MOS transistor 262 is rendered conductive to transmit a signal having an amplitude of external power supply voltage EXVDD to node ND62.

In the single boost mode, control signal CTL4 is set to the H level of the high voltage level, and MOS transistor 265 is rendered nonconductive. On the other hand, control signal CTL5 is set to the external power supply voltage level, MOS transistor 266 is rendered conductive, and the gate of MOS transistor 264 is fixed to the ground voltage level. In this case, therefore, a signal having the amplitude of external power supply voltage EXVDD level of node ND62 is transmitted to node ND53 via MOS transistor 264. According to such configuration, the voltage level of node ND53 can be changed between external power supply voltage EXVDD and 2•EXVDD voltage level.

The precharge voltage level of node ND53 is external power supply voltage EXVDD level, and the precharge voltage of node ND61 can be set to the external power supply voltage EXVDD level via MOS transistors 264 and 262. By the charge pump operation of capacitive element 187, node ND61 can be changed in voltage level between external power supply voltage EXVDD and 2•EXVDD.

In the above description, the direction of connection of capacitive element 191 has not been particularly described. In the case of switching the direction of connection of capacitive element 191 between the single boost type and the double boost type, similarly, the connection destination is switched according to a control signal. In this case, since electric charges are transferred by the pumping operation via capacitive element 191, in order to prevent charge loss in the transistor switch circuit, the connection destination of capacitive element 191 may be switched by metal interconnection.

For switching the connection destination, a CMOS transmission gate may be used as a switch circuit. In the case of using a switch circuit for switching the connection destination of capacitive element 191, node ND52 is driven to a negative voltage in the double boost configuration. Therefore, for the switch circuit connected to node ND52, as a control signal, a control signal level converted to a negative voltage level, similarly to control signal CTL1 is required to use. To the switch circuit for making a connection to node ND53, as a control signal, a signal at the high voltage VP level, similarly to control signal CTL4, is used. According to such configuration, the connection destination of capacitive element 191 can be switched according to the configuration of the pump circuit.

Figure 30:
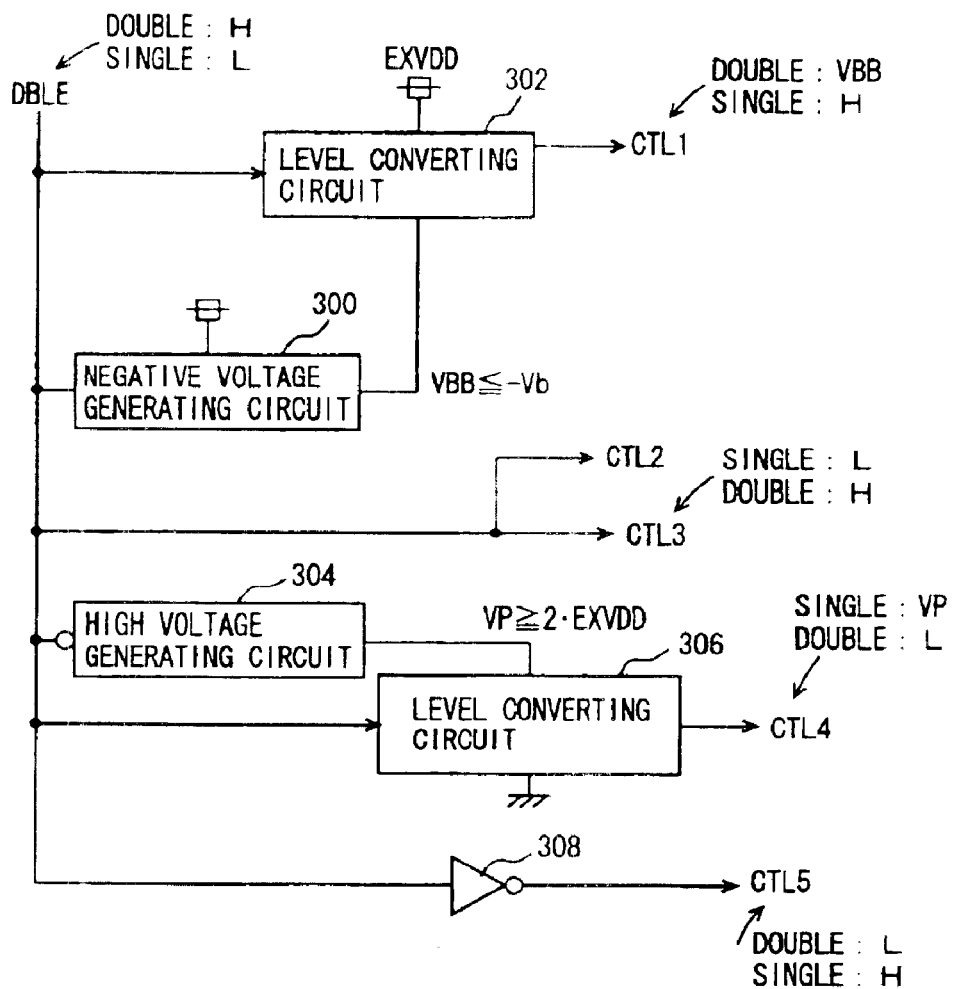
FIG. 30 is a diagram schematically showing the configuration of a connection control signal generating unit shown in FIG. 29.

FIG. 30 is a diagram schematically showing an example of the configuration of a portion for generating control signals shown in FIG. 29. In FIG. 30, the control signal generating circuitry includes: a negative voltage generating circuit 300 which is activated, when a double boost instruction signal DBLE is activated, to generate a negative voltage VBB; a level converting circuit 302 which receives external power supply voltage EXVDD and negative voltage VBB as operation power supply voltages and level converts a double boost instruction signal DBLE to generate control signal CTL1; a high voltage generating circuit 304 which is activated, when double boost instruction signal DBLE is made inactive, to generate high voltage VP; a level converting circuit 306 which receives high voltage VP from high voltage generating circuit 304 and a ground voltage as operation power supply voltages and performs level converting on double boost instruction signal DBLE, to generate control signal CTL4; and an inverter 308 for inverting double boost instruction signal DBLE, to generate control signal CTL5.

Control signals CTL2 and CTL3 are generated according to double boost instruction signal DBLE.

The logic level of double boost instruction signal DBLE is determined by metal interconnection line, a fixed voltage of a bonding pad, or a mode designation signal. As an example, double boost instruction signal DBLE is set to the H level when the double boost mode is set, and is set to the L level when the single boost mode is set.

Negative voltage generating circuit 300 generates negative voltage VBB when the double boost configuration is designated. Negative voltage VBB is at a voltage level equal to or lower than negative voltage −Vb of voltage VBTB of node ND54 shown in FIG. 21. When inactivated, negative voltage generating circuit 300 outputs the ground voltage.

Level converting circuit 302 generates control signal CTh1 in accordance with double boost instruction signal DBLE. When the double boost configuration is designated, control signal CTh1 is set to the negative voltage VBB level. When the single boost configuration is designated, control signal CTL1 is fixed at the H level (external power supply voltage EXVDD level). Level converting circuit 302 is constructed by using a known circuit configuration and implemented by, for example, the level converting circuit 114 shown in FIG. 13 with all of the voltage polarities of the power supply nodes and the transistor polarities of the MOS transistors inverted.

Control signals CTL2 and CTL3 are set to the L level (ground voltage level) when the single boost configuration is designated, and are set to the H level when the double boost configuration is designated.

High voltage generating circuit 304 is activated in the single boost configuration to generate high voltage VP. High voltage VP is at a voltage level equal to or higher than 2·EXVDD. When inactivated, high voltage generating circuit 304 outputs a voltage of the external power supply voltage EXVDD level.

Level converting circuit 306 inverts double boost instruction signal DBLE and sets the H level of its output signal at high voltage VP level. Therefore, control signal CTL4 is at the high voltage VP level in the single boost configuration and is at the L level of the ground voltage level in the double boost configuration.

Inverter 308 receives the external power supply voltage as an operation power supply voltage, and inverts double boost instruction signal DBLE, to generate control signal CTL5. Therefore, control signal CTL5 is at the L level in the double boost configuration and is at the H level in the single boost configuration.

Each of negative voltage generating circuit 300 and high voltage generating circuit 304 is constructed by a charge pump circuit utilizing the charging pump operation of the capacitor.

Figure 31:
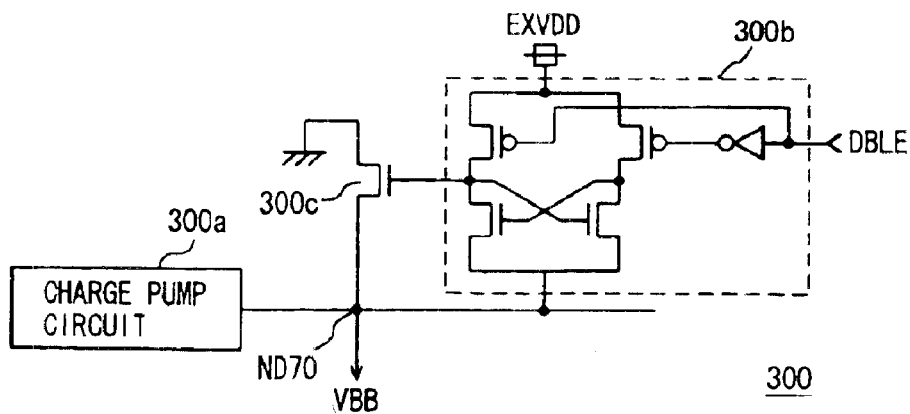
FIG. 31 is a diagram showing an example of the configuration of a negative voltage generating circuit shown in FIG. 30.

FIG. 31 is a diagram schematically showing an example of the configuration of negative voltage generating circuit 300 shown in FIG. 30. In FIG. 31, negative voltage generating circuit 300 includes: a charge pump circuit 300*a* which is activated to generate negative voltage VBB at an output node ND70 through utilization of the charge pumping operation of the capacitor; a level converting circuit 300*b* for level converting double boost instruction signal DBLE; and an N-channel MOS transistor 300*c* which is selectively rendered conductive, in accordance with an output signal of level converting circuit 300*b*, to couple node ND70 to the ground node.

When double boost instruction signal DBLE is activated to the H level, charge pump circuit 300*a* performs the charge pumping operation to generate a negative voltage at node ND70 synchronously with a clock control signal from a not-shown clock control signal generating circuit. In this case, when double boost instruction signal DBLE is at the H level, an output signal of level converting circuit 300*b* is at a voltage level of output node ND70, and MOS transistor 300*c* maintains the nonconductive state. Therefore, negative voltage VBB from charge pump circuit 300*a* is generated according to the charge pumping operation.

On the other hand, when double boost instruction signal DBLE is at the L level, an output signal of level converting circuit 300*b* is at the external power supply voltage EXVDD level, MOS transistor 300*c* is made conductive, and output node ND70 is fixed at the ground voltage level. The charge pumping operation of charge pump circuit 300*a* is stopped via a not-shown path when double boost instruction signal DBLE is at the L level. Therefore, negative voltage VBB from output node ND70 is at the ground voltage level.

Level converting circuit 300*b* shown in FIG. 31 may be utilized for the level converting circuit 302 shown in FIG. 30. In this case, an output signal of level converting circuit 300*b* corresponds to control signal CTL1.

Figure 32:
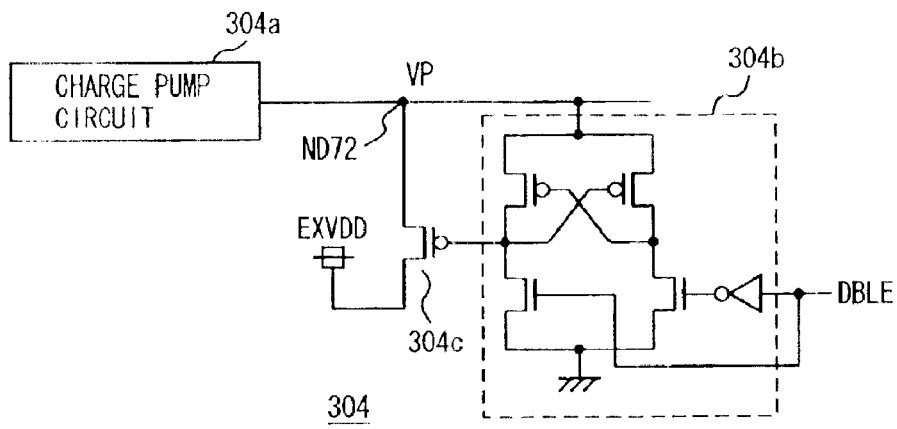
FIG. 32 is a diagram showing an example of the configuration of a high voltage generating circuit shown in FIG. 30.

FIG. 32 is a diagram showing an example of the configuration of high voltage generating circuit 304 shown in FIG. 30. In FIG. 32, high voltage generating circuit 304 includes: a charge pump circuit 304*a* which is activated to generate high voltage VP at node ND72 through utilization of the charge pumping operation of the capacitor; a level converting circuit 304*b* for inverting double boost instruction DBLE and level converting the same in the single boost configuration; and a P-channel MOS transistor 304*c* for setting node ND72 to the external power supply voltage EXVDD level in accordance with an output signal of level converting circuit 304*b*.

When double boost instruction signal DBLE is at the L level to designate the single boost configuration, charge pump circuit 304a performs the charge pumping operation to generate high voltage VP, at output node ND72. In the single boost configuration, an output signal of level converting circuit 304b attains the voltage VP level on node ND72 and MOS transistor 304c is rendered nonconductive. Therefore, node ND72 is set to the voltage level of a high voltage generated by charge pump circuit 304a. On the other hand, in the double boost configuration, double boost instruction signal DBLE is at the H level, an output signal of level converting circuit 304c is at the L level (ground voltage level), and MOS transistor 304c is made conductive to transmit external power supply voltage EXVDD to node ND72. In the double boost configuration, charge pump circuit 304a does not perform the charge pumping operation. Therefore, high voltage VP on node ND72 is at the external power supply voltage EXVDD level in the double boost configuration.

In the configuration of high voltage generating circuit 304 shown in FIG. 32, level converting circuit 304b may be used as level converting circuit 306 for generating control signal CTL4. A signal applied from level converting circuit 304b to a gate of MOS transistor 304c is used as control signal CTL4.

The states of control signals ZVBTB and ZPNPA shown in FIG. 29 may be set according to double boost instruction signal DBLE. For example, an ANDed signal of double boost instruction signal DBLE and control signal ZVBTBF is utilized as negative voltage boost control signal ZVBTB. On the other hand, pump control signal ZPNPA is generated from an ORed signal of double boost instruction signal DBLE and pump control signal ZPNPA.

As described above, according to the eighth embodiment of the present invention, when the voltage level of the external power supply voltage is low, the capacitor is adapted to perform the charge pumping operation in two stages to increase an output voltage amplitude on an internal node. When the external power supply voltage is high, the capacitors are adapted to operate simultaneously to accumulate electric charges. A high voltage at a necessary voltage level can be generated efficiently in accordance with the external power supply voltage.

Ninth Embodiment

Figure 33:
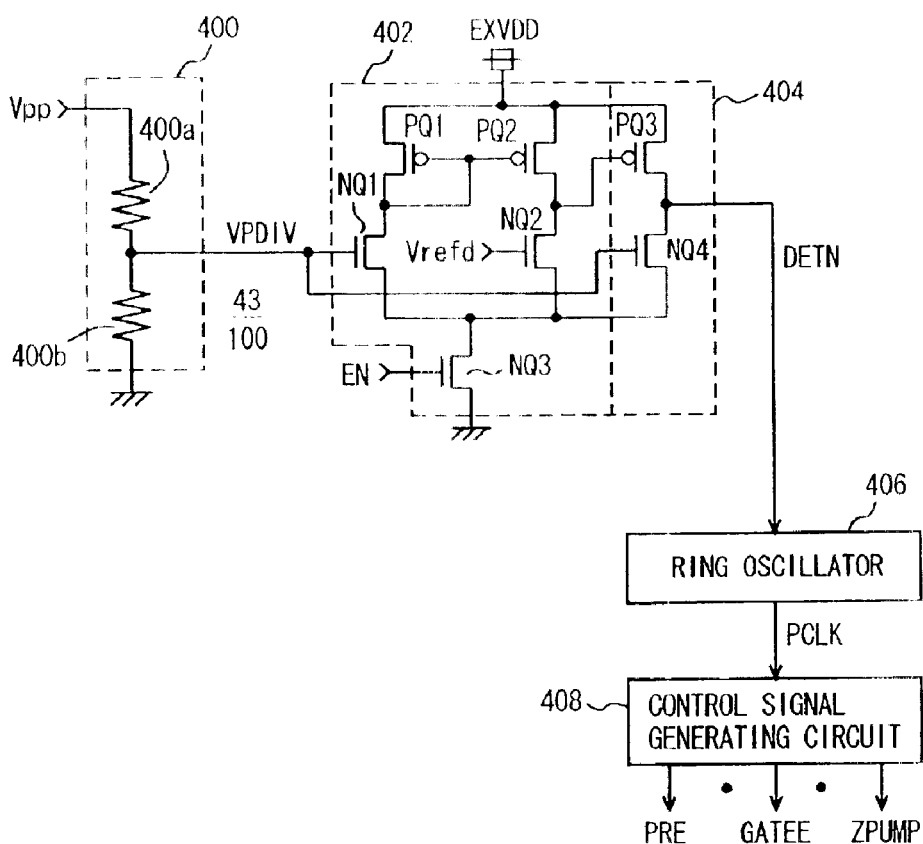
FIG. 33 is a diagram showing the configuration of a high voltage generation control unit according to a ninth embodiment of the present invention.

FIG. 33 is a diagram schematically showing the configuration of a control portion in the high voltage generating circuit according to a ninth embodiment of the present invention. In FIG. 33, a high voltage generation control circuitry includes: a voltage dividing circuit 400 for voltage-dividing high voltage Vpp to generate a divided voltage VPDIV; a comparing circuit 402 for comparing divided voltage VPDIV with reference voltage Vrefd; a bias compensating circuit 404 for generating a level detection signal DETN in accordance with an output signal of comparing circuit 402 and divided voltage VPDIV; a ring oscillator 406 selectively activated, in response to level detection signal DETN, to perform oscillating operation in predetermined cycles; and a control signal generating circuit 408 for generating pump control signals PRE, GATEE, and ZPUMP and others by utilizing pump clock signal PCLK as a basic timing signal.

Pump control signal PRE and others from control signal generating circuit 408 are supplied to the high voltage generating circuit shown in the foregoing seventh and eighth embodiments.

Voltage dividing circuit 400 includes resistive elements 400a and 400b connected in series between a high voltage input node and a ground node. The voltage dividing ratio of dividing circuit 400 is set to 0.43, and divided voltage VPDIV is set to a voltage level lower than the voltage level of ½ times high voltage Vpp.

Comparing circuit 402 includes: N-channel MOS transistors NQ1 and NQ2 constructing a differential stage for comparing divided voltage VPDIV and reference voltage Vrefd; P-channel MOS transistors PQ1 and PQ2 constructing a current mirror stage for supplying current to MOS transistors NQ1 and NQ2; and a MOS transistor NQ3 for flowing operation current of comparing circuit 402.

MOS transistor PQ1 constructs a master stage of the current mirror stage, and a mirror current flowing through MOS transistor PQ1 flows via MOS transistor PQ2.

An activating signal EN is applied to the gate of current source transistor NQ3 in comparing circuit 402. Activating signal EN may be an array activating signal or an inverted signal of the power cut enable signal.

In the operation of comparing circuit 402, when divided voltage VPDIV is higher than reference voltage Vrefd, an output signal of comparing circuit 402 attains a high level. On the other hand, when divided voltage VPDIV is lower than reference voltage Vrefd, an output signal of comparing circuit 402 attains a low level.

Bias compensating circuit 404 includes: a P-channel MOS transistor PQ3 which receives an output signal of comparing circuit 402 at a gate thereof and drives a level detection signal DETN to the H level when an output signal of comparing circuit 402 is at the high level; and an N-channel MOS transistor NQ4 which receives divided voltage VPDIV at a gate thereof and compensates for a driving current of MOS transistor PQ3. MOS transistor NQ4 is connected to a current source transistor NQ3. Therefore, bias compensating circuit 404 also executes an operation of generating level detection signal DETN when activating signal EN is made active.

In the case where the voltage level of external power supply voltage EXVDD lowers, if divided voltage VPDIV is at the voltage level of Vpp/2, the difference between external power supply voltage EXVDD and divided voltage VPDIV becomes small, MOS transistors NQ1 and NQ2 in the differential stage operate in a linear region, and the sensitivity of comparing circuit 402 may be reduced. The dividing ratio of divided voltage VPDIV is decreased to, for example, 43/100 to lower the voltage level of divided voltage VPDIV, the voltage level of reference voltage Vrefd is also lowered, and MOS transistors NQ1 and NQ2 are adapted to operate in a saturation region.

Bias compensating circuit 404 is provided to prevent deterioration of sensitivity in level detection even when divided voltage VPDIV to the differential stage becomes relatively high as compared with the voltage level of external power supply voltage EXVDD. When divided voltage VPDIV is higher than reference voltage Vrefd, an output signal of comparing circuit 402 is set high, the conductance of MOS transistor PQ3 is reduced whereas the conductance of MOS transistor NQ4 increases to drive an output signal of bias compensating circuit 404 to the L level.

On the other hand, when divided voltage VPDIV is lower than reference voltage Vrefd, an output signal of comparing circuit 402 goes low, and the conductance of MOS transistor PQ3 increases, and the conductance of MOS transistor NQ4 decreases. Therefore, in this state, output signal DETN of bias compensating circuit 404 is driven to the H level.

Specifically, the gate voltages of MOS transistors PQ3 and NQ4 are caused to change in the same direction in accordance with an input signal and an output signal of comparing circuit 402 and MOS transistor NQ4 is caused to operate in the saturation region. The conductances of MOS transistors NQ4 and PQ3 are made complementarily changed to change the output signal at high speed according to an output signal of comparing circuit 402.

Therefore, also in the case where sensitivity of comparing circuit 402 is low, bias compensating circuit 404 can drive output signal DETN at high speed in accordance with the output signal of comparing circuit 402. Even in the case where the voltage level of divided voltage VPDIV is high, voltage level detecting operation can be accurately performed.

Ring oscillator 406 includes inverters of an even number of stages, and a gate circuit for receiving an output signal of the inverter at the final stage and level detection signal DETN. This output signal of the gate circuit is applied to the inverter at the first stage of an inverter train.

When level detection signal DETN is at the H level and divided voltage VPDIV is lower than reference voltage Vrefd, the oscillating operation is performed. When divided voltage VPDIV is higher than reference voltage Vrefd, level detection signal DETN falls to the L level, and ring oscillator 406 stops the oscillating operation. Thus, as to voltage level of high voltage Vpp, high voltage Vpp can be maintained at the voltage level of 100•Vrefd/43.

Modification

Figure 34:
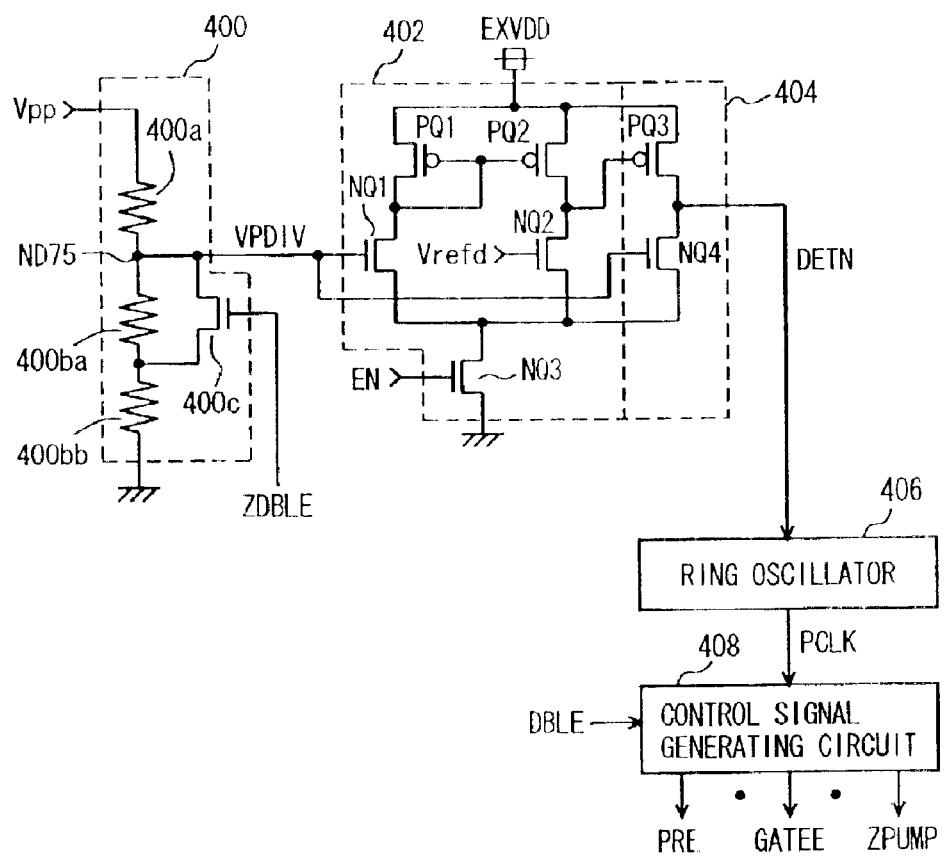
FIG. 34 is a diagram showing a modification of the high voltage generation control unit according to the ninth embodiment of the present invention.

FIG. 34 is a diagram schematically showing the configuration of high voltage generation control circuitry according to a modification of the ninth embodiment of the present invention. In the configuration shown in FIG. 34, in voltage dividing circuit 400, resistive elements 400ba and 400bb are connected in series between a divided voltage output node ND75 and the ground node. In parallel with resistive element 400ba, an N-channel MOS transistor 400c whose gate receives a signal ZDBLE complementary to the double boost instruction signal is connected. In control signal generating circuit 408, double boost instruction signal DBLE is applied. The other configuration of the high voltage generation control unit shown in FIG. 34 is the same as that of FIG. 33, the corresponding part is designated by the same reference numeral, and its detailed description will not be repeated.

In the case where external power supply voltage EXVDD is as low as 1.8V or 2.5V, for example, the double boost configuration is designated. By performing the double boosting operation, high voltage Vpp is generated. In this case, complementary double boost instruction signal ZDBLE is set to the L level, and MOS transistor 400c enters a conductive state. Therefore, in this case, divided voltage VPDIV is generated by dividing high voltage Vpp by the dividing ratio of 0.43.

On the other hand, when external power supply voltage is as high as 3.3V, high voltage Vpp is generated with the single boost configuration. In this case, complementary double boost instruction signal ZDBLE is set to the H level, MOS transistor 400c turns conductive, and resistive element 400ba is short-circuited. Therefore, divided voltage VPDIV from output node ND75 is generated from high voltage Vpp at a voltage dividing ratio of ½ with the resistance values of resistive elements 400a and 400bb set to be the same. In the single boost configuration, control signal generating circuit 408 switches a control signal generating mode in accordance with double boost instruction signal DBLE (refer to the eighth embodiment).

Therefore, by utilizing the configuration shown in FIG. 34, by single high voltage generation control circuitry, control modes according to a plurality of kinds of external power supply voltages can be implemented. While performing an optimum level detecting operation according to the high voltage generating method employed, the high voltage generating operation can be controlled.

In FIG. 34, in place of MOS transistor 400c, mask metal interconnection lines may be used, or a link element (fuse element) may be used.

Figure 35:
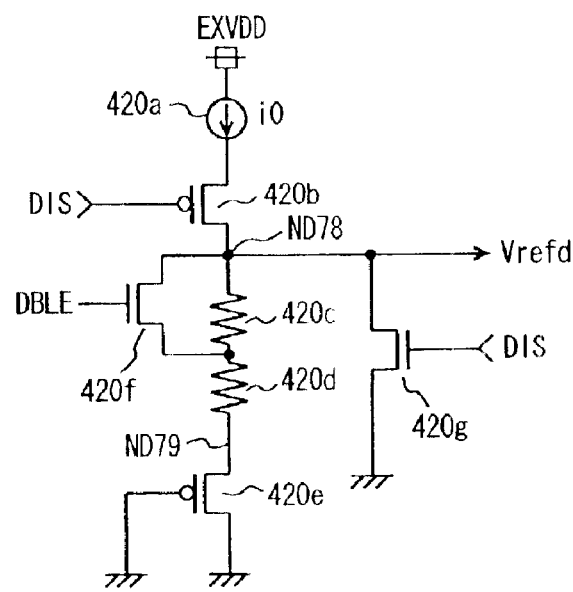
FIG. 35 is a diagram showing an example of the configuration of a reference voltage generating circuit in the ninth embodiment of the present invention.
Figure 36:
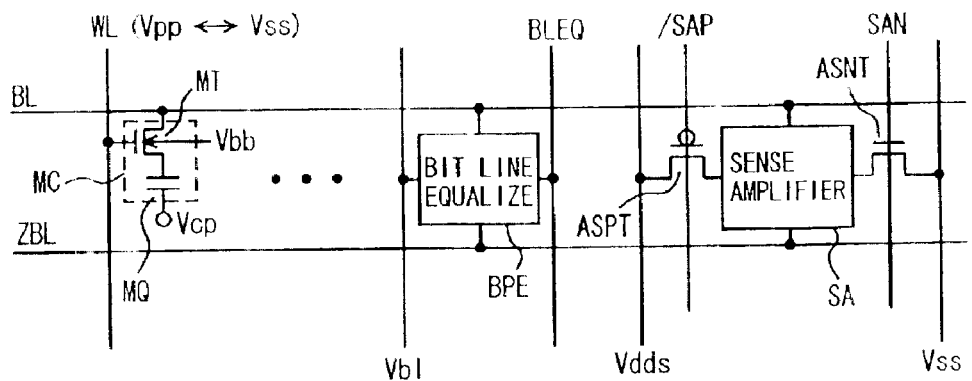
FIG. 36 is a diagram schematically showing the configuration of an array portion of a conventional semiconductor memory device.

FIG. 35 is a diagram showing an example of the configuration of the portion for generating reference voltage Vrefd.

In FIG. 35, a reference voltage generating circuit includes: a constant current source 420a which is coupled to an external power supply node and supplies a constant current i0; a P-channel MOS transistor 420b which is selectively rendered conductive in response to a signal applied to control input DIS and supplies current from constant current source 420a to a node ND78 when conductive; resistive elements 420c and 420d connected in series between nodes ND78 and ND79; a P-channel MOS transistor 420e connected between node ND79 and the ground node and has a gate thereof connected to the ground node; an N-channel MOS transistor 420f which is connected in parallel with resistive element 420c and receives double boost instruction signal DBLE at a gate thereof; and an N-channel MOS transistor 420g which is selectively rendered conductive in response to a signal applied to control input DIS and couples output node ND78 to the ground node when conductive.

To control input DIS, an inverted signal of activating signal EN shown in FIG. 34 is applied.

When the voltage level of external power supply voltage EXVDD is low and double boost instruction signal DBLE is set to the H level, a MOS transistor 420f is conductive and resistive element 420c is short-circuited. Therefore, the voltage level of reference voltage Vrefd of node ND78 is given by the sum of the resistance value of resistive element 420d multiplied by constant current i0 and an absolute value Vthp of the threshold voltage of MOS transistor 420e.

On the other hand, when external power supply voltage EXVDD is high and the high voltage generating circuit is set into the single boost configuration, double boost instruction signal DBLE is at the L level, and MOS transistor 420f is rendered nonconductive. In this case, reference voltage Vrefd is given by the sum of a combined resistance value of resistive elements 420c and 420d and the absolute value of the threshold voltage of MOS transistor 420e.

Therefore, in the case where external power supply voltage EXVDD is set to be high, the voltage level of reference voltage Vrefd is set to as high as Vpp/2. On the other hand, when external power supply voltage EXVDD is set to be low, reference voltage Vrefd is set to as low as 0.43 Vpp, for example.

In the configuration of the reference voltage generating circuit shown in FIG. 35, MOS transistor 420e may be omitted.

As described above, according to the ninth embodiment of the present invention, in the case where the external power supply voltage is set to be low and an internal high voltage is generated in accordance with the double boost method, in detecting the level of the high voltage, the bias voltage supplied to the comparing circuit is set to be low. Consequently, the comparing operation can be performed in a so-called "hit region" of the comparing circuit, and level detecting operation can be performed accurately.

A current for driving the circuit which finally outputs the level detection signal is adjusted according to the divided voltage of the high voltage. Deterioration in sensitivity of the comparing circuit is compensated for and the level detection signal can be generated accurately.

Also in the configuration of the reference voltage generating circuit shown in FIG. 35, a fusible link element may be used in place of MOS transistor 420f, or resistive element 420c may be selectively short-circuited by mask metal interconnection.

As described above, according to the present invention, the internal voltage generating manner is adjusted according to the voltage level of the external power supply voltage, and a semiconductor device which can be adapted to a plurality of kinds of external power supply voltages can be implemented by a single chip.

Although the present invention has been described and shown in detail, it is clearly understood that the same is by way of illustration and example only and is not to be taken by way of limitation, the spirit and scope of the present invention being limited only by the terms of the appended claims.

What is claimed is:

1. A semiconductor device comprising:
   reference voltage generating circuitry for generating a reference voltage;
   comparing circuitry for comparing said reference voltage with an internal voltage and outputting a signal according to a result of comparison when activated;
   drive circuitry for supplying current from a power supply node to an internal voltage line and generating said internal voltage in accordance with said output signal of said comparing circuitry;
   comparison control circuitry for stopping a comparing operation of said comparing circuitry, fixing said output signal of the comparing circuitry at a predetermined voltage level, and setting said drive circuitry in a normally conductive state in accordance with an external voltage level setting signal; and
   an auxiliary transistor for coupling said internal voltage line to said power supply node in accordance with said external voltage level setting signal, wherein
   said comparing circuitry includes:
   a comparator for comparing said internal voltage with said reference voltage and generating said signal according to a result of comparison when activated; and
   a current source transistor for selectively conducting an operation current to said comparator in accordance with said external voltage level setting signal and an operation mode instruction signal.

2. The semiconductor device according to claim 1, further comprising:
   a reference voltage control circuit for stopping a reference voltage generating operation of said reference voltage generating circuitry in accordance with said external voltage level setting signal.

3. The semiconductor device according to claim 1, wherein
   said comparator includes:
   a differential stage for comparing said reference voltage with a voltage corresponding to said internal voltage; and
   a current mirror stage for supplying the operation current to said differential stage,
   said drive circuitry includes:
   a drive transistor for supplying the current from said power supply node to said internal voltage line when made conductive,
   said comparison control circuitry includes:
   a first transistor for coupling a first internal output node of said comparing circuitry to a first voltage supply source in accordance with said external voltage level setting signal; and
   a second transistor for coupling a second internal output node of said comparing circuitry to a second voltage supply source different from said first voltage supply source, in accordance with said external voltage level setting signal,
   said second internal output node is coupled to a gate of said drive transistor, and
   differential voltages according to a comparison result of said differential stage are generated at the first and second internal output nodes when said comparing circuitry is activated.

4. The semiconductor device according to claim 1, further comprising:
   a plurality of memory cells; and
   peripheral circuitry receiving said internal voltage as an operation power supply voltage to operate, and selecting a memory cell from said plurality of memory cells in accordance with an address signal.

5. A semiconductor device comprising:
   reference voltage generating circuitry for generating a reference voltage;
   comparing circuitry for comparing said reference voltage with an internal voltage and outputting a signal according to a result of comparison when activated;
   drive circuitry for supplying current from a power supply node to an internal voltage line and generating said internal voltage in accordance with said output signal of said comparing circuitry:
   comparison control circuitry for stopping a comparing operation of said comparing circuitry, fixing said output signal of the comparing circuitry at a predetermined voltage level, and setting said drive circuitry in a normally conductive state in accordance with an external voltage level setting signal;
   an auxiliary transistor for coupling said internal voltage line to said power supply node in accordance with said external voltage level setting signal;
   an internal voltage generating circuit selectively activated in accordance with said external voltage level setting signal and generating a second internal voltage on an internal power source line on the basis of comparison between a second reference voltage and the second internal voltage when activated; and
   a connection control circuit for electrically connecting said internal power source line and said internal voltage line in accordance with a voltage mode setting signal.

6. The semiconductor device according to claim 5, further comprising:
   an input circuit receiving the second internal voltage on said internal power source line as an operation power supply voltage to operate, and generating an internal signal from an external signal when in operation.

7. The semiconductor device according to claim 5, wherein
   said comparing circuitry includes:
   a comparator for comparing said internal voltage with said reference voltage and generating said signal indicative of said result of comparison when activated; and
   a current source transistor for stopping generation of an operation current of said comparator in accordance with said external voltage level setting signal.

* * * * *